US008775934B2

(12) United States Patent
Nasle et al.

(10) Patent No.: US 8,775,934 B2
(45) Date of Patent: *Jul. 8, 2014

(54) SYSTEMS AND METHODS FOR CREATION OF A SCHEMATIC USER INTERFACE FOR MONITORING AND PREDICTING THE REAL-TIME HEALTH, RELIABILITY AND PERFORMANCE OF AN ELECTRICAL POWER SYSTEM

(75) Inventors: Adib Nasle, Poway, CA (US); Kevin Meagher, Raleigh, NC (US)

(73) Assignee: Power Analytics Corporation, San Diego, CA (US)

( * ) Notice: Subject to any disclaimer, the term of this patent is extended or adjusted under 35 U.S.C. 154(b) by 939 days.

This patent is subject to a terminal disclaimer.

(21) Appl. No.: 12/116,795

(22) Filed: May 7, 2008

(65) Prior Publication Data
US 2008/0263469 A1  Oct. 23, 2008

Related U.S. Application Data

(63) Continuation-in-part of application No. 11/777,121, filed on Jul. 12, 2007, which is a continuation-in-part of application No. 11/734,709, filed on Apr. 12, 2007.

(60) Provisional application No. 60/916,975, filed on May 9, 2007, provisional application No. 60/807,795, filed on Jul. 19, 2006.

(51) Int. Cl.
*G06F 13/00* (2006.01)
*G06F 15/00* (2006.01)
*G06F 17/50* (2006.01)

(52) U.S. Cl.
CPC ................................. *G06F 17/5009* (2013.01)
USPC ............................ 715/700; 715/740; 715/748

(58) Field of Classification Search
CPC .................................................. G06F 17/5009
USPC .......... 715/740–748, 763–765, 700, 851–855
See application file for complete search history.

(56) References Cited

U.S. PATENT DOCUMENTS

| 7,689,323 B2 | 3/2010 | Mansingh et al. |
| 2001/0036414 A1 | 11/2001 | Makino et al. |

(Continued)

FOREIGN PATENT DOCUMENTS

| EP | 1261096 A1 | 11/2002 |
| WO | 0045326 | * 8/2000 |
| WO | 0045326 A1 | 8/2000 |

OTHER PUBLICATIONS

International Search Report for PCT/US2008/062927 mailed Jul. 11, 2008.

(Continued)

*Primary Examiner* — Kevin Nguyen
(74) *Attorney, Agent, or Firm* — Procopio, Cory, Hargreaves & Savitch LLP; Noel C. Gillespie

(57) ABSTRACT

A system for automatically generating a schematic user interface of an electrical system is disclosed. The system includes a data acquisition component, a power analytics server and a client terminal. The data acquisition component acquires real-time data output from the electrical system. The power analytics server is comprised of a virtual system modeling engine, an analytics engine, a machine learning engine and a schematic user interface creator engine. The virtual system modeling engine generates predicted data output for the electrical system. The analytics engine monitors real-time data output and predicted data output of the electrical system. The machine learning engine stores and processes patterns observed from the real-time data output and the predicted data output to forecast an aspect of the electrical system. The schematic user interface creator engine is configured to create a schematic user interface that is representative of the virtual system model and link the schematic user interface to the data acquisition component.

23 Claims, 27 Drawing Sheets

(56) References Cited

U.S. PATENT DOCUMENTS

| | | | |
|---|---|---|---|
| 2001/0043450 A1 | 11/2001 | Seale et al. | |
| 2003/0088511 A1* | 5/2003 | Karboulonis et al. | 705/39 |
| 2003/0093390 A1 | 5/2003 | Onoda et al. | |
| 2003/0200010 A1 | 10/2003 | Chiang | |
| 2004/0005020 A1 | 1/2004 | Dent | |
| 2004/0012901 A1 | 1/2004 | Kojovic et al. | |
| 2004/0061380 A1* | 4/2004 | Hann et al. | 307/43 |
| 2004/0073415 A1 | 4/2004 | Farhat | |
| 2004/0249775 A1 | 12/2004 | Chen | |
| 2005/0033481 A1* | 2/2005 | Budhraja et al. | 700/286 |
| 2005/0116814 A1 | 6/2005 | Rodgers et al. | |
| 2005/0134440 A1 | 6/2005 | Breed | |
| 2005/0236449 A1 | 10/2005 | Bird et al. | |
| 2005/0240586 A1 | 10/2005 | Sakata | |
| 2006/0034104 A1 | 2/2006 | Royak et al. | |

OTHER PUBLICATIONS

J. Van Gorp, "Using Key Performance Indicators to Manage Power System Reliability," Schneider Electric (2006).

F. Shokooh, B. Wooton, J. Qiu, "Real-Time Simulation and Supervisory Control; The Next Logical Step After System Monitoring," PCIC-96-32 (1996).

Transpara Press Release, "Western Power Selects Transpara's Visual KPI for Enterprise-Wide Deployment; Western Australian Utility Implements Composite Key Performance Indicator Software for Improved Tracking of Operational Performance," Nov. 27, 2007.

Notice of Allowance in U.S. Appl. No. 11/780,764 dated Jan. 13, 2010, 19 pages.

Extended Search Report issued by the European Patent Office in related European Application No. 07799422.6 dated Oct. 19, 2010 (6 pages).

* cited by examiner

SYSTEMS AND METHODS FOR CREATION OF A SCHEMATIC USER INTERFACE FOR MONITORING AND PREDICTING THE REAL-TIME HEALTH, RELIABILITY AND PERFORMANCE OF AN ELECTRICAL POWER SYSTEM

APPLICATIONS FOR CLAIM OF PRIORITY

This application claims the benefit under 35 U.S.C. §119 (e) of U.S. Provisional Application Ser. No. 60/916,975 filed May 9, 2007. This application also claims priority as a Continuation-In-Part under 35 U.S.C. §120 to U.S. patent application Ser. No. 11/777,121 filed Jul. 12, 2007 and entitled "Systems and Methods for Real-Time Advanced Visualization for Predicting the Health, Reliability, and Performance of an Electrical Power System," which in turn claims priority as a Continuation-In-Part under 35 U.S.C. §120 to U.S. application Ser. No. 11/734,709 filed Apr. 12, 2007 and entitled "Systems and Methods for Performing Automatic Real-Time Harmonics Analyses for use in Real-Time Power Analytics of an Electrical Power Distribution System," and to U.S. Provisional Patent Application Ser. No. 60/807,795 filed Jul. 19, 2006.

BACKGROUND

I. Field

The present invention relates generally to computer modeling and management of systems and, more particularly, to computer simulation techniques with real-time system monitoring of electrical system health and performance.

II. Background

Computer models of complex systems enable improved system design, development, and implementation through techniques for off-line simulation of system operation. That is, system models can be created on computers and then "operated" in a virtual environment to assist in the determination of system design parameters. All manner of systems can be modeled, designed, and operated in this way, including machinery, factories, electrical power and distribution systems, processing plants, devices, chemical processes, biological systems, and the like. Such simulation techniques have resulted in reduced development costs and superior operation.

Design and production processes have benefited greatly from such computer simulation techniques, and such techniques are relatively well developed, but they have not been applied in real-time, e.g., for real-time operational monitoring and management. In addition, predictive failure analysis techniques do not generally use real-time data that reflect actual system operation. Greater efforts at real-time operational monitoring and management would provide more accurate and timely suggestions for operational decisions, and such techniques applied to failure analysis would provide improved predictions of system problems before they occur.

That is, an electrical network model that can age and synchronize itself in real-time with the actual facility's operating conditions is critical to obtaining predictions that are reflective of the system's reliability, availability, health and performance in relation to the life cycle of the system. Static systems simply cannot adjust to the many daily changes to the electrical system that occur at a facility (e.g., motors and pumps switching on or off, changes to on-site generation status, changes to utility electrical feed . . . etc.) nor can they age with the facility to accurately predict the required indices. Without a synchronization or aging ability, reliability indices and predictions are of little value as they are not reflective of the actual operational status of the facility and may lead to false conclusions. With such improved techniques, operational costs and risks can be greatly reduced.

For example, mission critical electrical systems, e.g., for data centers or nuclear power facilities, must be designed to ensure that power is always available. Thus, the systems must be as failure proof as possible, and many layers of redundancy must be designed in to ensure that there is always a backup in case of a failure. It will be understood that such systems are highly complex, a complexity made even greater as a result of the required redundancy. Computer design and modeling programs allow for the design of such systems by allowing a designer to model the system and simulate its operation. Thus, the designer can ensure that the system will operate as intended before the facility is constructed.

As with all analytical tools, predictive or otherwise, the manner in which data and results are communicated to the user is often as important as the choice of analytical tool itself. Ideally, the data and results are communicated in a fashion that is simple to understand while also painting a comprehensive and accurate picture for the user. For example, graphical displays (e.g., two-dimensional and three-dimensional views) of the operational aspects of an electrical system greatly enhances the ability of a system operator, owner and/or executive to understand the health and predicted performance of the electrical system.

Currently, no solution exists for an automatic and intelligent electrical power system schematic creation and visualization tool for the rapid development and deployment of schematic-based user interfaces for real-time monitoring the health, performance, and reliability of an electrical power system.

SUMMARY

Systems and methods for automatically generating a schematic user interface of an electrical system are disclosed.

In one aspect, a system for automatically generating a schematic user interface of an electrical system is disclosed. The system includes a data acquisition component, a power analytics server and a client terminal. The data acquisition component is communicatively connected to a sensor configured to acquire real-time data output from the electrical system. The power analytics server is communicatively connected to the data acquisition component and is comprised of a virtual system modeling engine, an analytics engine, a machine learning engine and a schematic user interface creator engine.

The virtual system modeling engine is configured to generate predicted data output for the electrical system utilizing a virtual system model of the electrical system. The analytics engine is configured to monitor the real-time data output and the predicted data output of the electrical system initiating a calibration and synchronization operation to update the virtual system model when a difference between the real-time data output and the predicted data output exceeds a threshold. The machine learning engine is configured to store and process patterns observed from the real-time data output and the predicted data output then forecast an aspect of the electrical system. The schematic user interface creator engine is configured to create a schematic user interface that is representative of the virtual system model and link the schematic user interface to the data acquisition component.

The client terminal is communicatively connected to the power analytics server and configured to display the schematic user interface.

In another aspect, a method for automatically generating a schematic user interface of an electrical system is disclosed. System configuration data is extracted from a virtual system model of the electrical system. A logical construct of the virtual system model is created using the system configuration data. On or more graphical objects are generated to represent one or more pieces of electrical equipment included in the logical construct. The one or more graphical objects are organized to generate a schematic user interface layout of the electrical system. The one or more graphical objects are communicatively linked to sensors configured to monitor the real-time operational status of the one or more pieces of electrical equipment represented by the one or more graphical objects.

These and other features, aspects, and embodiments are described below in the section entitled "Detailed Description."

BRIEF DESCRIPTION OF THE DRAWINGS

For a more complete understanding of the principles disclosed herein, and the advantages thereof, reference is now made to the following descriptions taken in conjunction with the accompanying drawings, in which.

DETAILED DESCRIPTION

Systems and methods for automatically generating a schematic user interface of an electrical system are disclosed. It will be clear, however, that the present invention may be practiced without some or all of these specific details. In other instances, well known process operations have not been described in detail in order not to unnecessarily obscure the present invention.

As used herein, a system denotes a set of components, real or abstract, comprising a whole where each component interacts with or is related to at least one other component within the whole. Examples of systems include machinery, factories, electrical systems, processing plants, devices, chemical processes, biological systems, data centers, aircraft carriers, and the like. An electrical system can designate a power generation and/or distribution system that is widely dispersed (i.e., power generation, transformers, and/or electrical distribution components distributed geographically throughout a large region) or bounded within a particular location (e.g., a power plant within a production facility, a bounded geographic area, on board a ship, a factory, a data center, etc.).

A network application is any application that is stored on an application server connected to a network (e.g., local area network, wide area network, etc.) in accordance with any contemporary client/server architecture model and can be accessed via the network. In this arrangement, the network application programming interface (API) resides on the application server separate from the client machine. The client interface would typically be a web browser (e.g. INTERNET EXPLORER™, FIREFOX™, NETSCAPE™, etc) that is in communication with the network application server via a network connection (e.g., HTTP, HTTPS, RSS, etc.).

Figure 1:
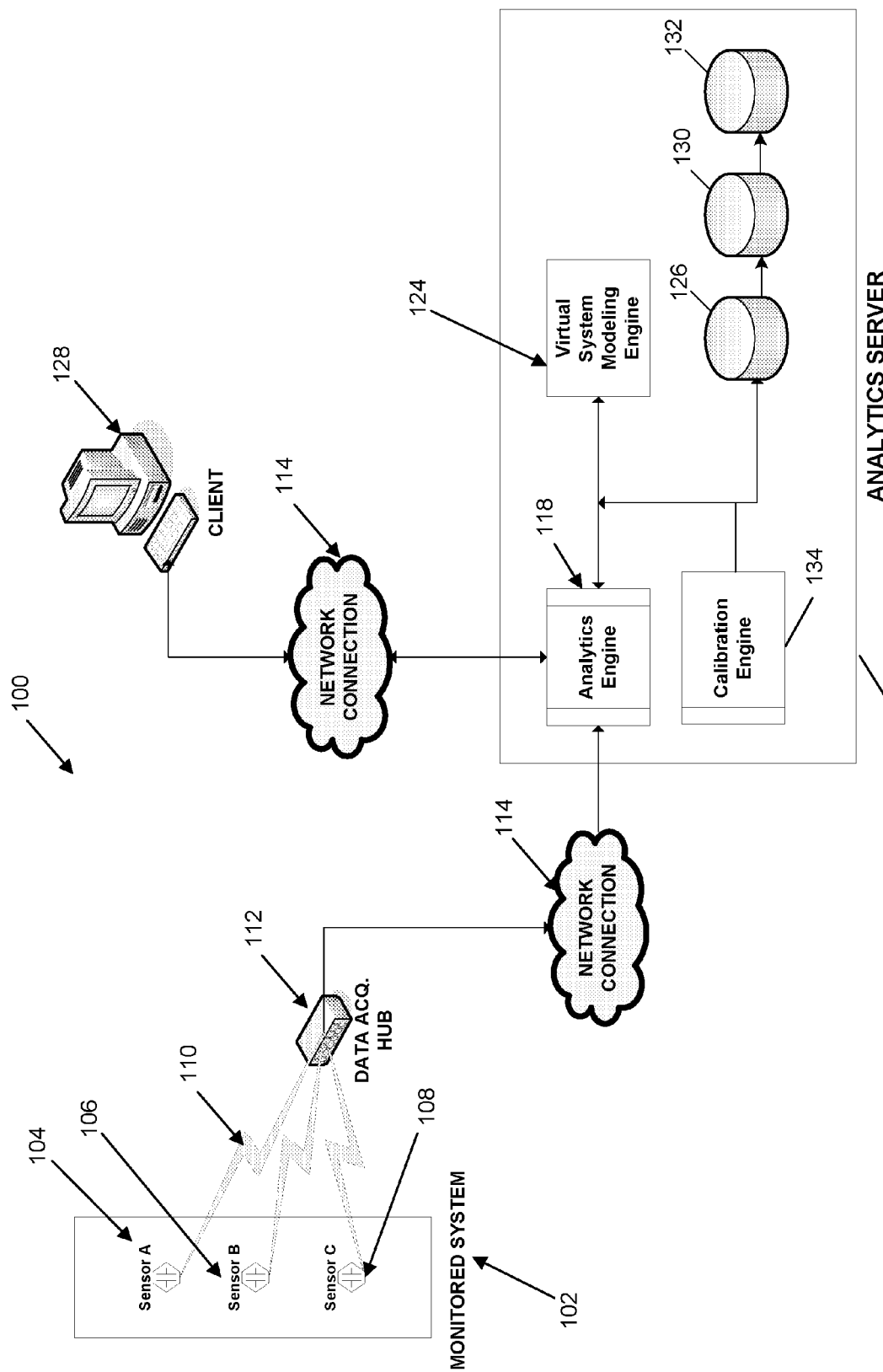
FIG. 1 is an illustration of a system for utilizing real-time data for predictive analysis of the performance of a monitored system, in accordance with one embodiment.

FIG. 1 is an illustration of a system for utilizing real-time data for predictive analysis of the performance of a monitored system, in accordance with one embodiment. As shown herein, the system 100 includes a series of sensors (i.e., Sensor A 104, Sensor B 106, Sensor C 108) interfaced with the various components of a monitored system 102, a data acquisition hub 112, an analytics server 116, and a thin-client device 128. In one embodiment, the monitored system 102 is an electrical power generation plant. In another embodiment, the monitored system 102 is an electrical power transmission infrastructure. In still another embodiment, the monitored system 102 is an electrical power distribution system. In still another embodiment, the monitored system 102 includes a combination of one or more electrical power generation plant(s), power transmission infrastructure(s), and/or an electrical power distribution system. It should be understood that the monitored system 102 can be any combination of components whose operations can be monitored with conventional sensors and where each component interacts with or is related to at least one other component within the combination. For a monitored system 102 that is an electrical power generation, transmission, or distribution system, the sensors can provide data such as voltage, frequency, current, power, power factor, and the like.

The sensors are configured to provide output values for system parameters that indicate the operational status and/or "health" of the monitored system 102. For example, in an electrical power generation system, the current output or voltage readings for the various components that comprise the power generation system is indicative of the overall health and/or operational condition of the system. In one embodiment, the sensors are configured to also measure additional data that can affect system operation. For example, for an electrical power distribution system, the sensor output can include environmental information, e.g., temperature, humidity, etc., which can impact electrical power demand and can also affect the operation and efficiency of the power distribution system itself.

Continuing with FIG. 1, in one embodiment, the sensors are configured to output data in an analog format. For example, electrical power sensor measurements (e.g., voltage, current, etc.) are sometimes conveyed in an analog format as the measurements may be continuous in both time and amplitude. In another embodiment, the sensors are configured to output data in a digital format. For example, the same electrical power sensor measurements may be taken in discrete time increments that are not continuous in time or amplitude. In still another embodiment, the sensors are configured to output data in either an analog or digital format depending on the sampling requirements of the monitored system 102.

The sensors can be configured to capture output data at split-second intervals to effectuate "real time" data capture. For example, in one embodiment, the sensors can be configured to generate hundreds of thousands of data readings per second. It should be appreciated, however, that the number of data output readings taken by a sensor may be set to any value as long as the operational limits of the sensor and the data processing capabilities of the data acquisition hub 112 are not exceeded.

Still with FIG. 1, each sensor is communicatively connected to the data acquisition hub 112 via an analog or digital data connection 110. The data acquisition hub 112 may be a standalone unit or integrated within the analytics server 116 and can be embodied as a piece of hardware, software, or some combination thereof. In one embodiment, the data connection 110 is a "hard wired" physical data connection (e.g., serial, network, etc.). For example, a serial or parallel cable connection between the sensor and the hub 112. In another embodiment, the data connection 110 is a wireless data connection. For example, a radio frequency (RF), BLUETOOTH™, infrared or equivalent connection between the sensor and the hub 112.

The data acquisition hub 112 is configured to communicate "real-time" data from the monitored system 102 to the analytics server 116 using a network connection 114. In one embodiment, the network connection 114 is a "hardwired" physical connection. For example, the data acquisition hub 112 may be communicatively connected (via Category 5 (CAT5), fiber optic or equivalent cabling) to a data server (not shown) that is communicatively connected (via CAT5, fiber optic or equivalent cabling) through the Internet and to the analytics server 116 server. The analytics server 116 being also communicatively connected with the Internet (via CAT5, fiber optic, or equivalent cabling). In another embodiment, the network connection 114 is a wireless network connection (e.g., Wi-Fi, WLAN, etc.). For example, utilizing an 802.11b/g or equivalent transmission format. In practice, the network connection utilized is dependent upon the particular requirements of the monitored system 102.

Data acquisition hub 112 can also be configured to supply warning and alarms signals as well as control signals to monitored system 102 and/or sensors 104, 106, and 108 as described in more detail below.

As shown in FIG. 1, in one embodiment, the analytics server 116 hosts an analytics engine 118, virtual system modeling engine 124 and several databases 126, 130, and 132. The virtual system modeling engine can, e.g., be a computer modeling system, such as described above. In this context, however, the modeling engine can be used to precisely model and mirror the actual electrical system. Analytics engine 118 can be configured to generate predicted data for the monitored system and analyze difference between the predicted data and the real-time data received from hub 112.

Figure 2:
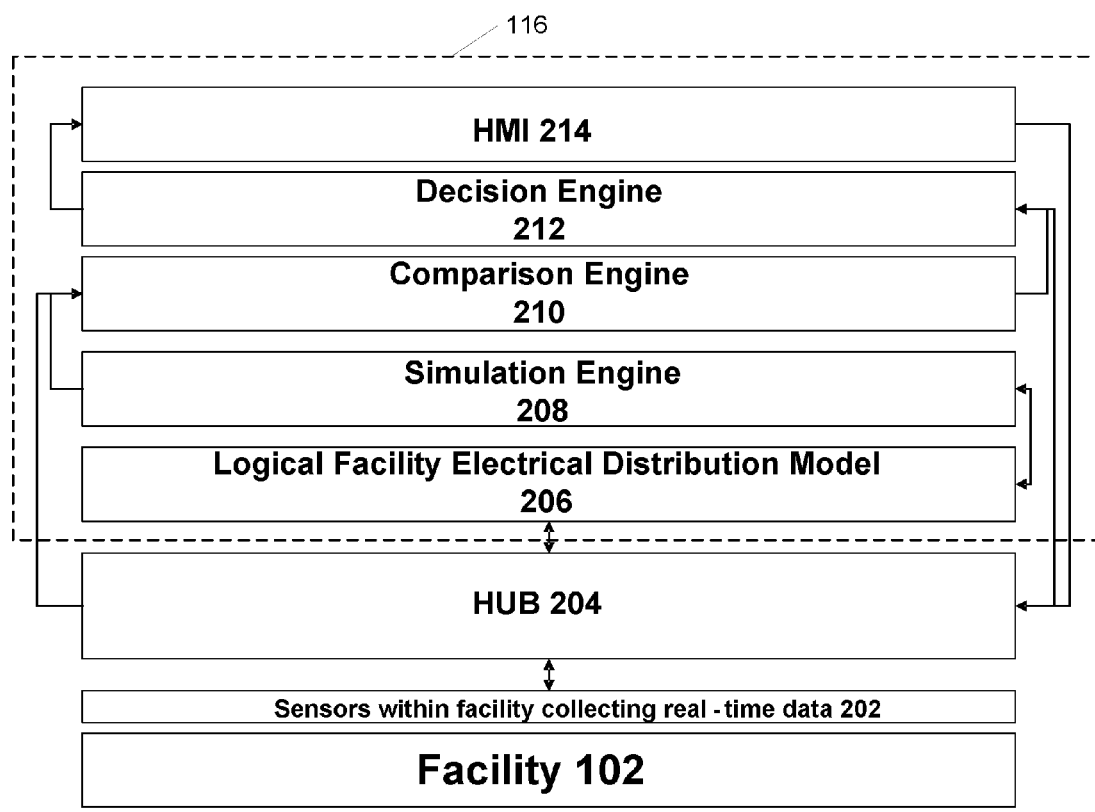
FIG. 2 is a diagram illustrating a detailed view of an analytics server included in the system of FIG. 1, in accordance with one embodiment.

FIG. 2 is a diagram illustrating a more detailed view of analytic server 116. As can be seen, analytic server 116 is interfaced with a monitored facility 102 via sensors 202, e.g., sensors 104, 106, and 108. Sensors 202 are configured to supply real-time data from within monitored facility 102. The real-time data is communicated to analytic server 116 via a hub 204. Hub 204 can be configure to provide real-time data to server 116 as well as alarming, sensing and control featured for facility 102.

The real-time data from hub 204 can be passed to a comparison engine 210, which can form part of analytics engine 118. Comparison engine 210 can be configured to continuously compare the real-time data with predicted values generated by simulation engine 208. Based on the comparison, comparison engine 210 can be further configured to determine whether deviations between the real-time and the expected values exists, and if so to classify the deviation, e.g., high, marginal, low, etc. The deviation level can then be communicated to decision engine 212, which can also comprise part of analytics engine 118.

Decision engine 212 can be configured to look for significant deviations between the predicted values and real-time values as received from the comparison engine 210. If significant deviations are detected, decision engine 212 can also be configured to determine whether an alarm condition exists, activate the alarm and communicate the alarm to Human-Machine Interface (HMI) 214 for display in real-time via, e.g., thin client 128. Decision engine 212 can also be configured to perform root cause analysis for significant deviations in order to determine the interdependencies and identify the parent-child failure relationships that may be occurring. In this manner, parent alarm conditions are not drowned out by multiple children alarm conditions, allowing the user/operator to focus on the main problem, at least at first.

Thus, in one embodiment, and alarm condition for the parent can be displayed via HMI 214 along with an indication that processes and equipment dependent on the parent process or equipment are also in alarm condition. This also means that server 116 can maintain a parent-child logical relationship between processes and equipment comprising facility 102. Further, the processes can be classified as critical, essential, non-essential, etc.

Decision engine 212 can also be configured to determine health and performance levels and indicate these levels for the various processes and equipment via HMI 214. All of which, when combined with the analytic capabilities of analytics engine 118 allows the operator to minimize the risk of catastrophic equipment failure by predicting future failures and providing prompt, informative information concerning potential/predicted failures before they occur. Avoiding catastrophic failures reduces risk and cost, and maximizes facility performance and up time.

Simulation engine 208 operates on complex logical models 206 of facility 102. These models are continuously and automatically synchronized with the actual facility status based on the real-time data provided by hub 204. In other words, the models are updated based on current switch status, breaker status, e.g., open-closed, equipment on/off status, etc. Thus, the models are automatically updated based on such status, which allows simulation engine to produce predicted data based on the current facility status. This in turn, allows accurate and meaningful comparisons of the real-time data to the predicted data.

Example models 206 that can be maintained and used by server 116 include power flow models used to calculate expected kW, kVAR, power factor values, etc., short circuit models used to calculate maximum and minimum available fault currents, protection models used to determine proper protection schemes and ensure selective coordination of protective devices, power quality models used to determine voltage and current distortions at any point in the network, to name just a few. It will be understood that different models can be used depending on the system being modeled.

In certain embodiments, hub 204 is configured to supply equipment identification associated with the real-time data. This identification can be cross referenced with identifications provided in the models.

In one embodiment, if the comparison performed by comparison engine 210 indicates that the differential between the real-time sensor output value and the expected value exceeds a Defined Difference Tolerance (DDT) value (i.e., the "real-time" output values of the sensor output do not indicate an alarm condition) but below an alarm condition (i.e., alarm threshold value), a calibration request is generated by the analytics engine 118. If the differential exceeds, the alarm condition, an alarm or notification message is generated by the analytics engine 118. If the differential is below the DTT value, the analytics engine does nothing and continues to monitor the real-time data and expected data.

In one embodiment, the alarm or notification message is sent directly to the client (i.e., user) 128, e.g., via HMI 214, for display in real-time on a web browser, pop-up message box, e-mail, or equivalent on the client 128 display panel. In another embodiment, the alarm or notification message is sent to a wireless mobile device (e.g., BLACKBERRY™, laptop, pager, etc.) to be displayed for the user by way of a wireless router or equivalent device interfaced with the analytics server 116. In still another embodiment, the alarm or notification message is sent to both the client 128 display and the wireless mobile device. The alarm can be indicative of a need for a repair event or maintenance to be done on the monitored system. It should be noted, however, that calibration requests should not be allowed if an alarm condition exists to prevent the models form being calibrated to an abnormal state.

Once the calibration is generated by the analytics engine 118, the various operating parameters or conditions of model(s) 206 can be updated or adjusted to reflect the actual facility configuration. This can include, but is not limited to, modifying the predicted data output from the simulation engine 208, adjusting the logic/processing parameters utilized by the model(s) 206, adding/subtracting functional elements from model(s) 206, etc. It should be understood, that any operational parameter of models 206 can be modified as long as the resulting modifications can be processed and registered by simulation engine 208.

Referring back to FIG. 1, models 206 can be stored in the virtual system model database 126. As noted, a variety of conventional virtual model applications can be used for creating a virtual system model, so that a wide variety of systems and system parameters can be modeled. For example, in the context of an electrical power distribution system, the virtual system model can include components for modeling reliability, voltage stability, and power flow. In addition, models 206 can include dynamic control logic that permits a user to configure the models 206 by specifying control algorithms and logic blocks in addition to combinations and interconnections of generators, governors, relays, breakers, transmission line, and the like. The voltage stability parameters can indicate capacity in terms of size, supply, and distribution, and can indicate availability in terms of remaining capacity of the presently configured system. The power flow model can specify voltage, frequency, and power factor, thus representing the "health" of the system.

All of models 206 can be referred to as a virtual system model. Thus, virtual system model database can be configured to store the virtual system model. A duplicate, but synchronized copy of the virtual system model can be stored in a virtual simulation model database 130. This duplicate model can be used for what-if simulations. In other words, this model can be used to allow a system designer to make hypothetical changes to the facility and test the resulting effect, without taking down the facility or costly and time consuming analysis. Such hypothetical can be used to learn failure patterns and signatures as well as to test proposed modifications, upgrades, additions, etc., for the facility. The real-time data, as well as trending produced by analytics engine 118 can be stored in a real-time data acquisition database 132.

As discussed above, the virtual system model is periodically calibrated and synchronized with "real-time" sensor data outputs so that the virtual system model provides data output values that are consistent with the actual "real-time" values received from the sensor output signals. Unlike conventional systems that use virtual system models primarily for system design and implementation purposes (i.e., offline simulation and facility planning), the virtual system models described herein are updated and calibrated with the real-time system operational data to provide better predictive output values. A divergence between the real-time sensor output values and the predicted output values generate either an alarm condition for the values in question and/or a calibration request that is sent to the calibration engine 134.

Continuing with FIG. 1, the analytics engine 118 can be configured to implement pattern/sequence recognition into a real-time decision loop that, e.g., is enabled by a new type of machine learning called associative memory, or hierarchical temporal memory (HTM), which is a biological approach to learning and pattern recognition. Associative memory allows storage, discovery, and retrieval of learned associations between extremely large numbers of attributes in real time. At a basic level, an associative memory stores information about how attributes and their respective features occur together. The predictive power of the associative memory technology comes from its ability to interpret and analyze these co-occurrences and to produce various metrics. Associative memory is built through "experiential" learning in which each newly observed state is accumulated in the associative memory as a basis for interpreting future events. Thus, by observing normal system operation over time, and the normal predicted system operation over time, the associative memory is able to learn normal patterns as a basis for identifying non-normal behavior and appropriate responses, and to associate patterns with particular outcomes, contexts or responses. The analytics engine 118 is also better able to understand component mean time to failure rates through observation and system availability characteristics. This technology in combination with the virtual system model can be characterized as a "neocortical" model of the system under management.

This approach also presents a novel way to digest and comprehend alarms in a manageable and coherent way. The neocortical model could assist in uncovering the patterns and sequencing of alarms to help pinpoint the location of the (impending) failure, its context, and even the cause. Typically, responding to the alarms is done manually by experts who have gained familiarity with the system through years of experience. However, at times, the amount of information is so great that an individual cannot respond fast enough or does not have the necessary expertise. An "intelligent" system like the neocortical system that observes and recommends possible responses could improve the alarm management process by either supporting the existing operator, or even managing the system autonomously.

Current simulation approaches for maintaining transient stability involve traditional numerical techniques and typically do not test all possible scenarios. The problem is further complicated as the numbers of components and pathways increase. Through the application of the neocortical model, by observing simulations of circuits, and by comparing them to actual system responses, it may be possible to improve the simulation process, thereby improving the overall design of future circuits.

The virtual system model database 126, as well as databases 130 and 132, can be configured to store one or more virtual system models, virtual simulation models, and real-time data values, each customized to a particular system being monitored by the analytics server 118. Thus, the analytics server 118 can be utilized to monitor more than one system at a time. As depicted herein, the databases 126, 130, and 132 can be hosted on the analytics server 116 and communicatively interfaced with the analytics engine 118. In other embodiments, databases 126, 130, and 132 can be hosted on a separate database server (not shown) that is communicatively connected to the analytics server 116 in a manner that allows the virtual system modeling engine 124 and analytics engine 118 to access the databases as needed.

Therefore, in one embodiment, the client 128 can modify the virtual system model stored on the virtual system model database 126 by using a virtual system model development interface using well-known modeling tools that are separate from the other network interfaces. For example, dedicated software applications that run in conjunction with the network interface to allow a client 128 to create or modify the virtual system models.

The client 128 may utilize a variety of network interfaces (e.g., web browser, CITRIX™, WINDOWS TERMINAL SERVICES™, telnet, or other equivalent thin-client terminal applications, etc.) to access, configure, and modify the sensors (e.g., configuration files, etc.), analytics engine 118 (e.g., configuration files, analytics logic, etc.), calibration parameters (e.g., configuration files, calibration parameters, etc.), virtual system modeling engine 124 (e.g., configuration files, simulation parameters, etc.) and virtual system model of the system under management (e.g., virtual system model operating parameters and configuration files). Correspondingly, data from those various components of the monitored system 102 can be displayed on a client 128 display panel for viewing by a system administrator or equivalent.

Figure 3:
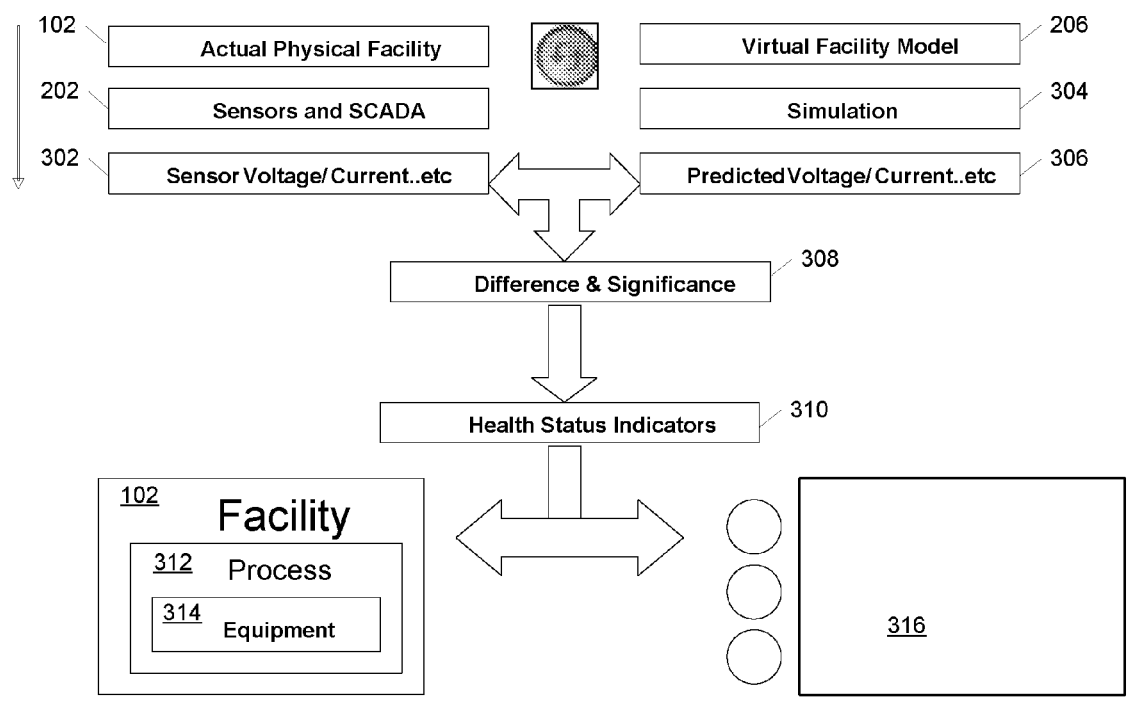
FIG. 3 is a diagram illustrating how the system of FIG. 1 operates to synchronize the operating parameters between a physical facility and a virtual system model of the facility, in accordance with one embodiment.

As described above, server 116 is configured to synchronize the physical world with the virtual and report, e.g., via visual, real-time display, deviations between the two as well as system health, alarm conditions, predicted failures, etc. This is illustrated with the aid of FIG. 3, in which the synchronization of the physical world (left side) and virtual world (right side) is illustrated. In the physical world, sensors 202 produce real-time data 302 for the processes 312 and equipment 314 that make up facility 102. In the virtual world, simulations 304 of the virtual system model 206 provide predicted values 306, which are correlated and synchronized with the real-time data 302. The real-time data can then be compared to the predicted values so that differences 308 can be detected. The significance of these differences can be determined to determine the health status 310 of the system. The health stats can then be communicated to the processes 312 and equipment 314, e.g., via alarms and indicators, as well as to thin client 128, e.g., via web pages 316.

Figure 4:
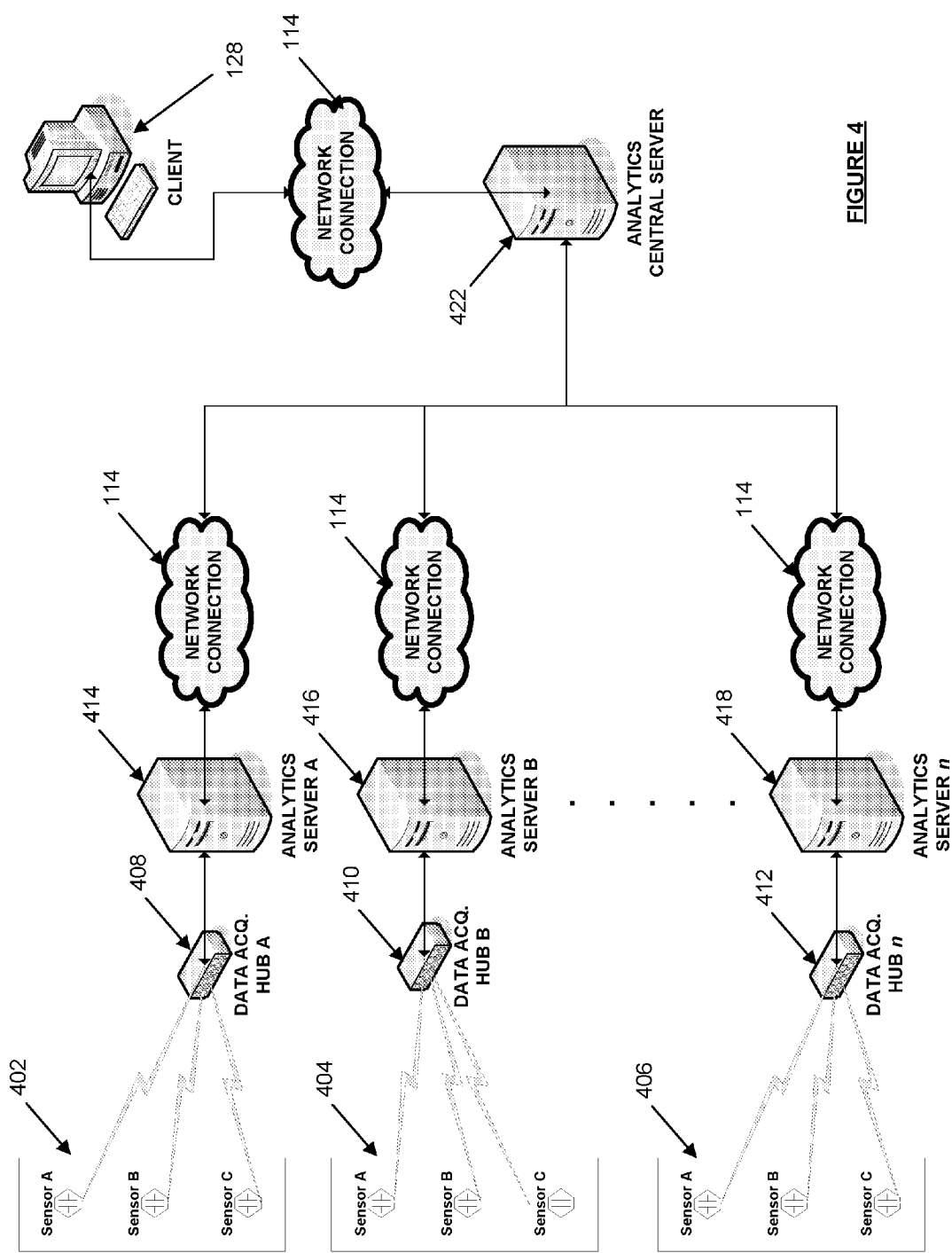
FIG. 4 is an illustration of the scalability of a system for utilizing real-time data for predictive analysis of the performance of a monitored system, in accordance with one embodiment.

FIG. 4 is an illustration of the scalability of a system for utilizing real-time data for predictive analysis of the performance of a monitored system, in accordance with one embodiment. As depicted herein, an analytics central server 422 is communicatively connected with analytics server A 414, analytics server B 416, and analytics server n 418 (i.e., one or more other analytics servers) by way of one or more network connections 114. Each of the analytics servers is communicatively connected with a respective data acquisition hub (i.e., Hub A 408, Hub B 410, Hub n 412) that communicates with one or more sensors that are interfaced with a system (i.e., Monitored System A 402, Monitored System B 404, Monitored System n 406) that the respective analytical server monitors. For example, analytics server A 414 is communicative connected with data acquisition hub A 408, which communicates with one or more sensors interfaced with monitored system A 402.

Each analytics server (i.e., analytics server A 414, analytics server B 416, analytics server n 418) is configured to monitor the sensor output data of its corresponding monitored system and feed that data to the central analytics server 422. Additionally, each of the analytics servers can function as a proxy agent of the central analytics server 422 during the modifying and/or adjusting of the operating parameters of the system sensors they monitor. For example, analytics server B 416 is configured to be utilized as a proxy to modify the operating parameters of the sensors interfaced with monitored system B 404.

Moreover, the central analytics server 422, which is communicatively connected to one or more analytics server(s) can be used to enhance the scalability. For example, a central analytics server 422 can be used to monitor multiple electrical power generation facilities (i.e., monitored system A 402 can be a power generation facility located in city A while monitored system B 404 is a power generation facility located in city B) on an electrical power grid. In this example, the number of electrical power generation facilities that can be monitored by central analytics server 422 is limited only by the data processing capacity of the central analytics server 422. The central analytics server 422 can be configured to enable a client 128 to modify and adjust the operational parameters of any the analytics servers communicatively connected to the central analytics server 422. Furthermore, as discussed above, each of the analytics servers are configured to serve as proxies for the central analytics server 422 to enable a client 128 to modify and/or adjust the operating parameters of the sensors interfaced with the systems that they respectively monitor. For example, the client 128 can use the central analytics server 422, and vice versa, to modify and/or adjust the operating parameters of analytics server A 414 and utilize the same to modify and/or adjust the operating parameters of the sensors interfaced with monitored system A 402. Additionally, each of the analytics servers can be configured to allow a client 128 to modify the virtual system model through a virtual system model development interface using well-known modeling tools.

In one embodiment, the central analytics server 422 can function to monitor and control a monitored system when its corresponding analytics server is out of operation. For example, central analytics server 422 can take over the functionality of analytics server B 416 when the server 416 is out of operation. That is, the central analytics server 422 can monitor the data output from monitored system B 404 and modify and/or adjust the operating parameters of the sensors that are interfaced with the system 404.

In one embodiment, the network connection 114 is established through a wide area network (WAN) such as the Internet. In another embodiment, the network connection is established through a local area network (LAN) such as the company intranet. In a separate embodiment, the network connection 114 is a "hardwired" physical connection. For example, the data acquisition hub 112 may be communicatively connected (via Category 5 (CAT5), fiber optic or equivalent cabling) to a data server that is communicatively connected (via CAT5, fiber optic or equivalent cabling) through the Internet and to the analytics server 116 server hosting the analytics engine 118. In another embodiment, the network connection 114 is a wireless network connection (e.g., Wi-Fi, WLAN, etc.). For example, utilizing an 802.11b/g or equivalent transmission format.

In certain embodiments, regional analytics servers can be placed between local analytics servers 414, 416, . . . , 418 and central analytics server 422. Further, in certain embodiments a disaster recovery site can be included at the central analytics server 422 level.

Figure 5:
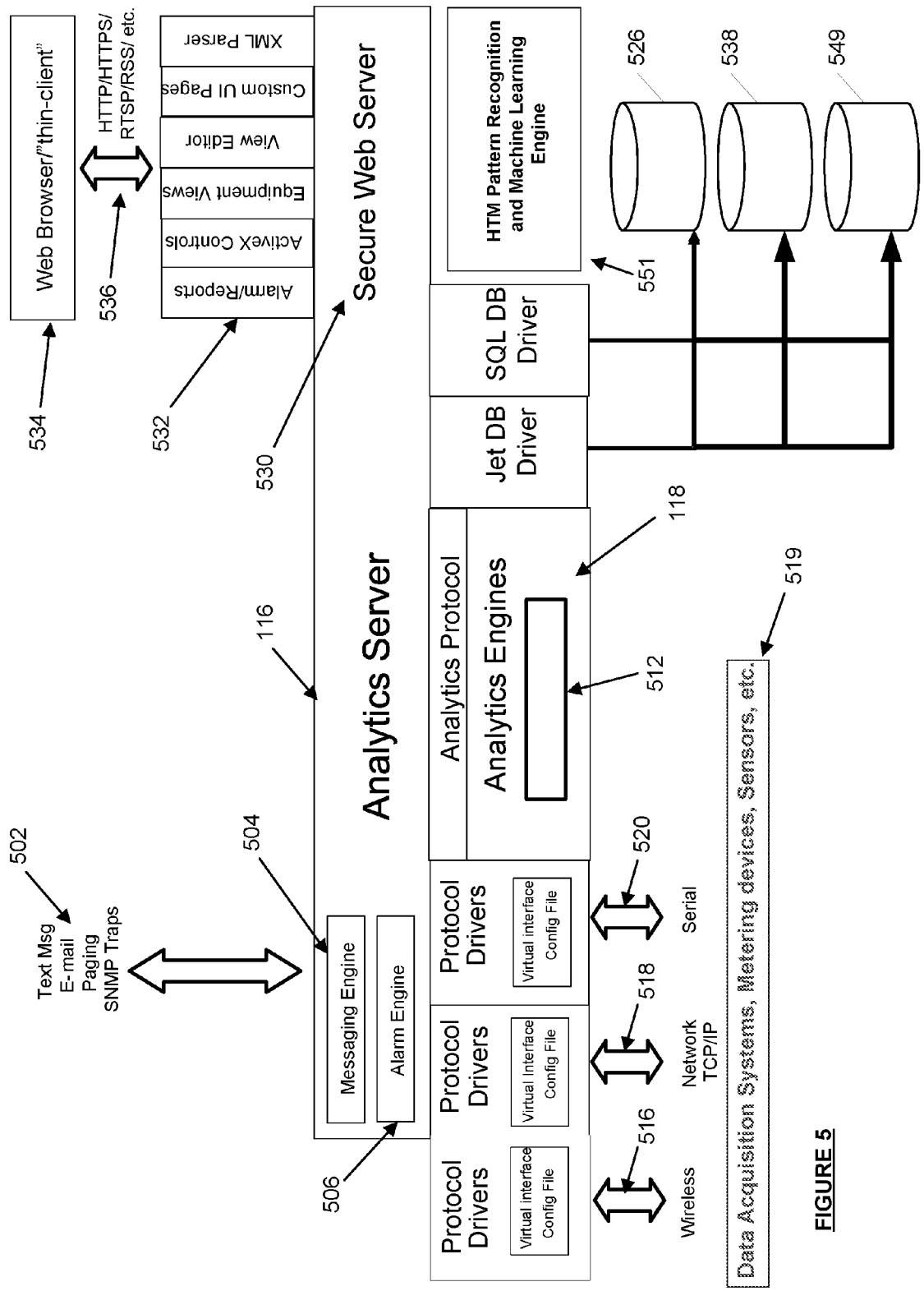
FIG. 5 is a block diagram that shows the configuration details of the system illustrated in FIG. 1, in accordance with one embodiment.

FIG. 5 is a block diagram that shows the configuration details of analytics server 116 illustrated in FIG. 1 in more detail. It should be understood that the configuration details in FIG. 5 are merely one embodiment of the items described for FIG. 1, and it should be understood that alternate configurations and arrangements of components could also provide the functionality described herein.

The analytics server 116 includes a variety of components. In the FIG. 5 embodiment, the analytics server 116 is implemented in a Web-based configuration, so that the analytics server 116 includes (or communicates with) a secure web server 530 for communication with the sensor systems 519 (e.g., data acquisition units, metering devices, sensors, etc.) and external communication entities 534 (e.g., web browser, "thin client" applications, etc.). A variety of user views and functions 532 are available to the client 128 such as: alarm reports, Active X controls, equipment views, view editor tool, custom user interface page, and XML parser. It should be appreciated, however, that these are just examples of a few in a long list of views and functions 532 that the analytics server 116 can deliver to the external communications entities 534 and are not meant to limit the types of views and functions 532 available to the analytics server 116 in any way.

The analytics server 116 also includes an alarm engine 506 and messaging engine 504, for the aforementioned external communications. The alarm engine 506 is configured to work in conjunction with the messaging engine 504 to generate alarm or notification messages 502 (in the form of text messages, e-mails, paging, etc.) in response to the alarm conditions previously described. The analytics server 116 determines alarm conditions based on output data it receives from the various sensor systems 519 through a communications connection (e.g., wireless 516, TCP/IP 518, Serial 520, etc) and simulated output data from a virtual system model 512, of the monitored system, processed by the analytics engines 118. In one embodiment, the virtual system model 512 is created by a user through interacting with an external communication entity 534 by specifying the components that comprise the monitored system and by specifying relationships between the components of the monitored system. In another embodiment, the virtual system model 512 is automatically generated by the analytics engines 118 as components of the monitored system are brought online and interfaced with the analytics server 508.

Continuing with FIG. 5, a virtual system model database 526 is communicatively connected with the analytics server 116 and is configured to store one or more virtual system models 512, each of which represents a particular monitored system. For example, the analytics server 116 can conceivably monitor multiple electrical power generation systems (e.g., system A, system B, system C, etc.) spread across a wide geographic area (e.g., City A, City B, City C, etc.). Therefore, the analytics server 116 will utilize a different virtual system model 512 for each of the electrical power generation systems that it monitors. Virtual simulation model database 538 can be configured to store a synchronized, duplicate copy of the virtual system model 512, and real-time data acquisition database 540 can store the real-time and trending data for the system(s) being monitored.

Thus, in operation, analytics server 116 can receive real-time data for various sensors, i.e., components, through data acquisition system 202. As can be seen, analytics server 116 can comprise various drivers configured to interface with the various types of sensors, etc., comprising data acquisition system 202. This data represents the real-time operational data for the various components. For example, the data may indicate that a certain component is operating at a certain voltage level and drawing certain amount of current. This information can then be fed to a modeling engine to generate a virtual system model 612 that is based on the actual real-time operational data.

Analytics engine 118 can be configured to compare predicted data based on the virtual system model 512 with real-time data received from data acquisition system 202 and to identify any differences. In some instances, analytics engine can be configured to identify these differences and then update, i.e., calibrate, the virtual system model 512 for use in future comparisons. In this manner, more accurate comparisons and warnings can be generated.

But in other instances, the differences will indicate a failure, or the potential for a failure. For example, when a component begins to fail, the operating parameters will begin to change. This change may be sudden or it may be a progressive change over time. Analytics engine 118 can detect such changes and issue warnings that can allow the changes to be detected before a failure occurs. The analytic engine 118 can be configured to generate warnings that can be communicated via interface 532.

For example, a user can access information from server 116 using thin client 534. For example, reports can be generate and served to thin client 534 via server 540. These reports can, for example, comprise schematic or symbolic illustrations of the system being monitored. Status information for each component can be illustrated or communicated for each component. This information can be numerical, i.e., the voltage or current level. Or it can be symbolic, i.e., green for normal, red for failure or warning. In certain embodiments, intermediate levels of failure can also be communicated, i.e., yellow can be used to indicate operational conditions that project the potential for future failure. It should be noted that this information can be accessed in real-time. Moreover, via thin client 534, the information can be accessed form anywhere and anytime.

Continuing with FIG. 5, the Analytics Engine 118 is communicatively interfaced with a HTM Pattern Recognition and Machine Learning Engine 551. The HTM Engine 551 is configured to work in conjunction with the Analytics Engine 118 and a virtual system model of the monitored system to make real-time predictions (i.e., forecasts) about various operational aspects of the monitored system. The HTM Engine 551 works by processing and storing patterns observed during the normal operation of the monitored system over time. These observations are provided in the form of real-time data captured using a multitude of sensors that are imbedded within the monitored system. In one embodiment, the virtual system model is also updated with the real-time data such that the virtual system model "ages" along with the monitored system. Examples of a monitored system includes machinery, factories, electrical systems, processing plants, devices, chemical processes, biological systems, data centers, aircraft carriers, and the like. It should be understood that the monitored system can be any combination of components whose operations can be monitored with conventional sensors and where each component interacts with or is related to at least one other component within the combination.

Figure 6:
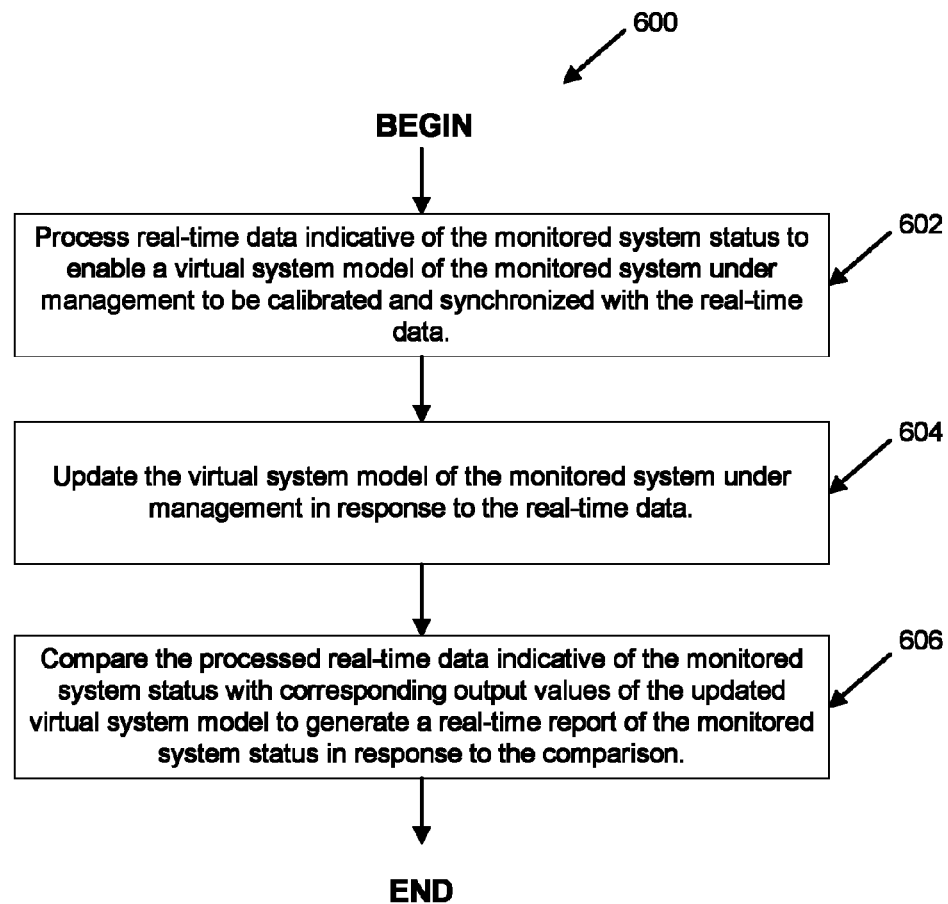
FIG. 6 is an illustration of a flowchart describing a method for real-time monitoring and predictive analysis of a monitored system, in accordance with one embodiment.

FIG. 6 is an illustration of a flowchart describing a method for real-time monitoring and predictive analysis of a monitored system, in accordance with one embodiment. Method 600 begins with operation 602 where real-time data indicative of the monitored system status is processed to enable a virtual model of the monitored system under management to be calibrated and synchronized with the real-time data. In one embodiment, the monitored system 102 is a mission critical electrical power system. In another embodiment, the monitored system 102 can include an electrical power transmission infrastructure. In still another embodiment, the monitored system 102 includes a combination of thereof. It should be understood that the monitored system 102 can be any combination of components whose operations can be monitored with conventional sensors and where each component interacts with or is related to at least one other component within the combination.

Method 600 moves on to operation 604 where the virtual system model of the monitored system under management is updated in response to the real-time data. This may include, but is not limited to, modifying the simulated data output from the virtual system model, adjusting the logic/processing parameters utilized by the virtual system modeling engine to simulate the operation of the monitored system, adding/subtracting functional elements of the virtual system model, etc. It should be understood, that any operational parameter of the virtual system modeling engine and/or the virtual system model may be modified by the calibration engine as long as the resulting modifications can be processed and registered by the virtual system modeling engine.

Method 600 proceeds on to operation 606 where the simulated real-time data indicative of the monitored system status is compared with a corresponding virtual system model created at the design stage. The design stage models, which may be calibrated and updated based on real-time monitored data, are used as a basis for the predicted performance of the system. The real-time monitored data can then provide the actual performance over time. By comparing the real-time time data with the predicted performance information, difference can be identified a tracked by, e.g., the analytics engine 118. Analytics engines 118 can then track trends, determine alarm states, etc., and generate a real-time report of the system status in response to the comparison.

In other words, the analytics can be used to analyze the comparison and real-time data and determine if there is a problem that should be reported and what level the problem may be, e.g., low priority, high priority, critical, etc. The analytics can also be used to predict future failures and time to failure, etc. In one embodiment, reports can be displayed on a conventional web browser (e.g. INTERNET EXPLORER™, FIREFOX™, NETSCAPE™, etc) that is rendered on a standard personal computing (PC) device. In another embodiment, the "real-time" report can be rendered on a "thin-client" computing device (e.g., CITRIX™, WINDOWS TERMINAL SERVICES™, telnet, or other equivalent thin-client terminal application). In still another embodiment, the report can be displayed on a wireless mobile device (e.g., BLACKBERRY™, laptop, pager, etc.). For example, in one embodiment, the "real-time" report can include such information as the differential in a particular power parameter (i.e., current, voltage, etc.) between the real-time measurements and the virtual output data.

Figure 7:
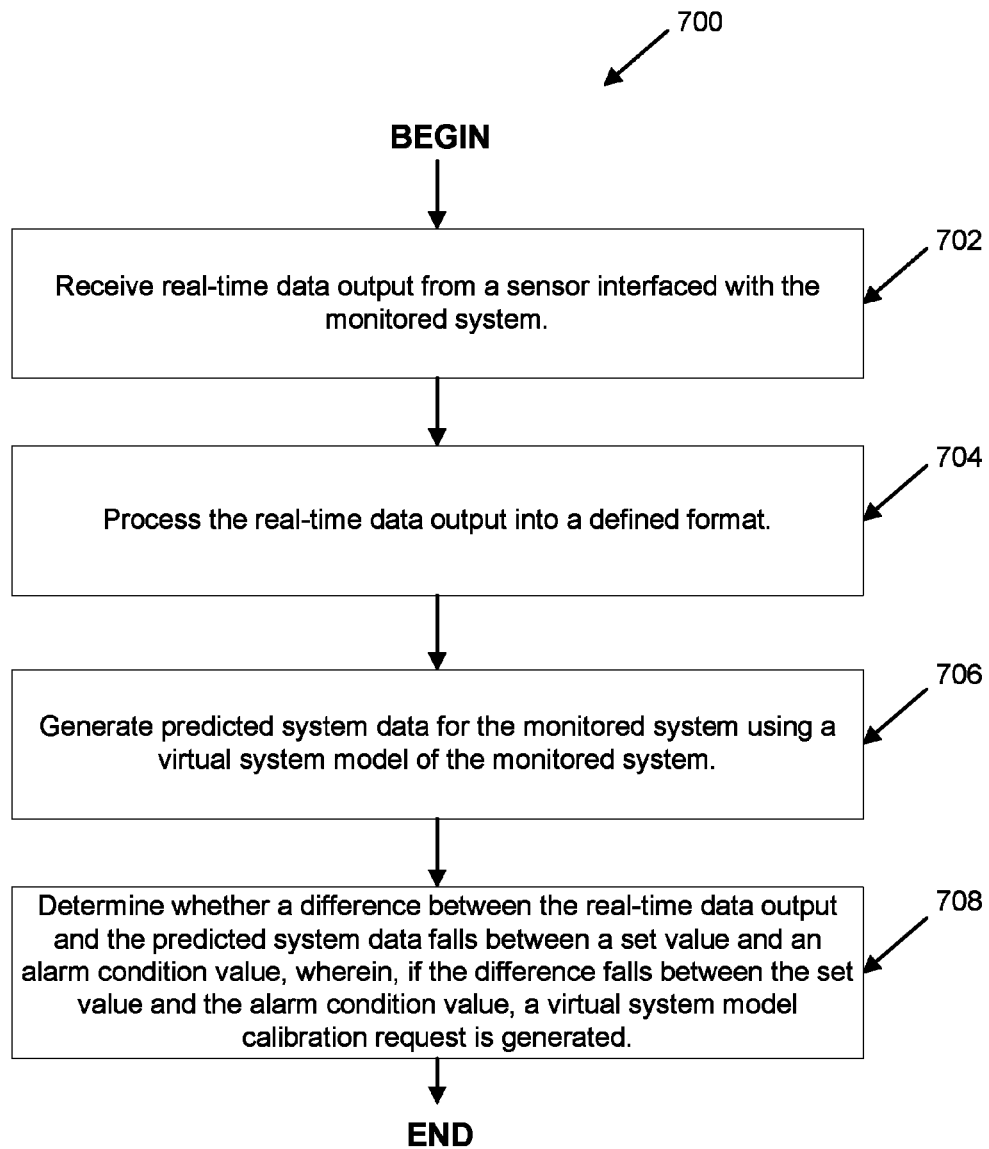
FIG. 7 is an illustration of a flowchart describing a method for managing real-time updates to a virtual system model of a monitored system, in accordance with one embodiment.

FIG. 7 is an illustration of a flowchart describing a method for managing real-time updates to a virtual system model of a monitored system, in accordance with one embodiment. Method 700 begins with operation 702 where real-time data output from a sensor interfaced with the monitored system is received. The sensor is configured to capture output data at split-second intervals to effectuate "real time" data capture. For example, in one embodiment, the sensor is configured to generate hundreds of thousands of data readings per second. It should be appreciated, however, that the number of data output readings taken by the sensor may be set to any value as long as the operational limits of the sensor and the data processing capabilities of the data acquisition hub are not exceeded.

Method 700 moves to operation 704 where the real-time data is processed into a defined format. This would be a format that can be utilized by the analytics server to analyze or compare the data with the simulated data output from the virtual system model. In one embodiment, the data is converted from an analog signal to a digital signal. In another embodiment, the data is converted from a digital signal to an analog signal. It should be understood, however, that the real-time data may be processed into any defined format as long as the analytics engine can utilize the resulting data in a comparison with simulated output data from a virtual system model of the monitored system.

Method 700 continues on to operation 706 where the predicted (i.e., simulated) data for the monitored system is generated using a virtual system model of the monitored system. As discussed above, a virtual system modeling engine utilizes dynamic control logic stored in the virtual system model to generate the predicted output data. The predicted data is supposed to be representative of data that should actually be generated and output from the monitored system.

Method 700 proceeds to operation 708 where a determination is made as to whether the difference between the real-time data output and the predicted system data falls between a set value and an alarm condition value, where if the difference falls between the set value and the alarm condition value a virtual system model calibration and a response can be generated. That is, if the comparison indicates that the differential between the "real-time" sensor output value and the corresponding "virtual" model data output value exceeds a Defined Difference Tolerance (DDT) value (i.e., the "real-time" output values of the sensor output do not indicate an alarm condition) but below an alarm condition (i.e., alarm threshold value), a response can be generated by the analytics engine. In one embodiment, if the differential exceeds, the alarm condition, an alarm or notification message is generated by the analytics engine 118. In another embodiment, if the differential is below the DTT value, the analytics engine does nothing and continues to monitor the "real-time" data and "virtual" data. Generally speaking, the comparison of the set value and alarm condition is indicative of the functionality of one or more components of the monitored system.

Figure 8:
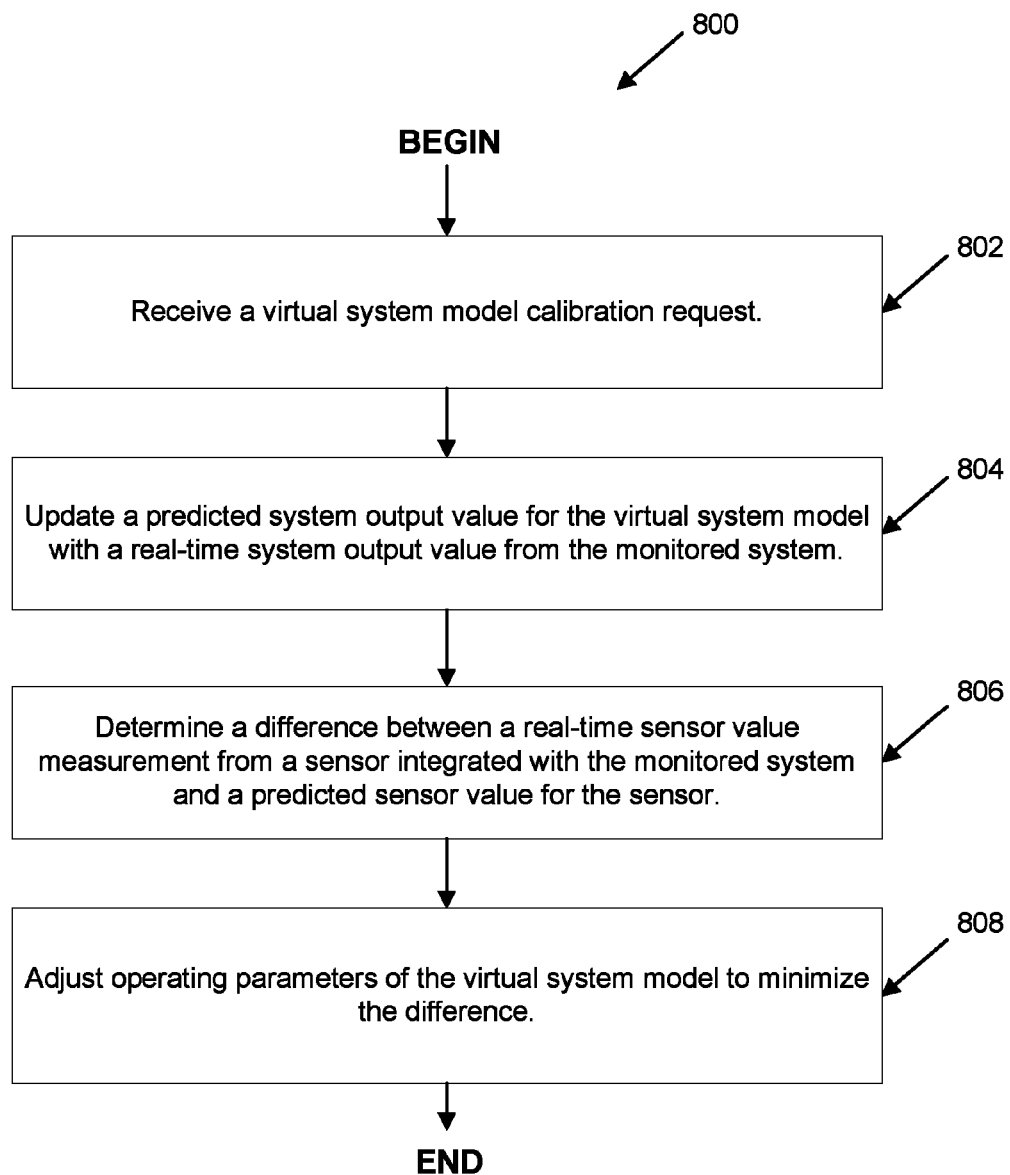
FIG. 8 is an illustration of a flowchart describing a method for synchronizing real-time system data with a virtual system model of a monitored system, in accordance with one embodiment.

FIG. 8 is an illustration of a flowchart describing a method for synchronizing real-time system data with a virtual system model of a monitored system, in accordance with one embodiment. Method 800 begins with operation 802 where a virtual system model calibration request is received. A virtual model calibration request can be generated by an analytics engine whenever the difference between the real-time data output and the predicted system data falls between a set value and an alarm condition value.

Method 800 proceeds to operation 804 where the predicted system output value for the virtual system model is updated with a real-time output value for the monitored system. For example, if sensors interfaced with the monitored system outputs a real-time current value of A, then the predicted system output value for the virtual system model is adjusted to reflect a predicted current value of A.

Method 800 moves on to operation 806 where a difference between the real-time sensor value measurement from a sensor integrated with the monitored system and a predicted sensor value for the sensor is determined. As discussed above, the analytics engine is configured to receive "real-time" data from sensors interfaced with the monitored system via the data acquisition hub (or, alternatively directly from the sensors) and "virtual" data from the virtual system modeling engine simulating the data output from a virtual system model of the monitored system. In one embodiment, the values are in units of electrical power output (i.e., current or voltage) from an electrical power generation or transmission system. It should be appreciated, however, that the values can essentially be any unit type as long as the sensors can be configured to output data in those units or the analytics engine can convert the output data received from the sensors into the desired unit type before performing the comparison.

Method 800 continues on to operation 808 where the operating parameters of the virtual system model are adjusted to minimize the difference. This means that the logic parameters of the virtual system model that a virtual system modeling engine uses to simulate the data output from actual sensors interfaced with the monitored system are adjusted so that the difference between the real-time data output and the simulated data output is minimized. Correspondingly, this operation will update and adjust any virtual system model output parameters that are functions of the virtual system model sensor values. For example, in a power distribution environment, output parameters of power load or demand factor might be a function of multiple sensor data values. The operating parameters of the virtual system model that mimic the operation of the sensor will be adjusted to reflect the real-time data received from those sensors. In one embodiment, authorization from a system administrator is requested prior to the operating parameters of the virtual system model being adjusted. This is to ensure that the system administrator is aware of the changes that are being made to the virtual system model. In one embodiment, after the completion of all the various calibration operations, a report is generated to provide a summary of all the adjustments that have been made to the virtual system model.

As described above, virtual system modeling engine 124 can be configured to model various aspects of the system to produce predicted values for the operation of various components within monitored system 102. These predicted values can be compared to actual values being received via data acquisition hub 112. If the differences are greater than a certain threshold, e.g., the DTT, but not in an alarm condition, then a calibration instruction can be generated. The calibration instruction can cause a calibration engine 134 to update the virtual model being used by system modeling engine 124 to reflect the new operating information.

It will be understood that as monitored system 102 ages, or more specifically the components comprising monitored system 102 age, then the operating parameters, e.g., currents and voltages associated with those components will also change. Thus, the process of calibrating the virtual model based on the actual operating information provides a mechanism by which the virtual model can be aged along with the monitored system 102 so that the comparisons being generated by analytics engine 118 are more meaningful.

Figure 9:
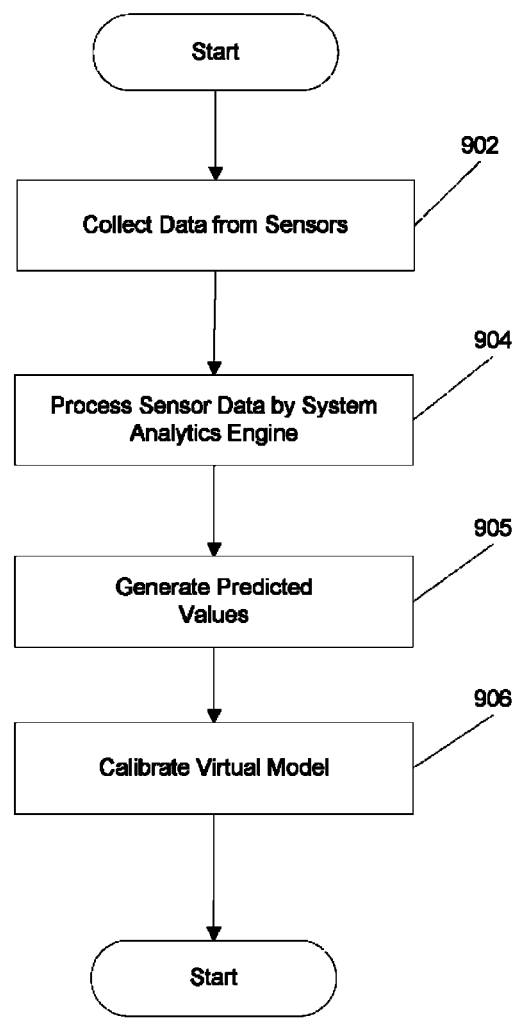
FIG. 9 is a flow chart illustrating an example method for updating the virtual model, in accordance with one embodiment.

At a high level, this process can be illustrated with the aid of FIG. 9, which is a flow chart illustrating an example method for updating the virtual model in accordance with one embodiment. In step 902, data is collected from, e.g., sensors 104, 106, and 108. For example, the sensors can be configured to monitor protective devices within an electrical distribution system to determine and monitor the ability of the protective devices to withstand faults, which is describe in more detail below.

In step 904, the data from the various sensors can be processed by analytics engine 118 in order to evaluate various parameters related to monitored system 102. In step 905, simulation engine 124 can be configured to generate predicted values for monitored system 102 using a virtual model of the system that can be compared to the parameters generated by analytics engine 118 in step 904. If there are differences between the actual values and the predicted values, then the virtual model can be updated to ensure that the virtual model ages with the actual system 102.

It should be noted that as the monitored system 102 ages, various components can be repaired, replaced, or upgraded, which can also create differences between the simulated and actual data that is not an alarm condition. Such activity can also lead to calibrations of the virtual model to ensure that the virtual model produces relevant predicted values. Thus, not only can the virtual model be updated to reflect aging of monitored system 102, but it can also be updated to reflect retrofits, repairs, etc.

As noted above, in certain embodiments, a logical model of a facilities electrical system, a data acquisition system (data acquisition hub 112), and power system simulation engines (modeling engine 124) can be integrated with a logic and methods based approach to the adjustment of key database parameters within a virtual model of the electrical system to evaluate the ability of protective devices within the electrical distribution system to withstand faults and also effectively "age" the virtual system with the actual system.

Only through such a process can predictions on the withstand abilities of protective devices, and the status, security and health of an electrical system be accurately calculated. Accuracy is important as the predictions can be used to arrive at actionable, mission critical or business critical conclusions that may lead to the re-alignment of the electrical distribution system for optimized performance or security.

Figure 10:
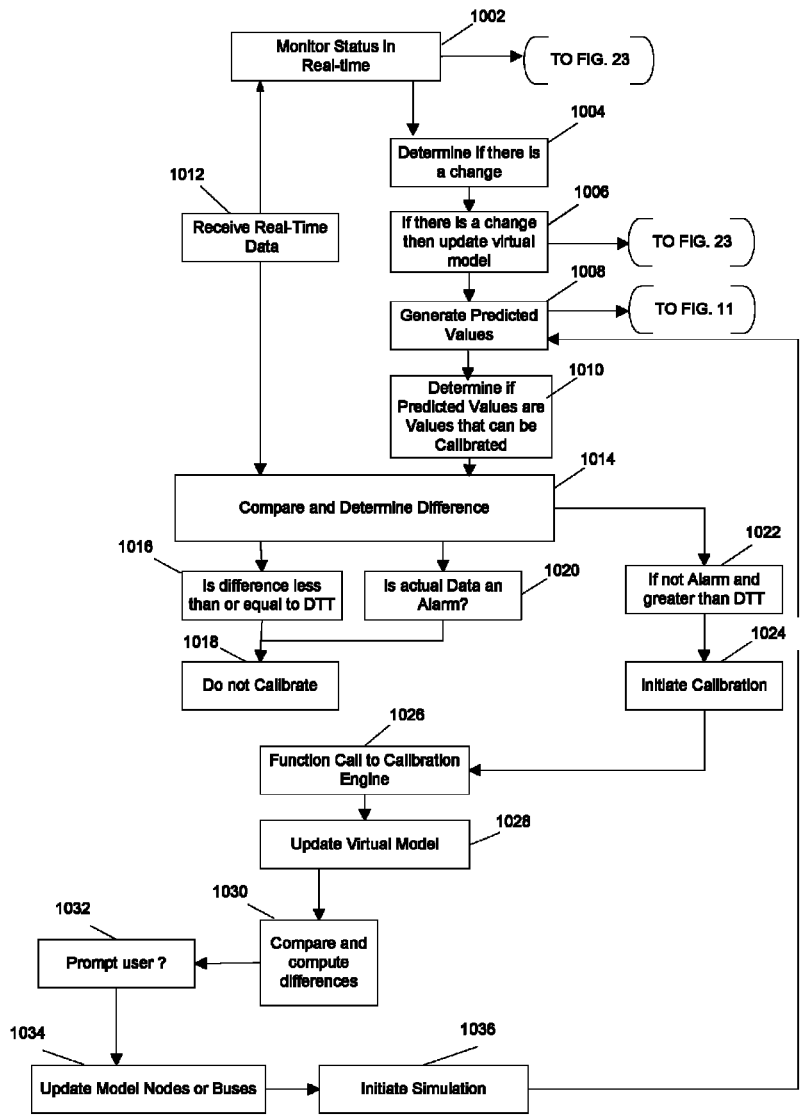
FIG. 10 is a diagram illustrating an example process for monitoring the status of protective devices in a monitored system and updating a virtual model based on monitored data, in accordance with one embodiment.
Figure 11:
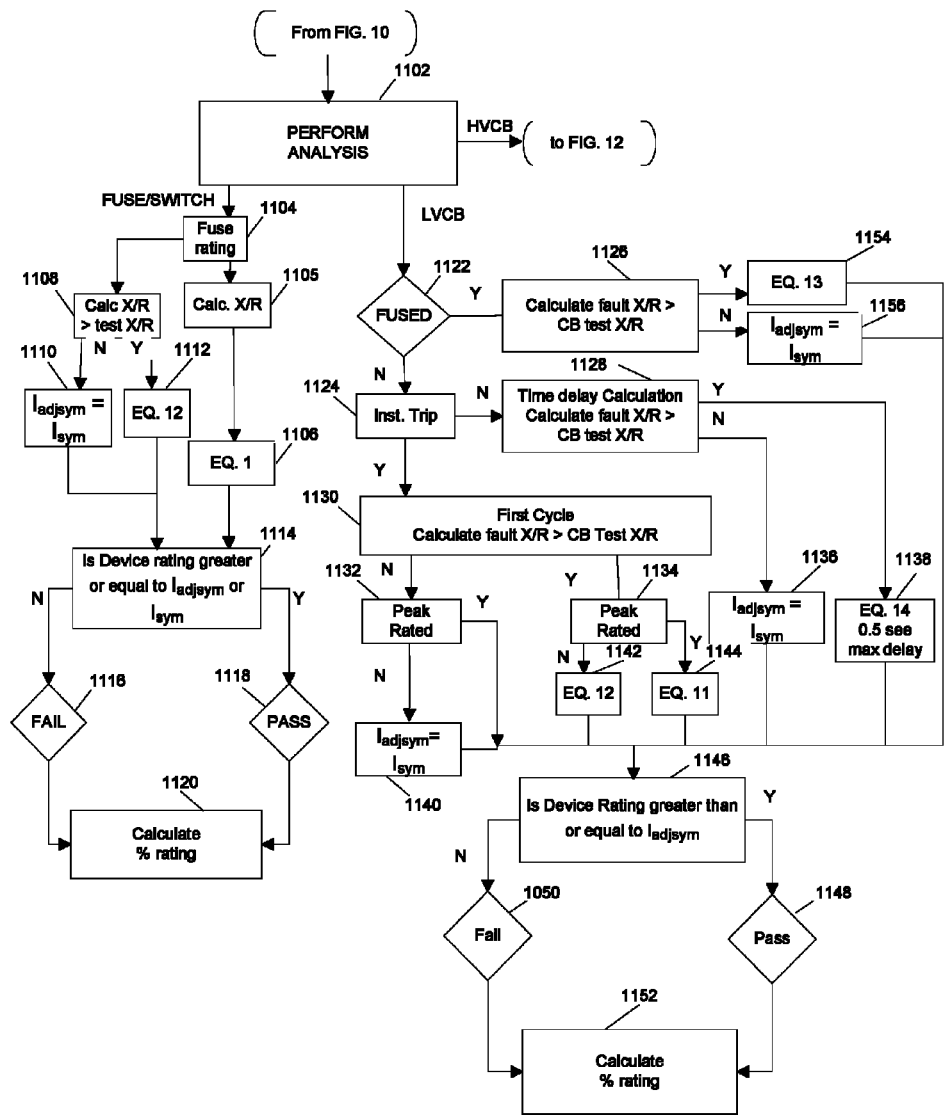
FIG. 11 is a flowchart illustrating an example process for determining the protective capabilities of the protective devices being monitored, in accordance with one embodiment.
Figure 12:
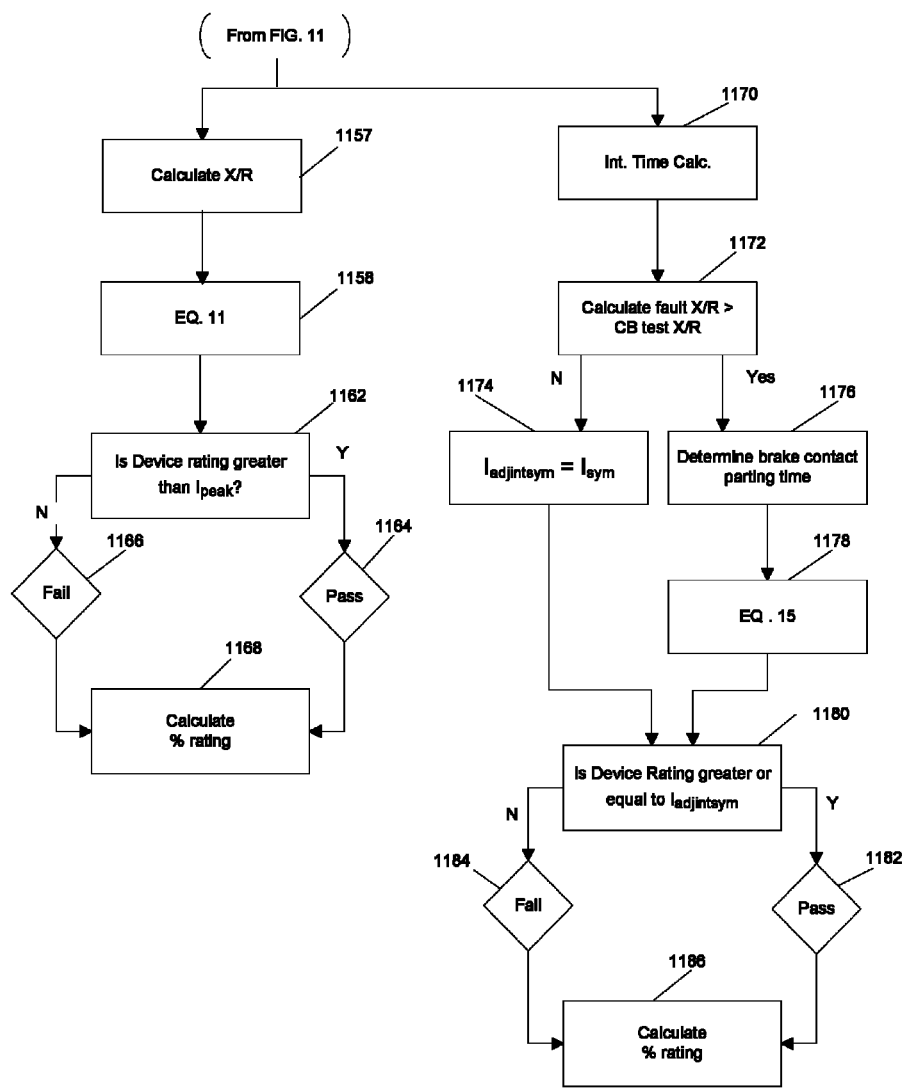
FIG. 12 is a diagram illustrating an example process for determining the protective capabilities of a High Voltage Circuit Breaker (HVCB), in accordance with one embodiment.

FIGS. 10-12 are flow charts presenting logical flows for determining the ability of protective devices within an electrical distribution system to withstand faults and also effectively "age" the virtual system with the actual system in accordance with one embodiment. FIG. 10 is a diagram illustrating an example process for monitoring the status of protective devices in a monitored system 102 and updating a virtual model based on monitored data. First, in step 1002, the status of the protective devices can be monitored in real time. As mentioned, protective devices can include fuses, switches, relays, and circuit breakers. Accordingly, the status of the fuses/switches, relays, and/or circuit breakers, e.g., the open/close status, source and load status, and on or off status, can be monitored in step 1002. It can be determined, in step 1004, if there is any change in the status of the monitored devices. If there is a change, then in step 1006, the virtual model can be updated to reflect the status change, i.e., the corresponding virtual components data can be updated to reflect the actual status of the various protective devices.

In step 1008, predicted values for the various components of monitored system 102 can be generated. But it should be noted that these values are based on the current, real-time status of the monitored system. Real time sensor data can be received in step 1012. This real time data can be used to monitor the status in step 1002 and it can also be compared with the predicted values in step 1014. As noted above, the difference between the predicted values and the real time data can also be determined in step 1014.

Accordingly, meaningful predicted values based on the actual condition of monitored system 102 can be generated in steps 1004 to 1010. These predicted values can then be used to determine if further action should be taken based on the comparison of step 1014. For example, if it is determined in step 1016 that the difference between the predicted values and the real time sensor data is less than or equal to a certain threshold, e.g., DTT, then no action can be taken e.g., an instruction not to perform calibration can be issued in step 1018. Alternatively, if it is determined in step 1020 that the real time data is actually indicative of an alarm situation, e.g., is above an alarm threshold, then a do not calibrate instruction can be generated in step 1018 and an alarm can be generated as described above. If the real time sensor data is not indicative of an alarm condition, and the difference between the real time sensor data and the predicted values is greater than the threshold, as determined in step 1022, then an initiate calibration command can be generated in step 1024.

If an initiate calibration command is issued in step 1024, then a function call to calibration engine 134 can be generated in step 1026. The function call will cause calibration engine 134 to update the virtual model in step 1028 based on the real time sensor data. A comparison between the real time data and predicted data can then be generated in step 1030 and the differences between the two computed. In step 1032, a user can be prompted as to whether or not the virtual model should in fact be updated. In other embodiments, the update can be automatic, and step 1032 can be skipped. In step 1034, the virtual model could be updated. For example, the virtual model loads, buses, demand factor, and/or percent running information can be updated based on the information obtained in step 1030. An initiate simulation instruction can then be generated in step 1036, which can cause new predicted values to be generated based on the update of virtual model.

In this manner, the predicted values generated in step 1008 are not only updated to reflect the actual operational status of monitored system 102, but they are also updated to reflect natural changes in monitored system 102 such as aging. Accordingly, realistic predicted values can be generated in step 1008.

FIG. 11 is a flowchart illustrating an example process for determining the protective capabilities of the protective devices being monitored in step 1002. Depending on the embodiment, the protective devices can be evaluated in terms of the International Electrotechnical Commission (IEC) standards or in accordance with the United States or American National Standards Institute (ANSI) standards. It will be understood, that the process described in relation to FIG. 11 is not dependent on a particular standard being used.

First, in step 1102, a short circuit analysis can be performed for the protective device. Again, the protective device can be any one of a variety of protective device types. For example, the protective device can be a fuse or a switch, or some type of circuit breaker. It will be understood that there are various types of circuit breakers including Low Voltage Circuit Breakers (LVCBs), High Voltage Circuit Breakers (HVCBs), Mid Voltage Circuit Breakers (MVCBs), Miniature Circuit Breakers (MCBs), Molded Case Circuit Breakers (MCCBs), Vacuum Circuit Breakers, and Air Circuit Breakers, to name just a few. Any one of these various types of protective devices can be monitored and evaluated using the processes illustrated with respect to FIGS. 10-12.

For example, for LVCBs, or MCCBs, the short circuit current, symmetric ($I_{sym}$) or asymmetric ($I_{asym}$), and/or the peak current ($I_{peak}$) can be determined in step 1102. For, e.g., LVCBs that are not instantaneous trip circuit breakers, the short circuit current at a delayed time ($I_{symdelay}$) can be determined. For HVCBs, a first cycle short circuit current ($I_{sym}$) and/or $I_{peak}$ can be determined in step 1102. For fuses or switches, the short circuit current, symmetric or asymmetric, can be determined in step 1102. And for MVCBs the short circuit current interrupting time can be calculated. These are just some examples of the types of short circuit analysis that can be performed in Step 1102 depending on the type of protective device being analyzed.

Once the short circuit analysis is performed in step 1102, various steps can be carried out in order to determine the bracing capability of the protective device. For example, if the protective device is a fuse or switch, then the steps on the left hand side of FIG. 11 can be carried out. In this case, the fuse rating can first be determined in step 1104. In this case, the fuse rating can be the current rating for the fuse. For certain fuses, the X/R can be calculated in step 1105 and the asymmetric short circuit current ($I_{asym}$) for the fuse can be determined in step 1106 using equation 1.

$$I_{ASYM} = I_{SYM}\sqrt{1 + 2e^{-2p/(X/R)}} \quad \text{Eq 1}$$

In other implementations, the inductants/reactants (X/R) ratio can be calculated in step 1108 and compared to a fuse test X/R to determine if the calculated X/R is greater than the fuse test X/R. The calculated X/R can be determined using the predicted values provided in step 1008. Various standard tests X/R values can be used for the fuse test X/R values in step 1108. For example, standard test X/R values for a LVCB can be as follows:

PCB, ICCB=6.59
MCCB, ICCB rated <=10,000 A=1.73
MCCB, ICCB rated 10,001–20,000A=3.18
MCCB, ICCB rated>20,000 A=4.9

If the calculated X/R is greater than the fuse test X/R, then in step 1112, equation 12 can be used to calculate an adjusted symmetrical short circuit current ($I_{adjsym}$).

$$I_{ADJSYM} = I_{SYM}\left\{\frac{\sqrt{1 + 2e^{-2p/(CALC\ X/R)}}}{\sqrt{1 + 2e^{-2p/(TEST\ X/R)}}}\right\} \quad \text{Eq 12}$$

If the calculated X/R is not greater than the fuse test X/R then $I_{adjsym}$ can be set equal to $I_{sym}$ in step 1110. In step 1114, it can then be determined if the fuse rating (step 1104) is greater than or equal to $I_{adjsym}$ or $I_{asym}$. If it is, then it can determine in step 1118 that the protected device has passed and the percent rating can be calculated in step 1120 as follows:

$$\% \text{ rating} = \frac{I_{ADJSYM}}{\text{Device rating}}$$

or $$\% \text{ rating} = \frac{I_{ASYM}}{\text{Device rating}}$$

If it is determined in step 1114 that the device rating is not greater than or equal to $I_{adjsym}$, then it can be determined that the device as failed in step 1116. The percent rating can still be calculating in step 1120.

For LVCBs, it can first be determined whether they are fused in step 1122. If it is determined that the LVCB is not fused, then in step 1124 can be determined if the LVCB is an instantaneous trip LVCB. If it is determined that the LVCB is an instantaneous trip LVCB, then in step 1130 the first cycle fault X/R can be calculated and compared to a circuit breaker test X/R (see example values above) to determine if the fault X/R is greater than the circuit breaker test X/R. If the fault X/R is not greater than the circuit breaker test X/R, then in step 1132 it can be determined if the LVCB is peak rated. If it is peak rated, then $I_{peak}$ can be used in step 1146 below. If it is determined that the LVCB is not peak rated in step 1132, then $I_{adjsym}$ can be set equal to $I_{sym}$ in step 1140. In step 1146, it can be determined if the device rating is greater or equal to $I_{adjsym}$, or to $I_{peak}$ as appropriate, for the LVCB.

If it is determined that the device rating is greater than or equal to $I_{adjsym}$, then it can be determined that the LVCB has passed in step 1148. The percent rating can then be determined using the equations for $I_{adjsym}$ defined above (step 1120) in step 1152. If it is determined that the device rating is not greater than or equal to $I_{adjsym}$, then it can be determined that the device has failed in step 1150. The percent rating can still be calculated in step 1152.

If the calculated fault X/R is greater than the circuit breaker test X/R as determined in step 1130, then it can be determined if the LVCB is peak rated in step 1134. If the LVCB is not peak rated, then the $I_{adjsym}$ can be determined using equation 12. If the LVCB is peak rated, then $I_{peak}$ can be determined using equation 11.

$$I_{PEAK} = \sqrt{2}I_{SYM}\{1.02 + 0.98e^{-3/(X/R)}\} \quad \text{Eq 11}$$

It can then be determined if the device rating is greater than or equal to $I_{adjsym}$ or $I_{peak}$ as appropriate. The pass/fail determinations can then be made in steps 1148 and 1150 respectively, and the percent rating can be calculated in step 1152.

$$\% \text{ rating} = \frac{I_{ADJSYM}}{\text{Device rating}}$$

or $$\% \text{ rating} = \frac{I_{PEAK}}{\text{Device rating}}$$

If the LVCB is not an instantaneous trip LVCB as determined in step 1124, then a time delay calculation can be performed at step 1128 followed by calculation of the fault X/R and a determination of whether the fault X/R is greater than the circuit breaker test X/R. If it is not, then Iadjsym can be set equal to Isym in step 1136. If the calculated fault at X/R is greater than the circuit breaker test X/R, then Iadjsymdelay can be calculated in step 1138 using the following equation with, e.g., a 0.5 second maximum delay:

$$I_{ADJSYM\ DELAY} = I_{SYM\ DELAY}\left\{\frac{\sqrt{1 + 2e^{-60p/(CALC\ X/R)}}}{\sqrt{1 + 2e^{-60p/(TEST\ X/R)}}}\right\} \quad \text{Eq 14}$$

It can then be determined if the device rating is greater than or equal to $I_{adjsym}$ or $I_{adjsymdelay}$. The pass/fail determinations can then be made in steps 1148 and 1150, respectively and the percent rating can be calculated in step 1152.

If it is determined that the LVCB is fused in step 1122, then the fault X/R can be calculated in step 1126 and compared to the circuit breaker test X/R in order to determine if the calculated fault X/R is greater than the circuit breaker test X/R. If it is greater, then $I_{adjsym}$ can be calculated in step 1154 using the following equation:

$$I_{ADJSYM} = I_{SYM} \left\{ \frac{1.02 + 0.98 e^{-3/(CALC\ X/R)}}{1.02 + 0.98 e^{-3/(TEST\ X/R)}} \right\} \qquad \text{Eq 13}$$

If the calculated fault X/R is not greater than the circuit breaker test X/R, then $I_{adjsym}$ can be set equal to $I_{sym}$ in step 1156. It can then be determined if the device rating is greater than or equal to $I_{adjsym}$ in step 1146. The pass/fail determinations can then be carried out in steps 1148 and 1150 respectively, and the percent rating can be determined in step 11152.

FIG. 12 is a diagram illustrating an example process for determining the protective capabilities of a HVCB. In certain embodiments, X/R can be calculated in step 1157 and a peak current ($I_{peak}$) can be determined using equation 11 in step 1158. In step 1162, it can be determined whether the HVCB's rating is greater than or equal to $I_{peak}$ as determined in step 1158. If the device rating is greater than or equal to $I_{peak}$, then the device has passed in step 1164. Otherwise, the device fails in step 1166. In either case, the percent rating can be determined in step 1168 using the following:

$$\% \text{ rating} = \frac{I_{PEAK}}{\text{Device rating}}$$

In other embodiments, an interrupting time calculation can be made in step 1170. In such embodiments, a fault X/R can be calculated and then can be determined if the fault X/R is greater than or equal to a circuit breaker test X/R in step 1172. For example, the following circuit breaker test X/R can be used;
50 Hz Test X/R=13.7
60 Hz Test X/R=16.7
(DC Time Contant=0.45 Ms)
If the fault X/R is not greater than the circuit breaker test X/R then $I_{adjintsym}$ can be set equal to $I_{sym}$ in step 1174. If the calculated fault X/R is greater than the circuit breaker test X/R, then contact parting time for the circuit breaker can be determined in step 1176 and equation 15 can then be used to determine $I_{adjintsym}$ in step 1178.

$$I_{ADJINT\ SYM} = I_{INT\ SYM} \left\{ \frac{\sqrt{1 + 2e^{-4pf*t/(CALC\ X/R)}}}{\sqrt{1 + 2e^{-4pf*t/(TEST\ X/R)}}} \right\} \qquad \text{Eq 15}$$

In step 1180, it can be determined whether the device rating is greater than or equal to $I_{adjintsym}$. The pass/fail determinations can then be made in steps 1182 and 1184 respectively and the percent rating can be calculated in step 1186 using the following:

$$\% \text{ rating} = \frac{I_{ADJINT\ SYM}}{\text{Device rating}}$$

Figure 13:
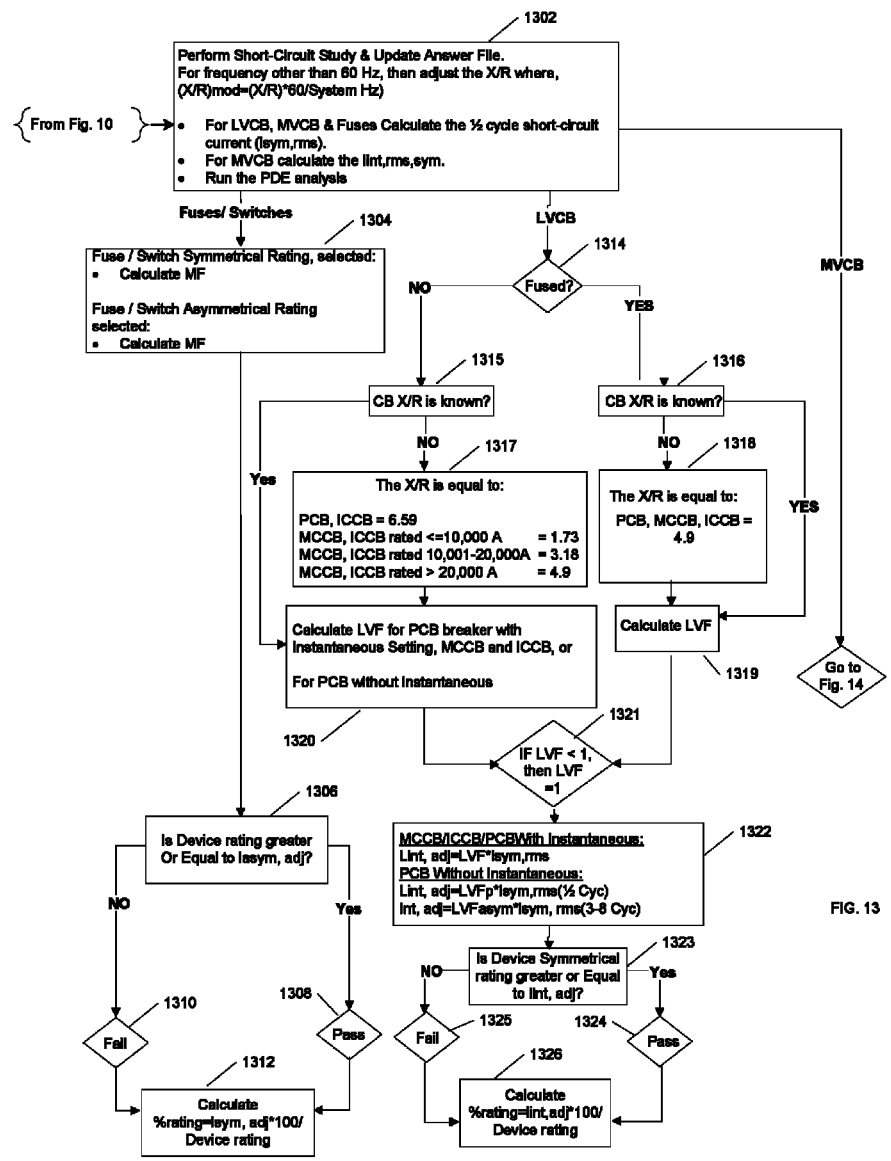
FIG. 13 is a flowchart illustrating an example process for determining the protective capabilities of the protective devices being monitored, in accordance with another embodiment.

FIG. 13 is a flowchart illustrating an example process for determining the protective capabilities of the protective devices being monitored in step 1002 in accordance with another embodiment. The process can start with a short circuit analysis in step 1302. For systems operating at a frequency other than 60 hz, the protective device X/R can be modified as follows:

(X/R)mod=(X/R)*60H/(system Hz).

For fuses/switches, a selection can be made, as appropriate, between use of the symmetrical rating or asymmetrical rating for the device. The Multiplying Factor (MF) for the device can then be calculated in step 1304. The MF can then be used to determine $I_{adjasym}$ or $I_{adjsym}$. In step 1306, it can be determined if the device rating is greater than or equal to $I_{adjasym}$ or $I_{adjsym}$. Based on this determination, it can be determined whether the device passed or failed in steps 1308 and 1310 respectively, and the percent rating can be determined in step 1312 using the following:

% rating=$I_{adjasym}$*100/device rating; or

% rating=$I_{adjsym}$*100/device rating.

For LVCBs, it can first be determined whether the device is fused in step 1314. If the device is not fused, then in step 1315 it can be determined whether the X/R is known for the device. If it is known, then the LVF can be calculated for the device in step 1320. It should be noted that the LVF can vary depending on whether the LVCB is an instantaneous trip device or not. If the X/R is not known, then it can be determined in step 1317, e.g., using the following:
PCB, ICCB=6.59
MCCB, ICCB rated<=10,000 A=1.73
MCCB, ICCB rated 10,001–20,000 A=3.18
MCCB, ICCB rated>20,000 A=4.9
If the device is fused, then in step 1316 it can again be determined whether the X/R is known. If it is known, then the LVF can be calculated in step 1319. If it is not known, then the X/R can be set equal to, e.g., 4.9.

In step 1321, it can be determined if the LVF is less than 1 and if it is, then the LVF can be set equal to 1. In step 1322 $I_{intadj}$ can be determined using the following:
MCCB/ICCB/PCB With Instantaneous:
Iint,adj=LVF*Isym,rms
PCB Without Instantaneous:
Iint,adj=LVFp*Isym,rms(½ Cyc)
Int,adj=LVFasym*Isym,rms(3-8 Cyc)
In step 1323, it can be determined whether the device's symmetrical rating is greater than or equal to $I_{intadj}$, and it can be determined based on this evaluation whether the device passed or failed in steps 1324 and 1325 respectively. The percent rating can then be determined in step 1326 using the following:

% rating=$I_{intadj}$*100/device rating.

Figure 14:
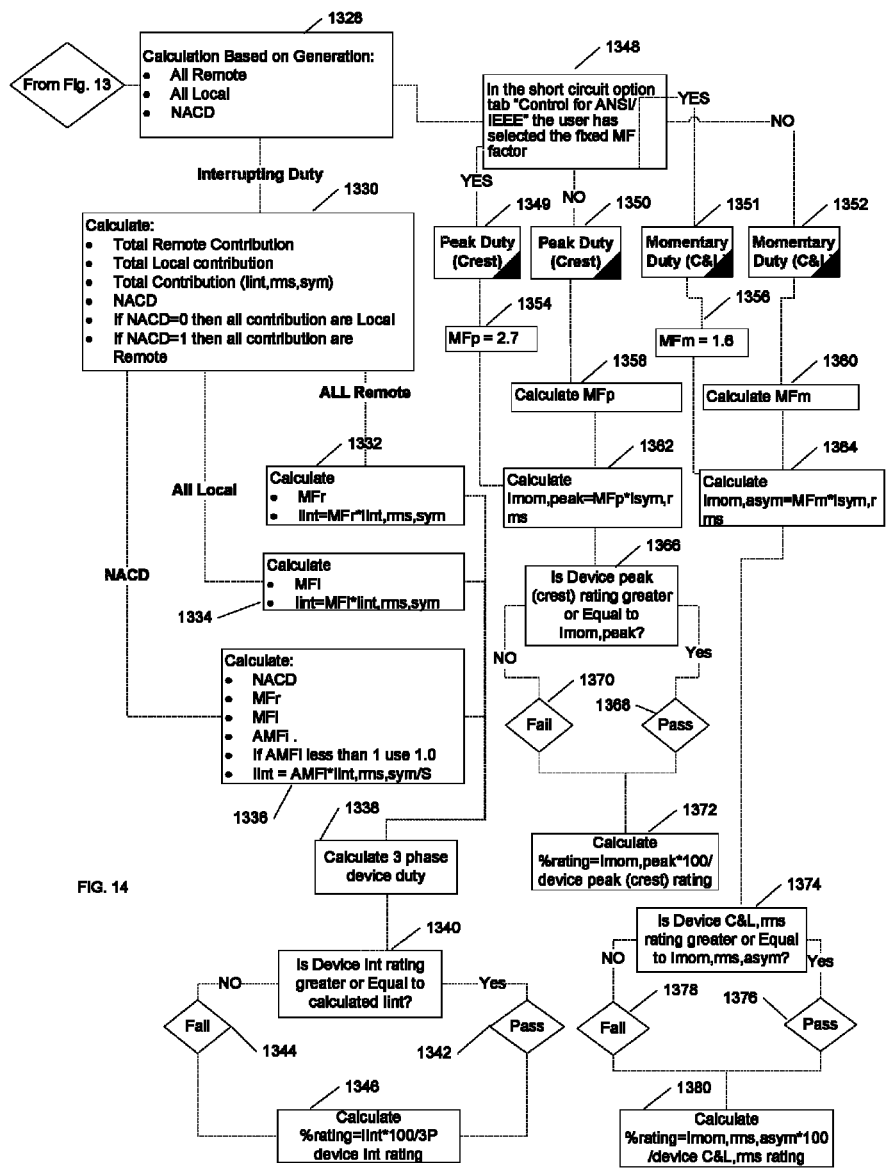
FIG. 14 is a diagram illustrating a process for evaluating the withstand capabilities of a MVCB, in accordance with one embodiment

FIG. 14 is a diagram illustrating a process for evaluating the withstand capabilities of a MVCB in accordance with one embodiment. In step 1328, a determination can be made as to whether the following calculations will be based on all remote inputs, all local inputs or on a No AC Decay (NACD) ratio. For certain implementations, a calculation can then be made of the total remote contribution, total local contribution, total contribution ($I_{intrmssym}$), and NACD. If the calculated NACD is equal to zero, then it can be determined that all contributions are local. If NACD is equal to 1, then it can be determined that all contributions are remote.

If all the contributions are remote, then in step 1332 the remote MF (MFr) can be calculated and $I_{int}$ can be calculated using the following:

$I_{int}$=MFr*$I_{intrmssym}$

If all the inputs are local, then MFl can be calculated and $I_{int}$ can be calculated using the following:

$$I_{int}=MFl*I_{intrmssym}$$

If the contributions are from NACD, then the NACD, MFr, MFl, and AMFl can be calculated. If AMFl is less than 1, then AMFl can be set equal to 1. $I_{int}$ can then be calculated using the following:

$$I_{int}=AMFl*I_{intrmssym}/S$$

In step 1338, the 3-phase device duty cycle can be calculated and then it can be determined in step 1340, whether the device rating is greater than or equal to $I_{int}$. Whether the device passed or failed can then be determined in steps 1342 and 1344, respectively. The percent rating can be determined in step 1346 using the following:

$$\% \text{ rating}=I_{int}*100/3p \text{ device rating}.$$

In other embodiments, it can be determined, in step 1348, whether the user has selected a fixed MF. If so, then in certain embodiments the peak duty (crest) can be determined in step 1349 and MFp can be set equal to 2.7 in step 1354. If a fixed MF has not been selected, then the peak duty (crest) can be calculated in step 1350 and MFp can be calculated in step 1358. In step 1362, the MFp can be used to calculate the following:

$$I_{mompeak}=MFp*I_{symrms}$$

In step 1366, it can be determined if the device peak rating (crest) is greater than or equal to $I_{mompeak}$. It can then be determined whether the device passed or failed in steps 1368 and 1370 respectively, and the percent rating can be calculated as follows:

$$\% \text{ rating}=I_{mompeak}*100/\text{device peak(crest)rating}.$$

In other embodiments, if a fixed MF is selected, then a momentary duty cycle (C&L) can be determined in step 1351 and MFm can be set equal to, e.g., 1.6. If a fixed MF has not been selected, then in step 1352 MFm can be calculated. MFm can then be used to determine the following:

$$I_{momsym}=MFm*I_{symrms}$$

It can then be determined in step 1374 whether the device C&L, rms rating is greater than or equal to $I_{momsym}$. Whether the device passed or failed can then be determined in steps 1376 and 1378 respectively, and the percent rating can be calculated as follows:

$$\% \text{ rating}=I_{momasym}*100/\text{device C&L,rms rating}.$$

Thus, the above methods provide a mean to determine the withstand capability of various protective devices, under various conditions and using various standards, using an aged, up to date virtual model of the system being monitored.

The influx of massive sensory data, e.g., provided via sensors 104, 106, and 108, intelligent filtration of this dense stream of data into manageable and easily understandable knowledge. For example, as mentioned, it is important to be able to assess the real-time ability of the power system to provide sufficient generation to satisfy the system load requirements and to move the generated energy through the system to the load points. Conventional systems do not make use of an on-line, real-time system snap shot captured by a real-time data acquisition platform to perform real time system availability evaluation.

Figure 15:
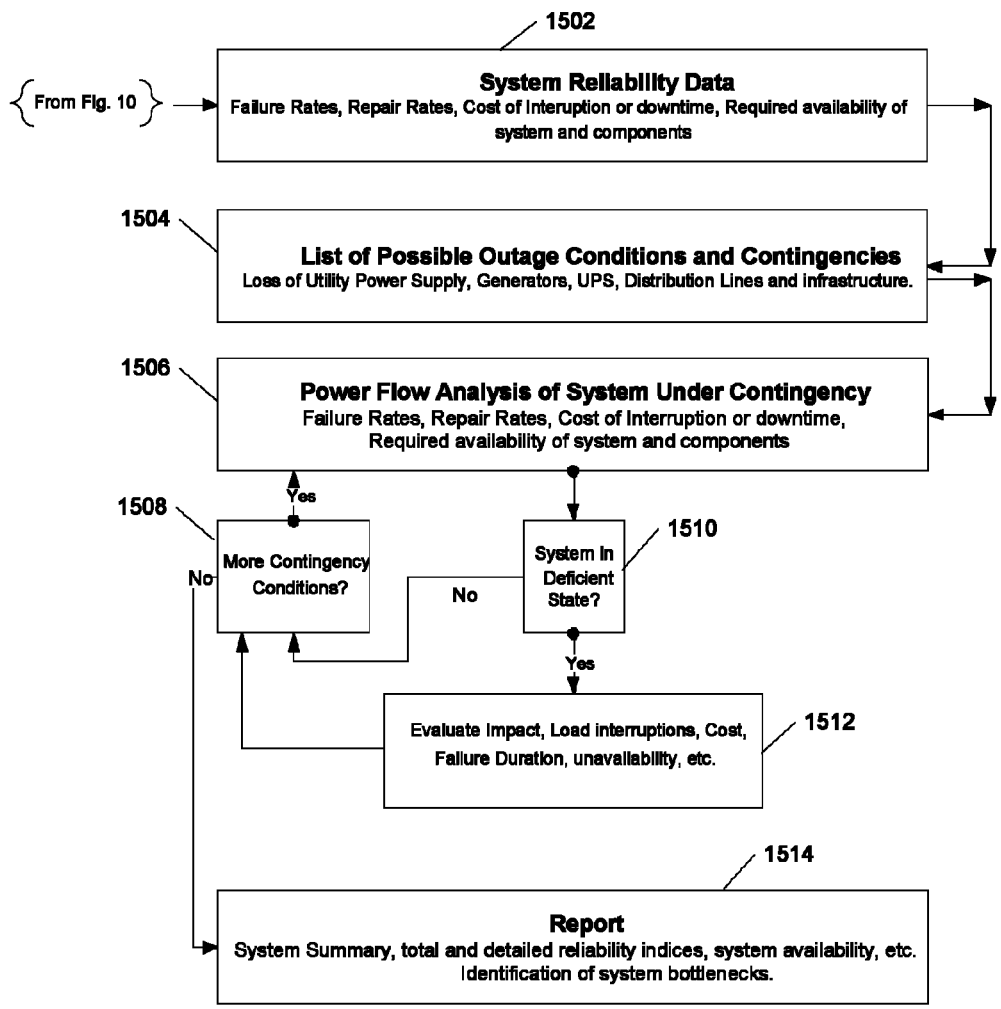
FIG. 15 is a flow chart illustrating an example process for analyzing the reliability of an electrical power distribution and transmission system, in accordance with one embodiment.

FIG. 15 is a flow chart illustrating an example process for analyzing the reliability of an electrical power distribution and transmission system in accordance with one embodiment. First, in step 1502, reliability data can be calculated and/or determined. The inputs used in step 1502 can comprise power flow data, e.g., network connectivity, loads, generations, cables/transformer impedances, etc., which can be obtained from the predicted values generated in step 1008, reliability data associated with each power system component, lists of contingencies to be considered, which can vary by implementation including by region, site, etc., customer damage (load interruptions) costs, which can also vary by implementation, and load duration curve information. Other inputs can include failure rates, repair rates, and required availability of the system and of the various components.

In step 1504 a list of possible outage conditions and contingencies can be evaluated including loss of utility power supply, generators, UPS, and/or distribution lines and infrastructure. In step 1506, a power flow analysis for monitored system 102 under the various contingencies can be performed. This analysis can include the resulting failure rates, repair rates, cost of interruption or downtime versus the required system availability, etc. In step 1510, it can be determined if the system is operating in a deficient state when confronted with a specific contingency. If it is, then is step 1512, the impact on the system, load interruptions, costs, failure duration, system unavailability, etc. can all be evaluated.

After the evaluation of step 1512, or if it is determined that the system is not in a deficient state in step 1510, then it can be determined if further contingencies need to be evaluated. If so, then the process can revert to step 1506 and further contingencies can be evaluated. If no more contingencies are to be evaluated, then a report can be generated in step 1514. The report can include a system summary, total and detailed reliability indices, system availability, etc. The report can also identify system bottlenecks are potential problem areas.

The reliability indices can be based on the results of credible system contingencies involving both generation and transmission outages. The reliability indices can include load point reliability indices, branch reliability indices, and system reliability indices. For example, various load/bus reliability indices can be determined such as probability and frequency of failure, expected load curtailed, expected energy not supplied, frequency of voltage violations, reactive power required, and expected customer outage cost. The load point indices can be evaluated for the major load buses in the system and can be used in system design for comparing alternate system configurations and modifications.

Overall system reliability indices can include power interruption index, power supply average MW curtailment, power supply disturbance index, power energy curtailment index, severity index, and system availability. For example, the individual load point indices can be aggregated to produce a set of system indices. These indices are indicators of the overall adequacy of the composite system to meet the total system load demand and energy requirements and can be extremely useful for the system planner and management, allowing more informed decisions to be made both in planning and in managing the system.

The various analysis and techniques can be broadly classified as being either Monte Carlo simulation or Contingency Enumeration. The process can also use AC, DC and fast linear network power flow solutions techniques and can support multiple contingency modeling, multiple load levels, automatic or user-selected contingency enumeration, use a variety of remedial actions, and provides sophisticated report generation.

The analysis of step 1506 can include adequacy analysis of the power system being monitored based on a prescribed set of criteria by which the system must be judged as being in the success or failed state. The system is considered to be in the failed state if the service at load buses is interrupted or its quality becomes unacceptable, i.e., if there are capacity deficiency, overloads, and/or under/over voltages Various load models can be used in the process of FIG. 15 including multi-step load duration curve, curtailable and Firm, and Customer Outage Cost models. Additionally, various remedial actions can be proscribed or even initiated including MW and MVAR generation control, generator bus voltage control, phase shifter adjustment, MW generation rescheduling, and load curtailment (interruptible and firm).

Figure 16:
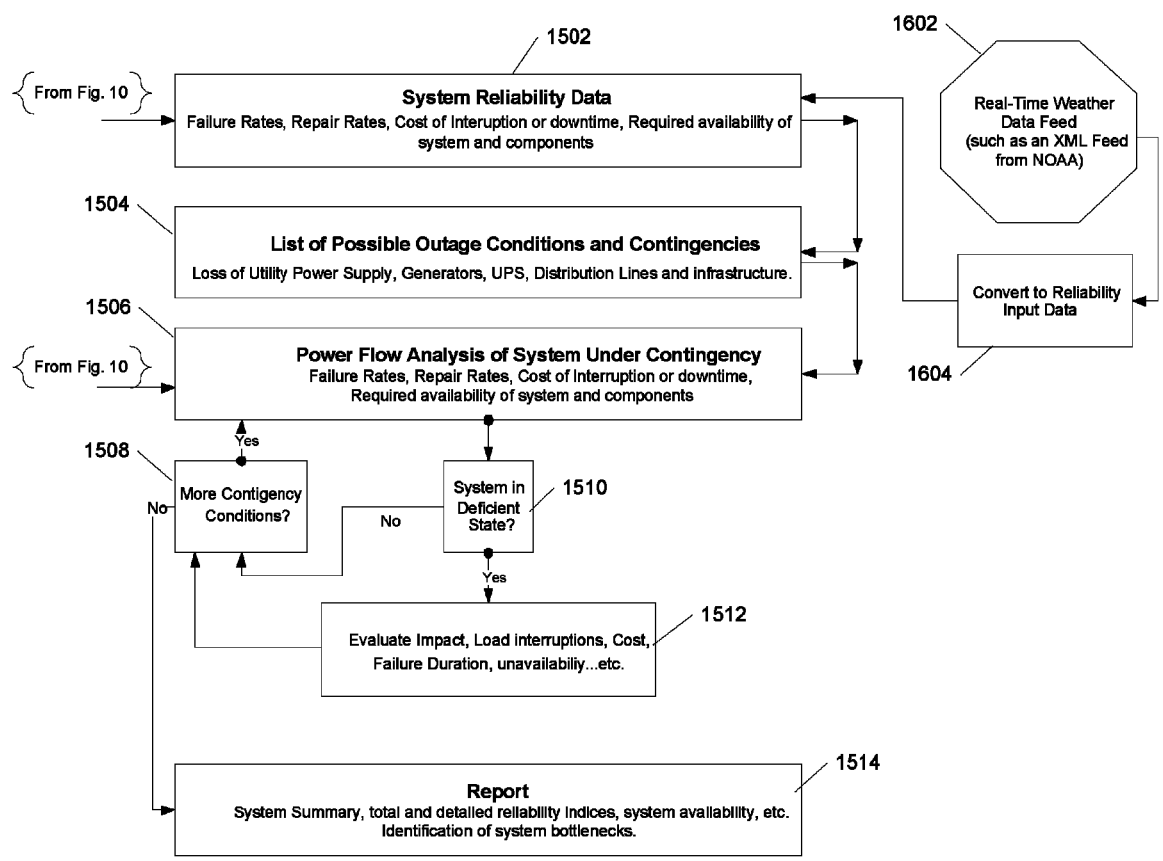
FIG. 16 is a flow chart illustrating an example process for analyzing the reliability of an electrical power distribution and transmission system that takes weather information into account, in accordance with one embodiment.

In other embodiments, the effect of other variables, such as the weather and human error can also be evaluated in conjunction with the process of FIG. 15 and indices can be associated with these factors. For example, FIG. 16 is a flow chart illustrating an example process for analyzing the reliability of an electrical power distribution and transmission system that takes weather information into account in accordance with one embodiment. Thus, in step 1602, real-time weather data can be received, e.g., via a data feed such as an XML feed from National Oceanic and Atmosphere Administration (NOAA). In step 1604, this data can be converted into reliability data that can be used in step 1502.

It should also be noted that National Fire Protection Association (NFPA) and the Occupational Safety and Health Association (OSHA) have mandated that facilities comply with proper workplace safety standards and conduct Arc Flash studies in order to determine the incident energy, protection boundaries and PPE levels needed to be worn by technicians. Unfortunately, conventional approaches/systems for performing such studies do not provide a reliable means for the real-time prediction of the potential energy released (in calories per centimeter squared) for an arc flash event. Moreover, no real-time system exists that can predict the required personal protective equipment (PPE) required to safely perform repairs as required by NFPA 70E and IEEE 1584.

When a fault in the system being monitored contains an arc, the heat released can damage equipment and cause personal injury. It is the latter concern that brought about the development of the heat exposure programs referred to above. The power dissipated in the arc radiates to the surrounding surfaces. The further away from the arc the surface is, the less the energy is received per unit area.

As noted above, conventional approaches are based on highly specialized static simulation models that are rigid and non-reflective of the facilities operational status at the time a technician may be needed to conduct repairs on electrical equipment. But the PPE level required for the repair, or the safe protection boundary may change based on the actual operational status of the facility and alignment of the power distribution system at the time repairs are needed. Therefore, a static model does not provide the real-time analysis that can be critical for accurate PPE level determination. This is because static systems cannot adjust to the many daily changes to the electrical system that occur at a facility, e.g., motors and pumps may be on or off, on-site generation status may have changed by having diesel generators on-line, utility electrical feed may also change, etc., nor can they age with the facility to accurately predict the required PPE levels.

Accordingly, existing systems rely on exhaustive studies to be performed off-line by a power system engineer or a design professional/specialist. Often the specialist must manually modify a simulation model so that it is reflective of the proposed facility operating condition and then conduct a static simulation or a series of static simulations in order to come up with recommended safe working distances, energy calculations and PPE levels. But such a process is not timely, accurate nor efficient, and as noted above can be quite costly.

Using the systems and methods described herein a logical model of a facility electrical system can be integrated into a real-time environment, with a robust AC Arc Flash simulation engine (system modeling engine 124), a data acquisition system (data acquisition hub 112), and an automatic feedback system (calibration engine 134) that continuously synchronizes and calibrates the logical model to the actual operational conditions of the electrical system. The ability to re-align the simulation model in real-time so that it mirrors the real facility operating conditions, coupled with the ability to calibrate and age the model as the real facility ages, as describe above, provides a desirable approach to predicting PPE levels, and safe working conditions at the exact time the repairs are intended to be performed. Accordingly, facility management can provide real-time compliance with, e.g., NFPA 70E and IEEE 1584 standards and requirements.

Figure 17:
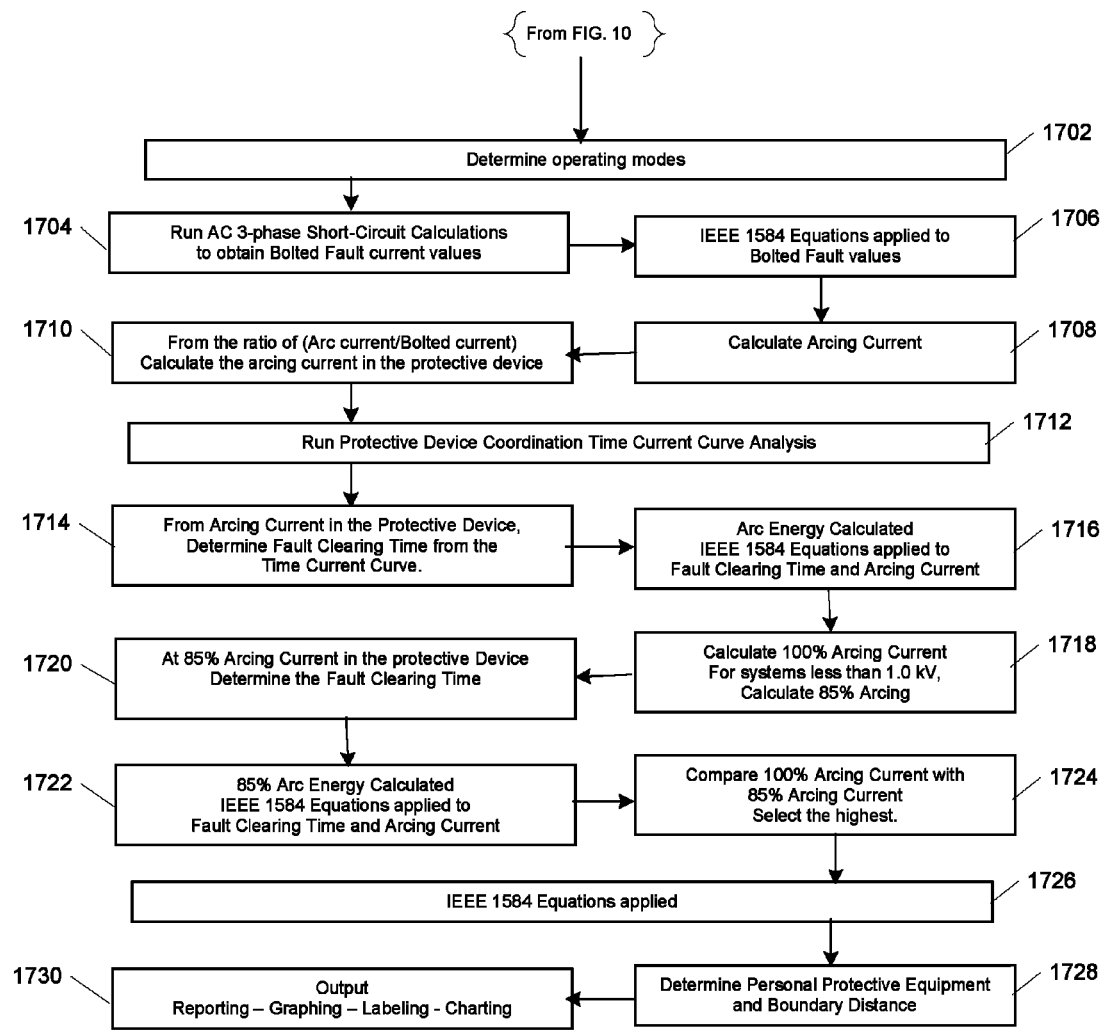
FIG. 17 is a diagram illustrating an example process for predicting in real-time various parameters associated with an alternating current (AC) arc flash incident, in accordance with one embodiment.

FIG. 17 is a diagram illustrating an example process for predicting in real-time various parameters associated with an alternating current (AC) arc flash incident. These parameters can include for example, the arc flash incident energy, arc flash protection boundary, and required Personal Protective Equipment (PPE) levels, e.g., in order to comply with NFPA-70E and IEEE-1584. First, in step 1702, updated virtual model data can be obtained for the system being model, e.g., the updated data of step 1006, and the operating modes for the system can be determined. In step 1704, an AC 3-phase short circuit analysis can be performed in order to obtain bolted fault current values for the system. In step 1706, e.g., IEEE 1584 equations can be applied to the bolted fault values and any corresponding arcing currents can be calculated in step 1708.

The ratio of arc current to bolted current can then be used, in step 1710, to determine the arcing current in a specific protective device, such as a circuit breaker or fuse. A coordinated time-current curve analysis can be performed for the protective device in step 1712. In step 1714, the arcing current in the protective device and the time current analysis can be used to determine an associated fault clearing time, and in step 1716 a corresponding arc energy can be determined based on, e.g., IEEE 1584 equations applied to the fault clearing time and arcing current.

In step 1718, the 100% arcing current can be calculated and for systems operating at less than 1 kV the 85% arcing current can also be calculated. In step 1720, the fault clearing time in the protective device can be determined at the 85% arcing current level. In step 1722, e.g., IEEE 1584 equations can be applied to the fault clearing time (determined in step 1720) and the arcing current to determine the 85% arc energy level, and in step 1724 the 100% arcing current can be compared with the 85% arcing current, with the higher of the two being selected. IEEE 1584 equations, for example, can then be applied to the selected arcing current in step 1726 and the PPE level and boundary distance can be determined in step 1728. In step 1730, these values can be output, e.g., in the form of a display or report.

In other embodiments, using the same or a similar procedure as illustrated in FIG. 17, the following evaluations can be made in real-time and based on an accurate, e.g., aged, model of the system:

Arc Flash Exposure based on IEEE 1584;
Arc Flash Exposure based on NFPA 70E;
Network-Based Arc Flash Exposure on AC Systems/Single Branch Case;
Network-Based Arc Flash Exposure on AC Systems/Multiple Branch Cases;

Network Arc Flash Exposure on DC Networks;
Exposure Simulation at Switchgear Box, MCC Box, Open Area and Cable Grounded and Ungrounded;
Calculate and Select Controlling Branch(s) for Simulation of Arc Flash;
Test Selected Clothing;
Calculate Clothing Required;
Calculate Safe Zone with Regard to User Defined Clothing Category;
Simulated Art Heat Exposure at User Selected locations;
User Defined Fault Cycle for 3-Phase and Controlling Branches;
User Defined Distance for Subject;
100% and 85% Arcing Current;
100% and 85% Protective Device Time;
Protective Device Setting Impact on Arc Exposure Energy;
User Defined Label Sizes;
Attach Labels to One-Line Diagram for User Review;
Plot Energy for Each Bus;
Write Results into Excel;
View and Print Graphic Label for User Selected Bus(s); and
Work permit.

With the insight gained through the above methods, appropriate protective measures, clothing and procedures can be mobilized to minimize the potential for injury should an arc flash incident occur. Facility owners and operators can efficiently implement a real-time safety management system that is in compliance with NFPA 70E and IEEE 1584 guidelines.

Figure 18:
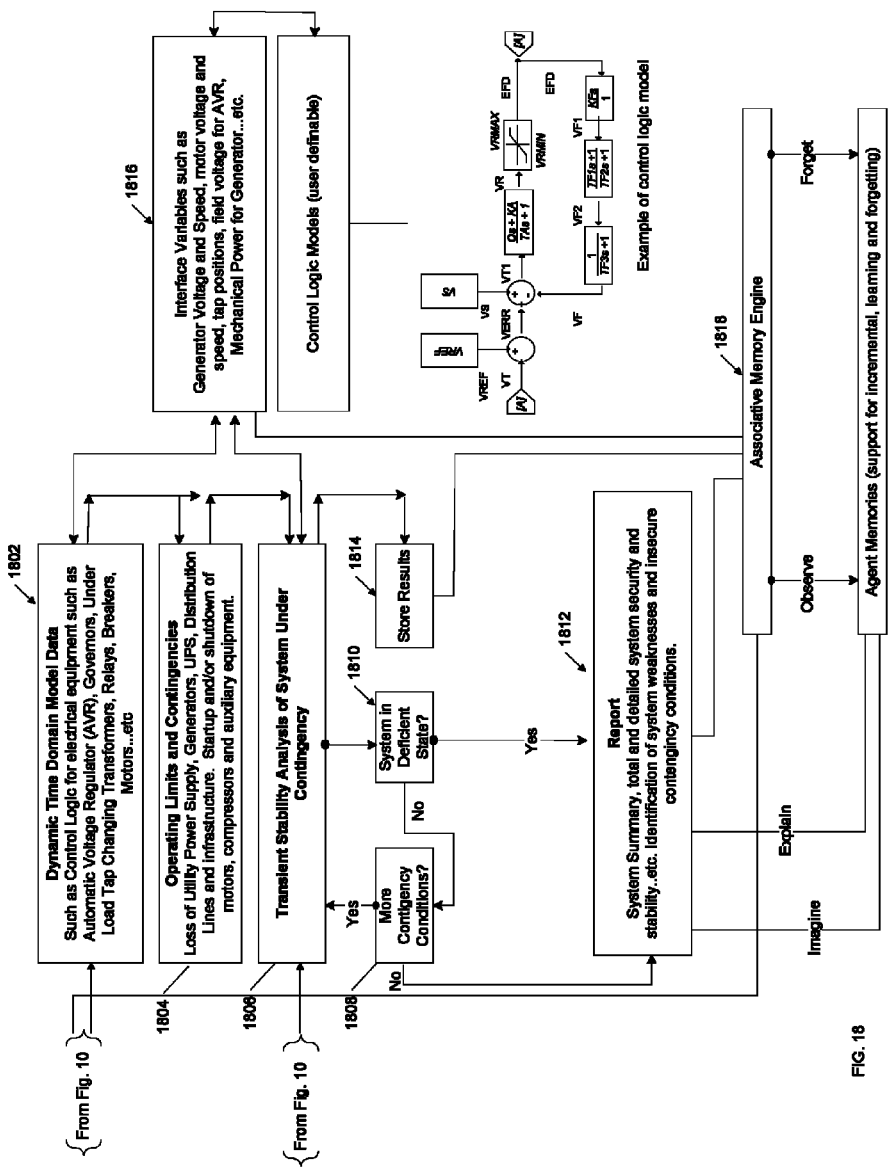
FIG. 18 is a flow chart illustrating an example process for real-time analysis of the operational stability of an electrical power distribution and transmission system, in accordance with one embodiment.

FIG. 18 is a flow chart illustrating an example process for real-time analysis of the operational stability of an electrical power distribution and transmission system in accordance with one embodiment. The ability to predict, in real-time, the capability of a power system to maintain stability and/or recover from various contingency events and disturbances without violating system operational constraints is important. This analysis determines the real-time ability of the power system to: 1. sustain power demand and maintain sufficient active and reactive power reserve to cope with ongoing changes in demand and system disturbances due to contingencies, 2. operate safely with minimum operating cost while maintaining an adequate level of reliability, and 3. provide an acceptably high level of power quality (maintaining voltage and frequency within tolerable limits) when operating under contingency conditions.

In step 1802, the dynamic time domain model data can be updated to re-align the virtual system model in real-time so that it mirrors the real operating conditions of the facility. The updates to the domain model data coupled with the ability to calibrate and age the virtual system model of the facility as it ages (i.e., real-time condition of the facility), as describe above, provides a desirable approach to predicting the operational stability of the electrical power system operating under contingency situations. That is, these updates account for the natural aging effects of hardware that comprise the total electrical power system by continuously synchronizing and calibrating both the control logic used in the simulation and the actual operating conditions of the electrical system The domain model data includes data that is reflective of both the static and non-static (rotating) components of the system. Static components are those components that are assumed to display no changes during the time in which the transient contingency event takes place. Typical time frames for disturbance in these types of elements range from a few cycles of the operating frequency of the system up to a few seconds. Examples of static components in an electrical system include but are not limited to transformers, cables, overhead lines, reactors, static capacitors, etc. Non-static (rotating) components encompass synchronous machines including their associated controls (exciters, governors, etc), induction machines, compensators, motor operated valves (MOV), turbines, static var compensators, fault isolation units (FIU), static automatic bus transfer (SABT) units, etc. These various types of non-static components can be simulated using various techniques. For example:

For Synchronous Machines: thermal (round rotor) and hydraulic (salient pole) units can be both simulated either by using a simple model or by the most complete two-axis including damper winding representation.

For Induction Machines: a complete two-axis model can be used. Also it is possible to model them by just providing the testing curves (current, power factor, and torque as a function of speed).

For Motor Operated Valves (MOVs): Two modes of MOV operation are of interest, namely, opening and closing operating modes. Each mode of operation consists of five distinct stages, a) start, b) full speed, c) unseating, d) travel, and e) stall. The system supports user-defined model types for each of the stages. That is, "start" may be modeled as a constant current while "full speed" may be modeled by constant power. This same flexibility exists for all five distinct stages of the closing mode.

For AVR and Excitation Systems: There are a number of models ranging form rotating (DC and AC) and analogue to static and digital controls. Additionally, the system offers a user-defined modeling capability, which can be used to define a new excitation model.

For Governors and Turbines: The system is designed to address current and future technologies including but not limited to hydraulic, diesel, gas, and combined cycles with mechanical and/or digital governors.

For Static Var Compensators (SVCs): The system is designed to address current and future technologies including a number of solid-state (thyristor) controlled SVC's or even the saturable reactor types.

For Fault Isolation Units (FIUs): The system is designed to address current and future technologies of FIUs also known as Current Limiting Devices, are devices installed between the power source and loads to limit the magnitude of fault currents that occur within loads connected to the power distribution networks.

For Static Automatic Bus Transfers (SABT): The system is designed to address current and future technologies of SABT (i.e., solid-state three phase, dual position, three-pole switch, etc.)

In one embodiment, the time domain model data includes "built-in" dynamic model data for exciters, governors, transformers, relays, breakers, motors, and power system stabilizers (PSS) offered by a variety of manufactures. For example, dynamic model data for the electrical power system may be OEM manufacturer supplied control logic for electrical equipment such as automatic voltage regulators (AVR), governors, under load tap changing transformers, relays, breakers motors, etc. In another embodiment, in order to cope with recent advances in power electronic and digital controllers, the time domain model data includes "user-defined" dynamic modeling data that is created by an authorized system administrator in accordance with user-defined control logic models. The user-defined models interacts with the virtual system model of the electrical power system through "Interface Variables" 1816 that are created out of the user-defined control logic models. For example, to build a user-defined excitation model, the controls requires that generator terminal voltage to be measured and compared with a reference quantity (voltage set point). Based on the specific control logic of the excitation and AVR, the model would then compute the predicted generator field voltage and return that value back to the application. The user-defined modeling supports a large number of pre-defined control blocks (functions) that are used to assemble the required control systems and put them into action in a real-time environment for assessing the strength and security of the power system. In still another embodiment, the time domain model data includes both built-in dynamic model data and user-defined model data.

Moving on to step 1804, a contingency event can be chosen out of a diverse list of contingency events to be evaluated. That is, the operational stability of the electrical power system can be assessed under a number of different contingency event scenarios including but not limited to a singular event contingency or multiple event contingencies (that are simultaneous or sequenced in time). In one embodiment, the contingency events assessed are manually chosen by a system administrator in accordance with user requirements. In another embodiment, the contingency events assessed are automatically chosen in accordance with control logic that is dynamically adaptive to past observations of the electrical power system. That is the control logic "learns" which contingency events to simulate based on past observations of the electrical power system operating under various conditions.

Some examples of contingency events include but are not limited to:
Application/removal of three-phase fault.
Application/removal of phase-to-ground fault
Application/removal of phase-phase-ground fault.
Application/removal of phase-phase fault.
Branch Addition.
Branch Tripping
Starting Induction Motor.
Stopping Induction Motor
Shunt Tripping.
Shunt Addition (Capacitor and/or Induction)
Generator Tripping.
SVC Tripping.
Impact Loading (Load Changing Mechanical Torque on Induction Machine. With this option it is actually possible to turn an induction motor to an induction generator)
Loss of Utility Power Supply/Generators/UPS/Distribution Lines/System Infrastructure
Load Shedding In step 1806, a transient stability analysis of the electrical power system operating under the various chosen contingencies can be performed. This analysis can include identification of system weaknesses and insecure contingency conditions. That is, the analysis can predict (forecast) the system's ability to sustain power demand, maintain sufficient active and reactive power reserve, operate safely with minimum operating cost while maintaining an adequate level of reliability, and provide an acceptably high level of power quality while being subjected to various contingency events. The results of the analysis can be stored by an associative memory engine 1818 during step 1814 to support incremental learning about the operational characteristics of the system. That is, the results of the predictions, analysis, and real-time data may be fed, as needed, into the associative memory engine 1818 for pattern and sequence recognition in order to learn about the logical realities of the power system. In certain embodiments, engine 1818 can also act as a pattern recognition engine or a Hierarchical Temporal Memory (HTM) engine. Additionally, concurrent inputs of various electrical, environmental, mechanical, and other sensory data can be used to learn about and determine normality and abnormality of business and plant operations to provide a means of understanding failure modes and give recommendations.

In step 1810, it can be determined if the system is operating in a deficient state when confronted with a specific contingency. If it is, then in step 1812, a report is generated providing a summary of the operational stability of the system. The summary may include general predictions about the total security and stability of the system and/or detailed predictions about each component that makes up the system.

Alternatively, if it is determined that the system is not in a deficient state in step 1810, then step 1808 can determine if further contingencies needs to be evaluated. If so, then the process can revert to step 1806 and further contingencies can be evaluated.

The results of real-time simulations performed in accordance with FIG. 18 can be communicated in step 1812 via a report, such as a print out or display of the status. In addition, the information can be reported via a graphical user interface (thick or thin client) that illustrated the various components of the system in graphical format. In such embodiments, the report can simply comprise a graphical indication of the security or insecurity of a component, subsystem, or system, including the whole facility. The results can also be forwarded to associative memory engine 1818, where they can be stored and made available for predictions, pattern/sequence recognition and ability to imagine, e.g., via memory agents or other techniques, some of which are describe below, in step 1820.

The process of FIG. 18 can be applied to a number of needs including but not limited to predicting system stability due to: Motor starting and motor sequencing, an example is the assessment of adequacy of a power system in emergency start up of auxiliaries; evaluation of the protections such as under frequency and under-voltage load shedding schemes, example of this is allocation of required load shedding for a potential loss of a power generation source; determination of critical clearing time of circuit breakers to maintain stability; and determination of the sequence of protective device operations and interactions.

Figure 19:
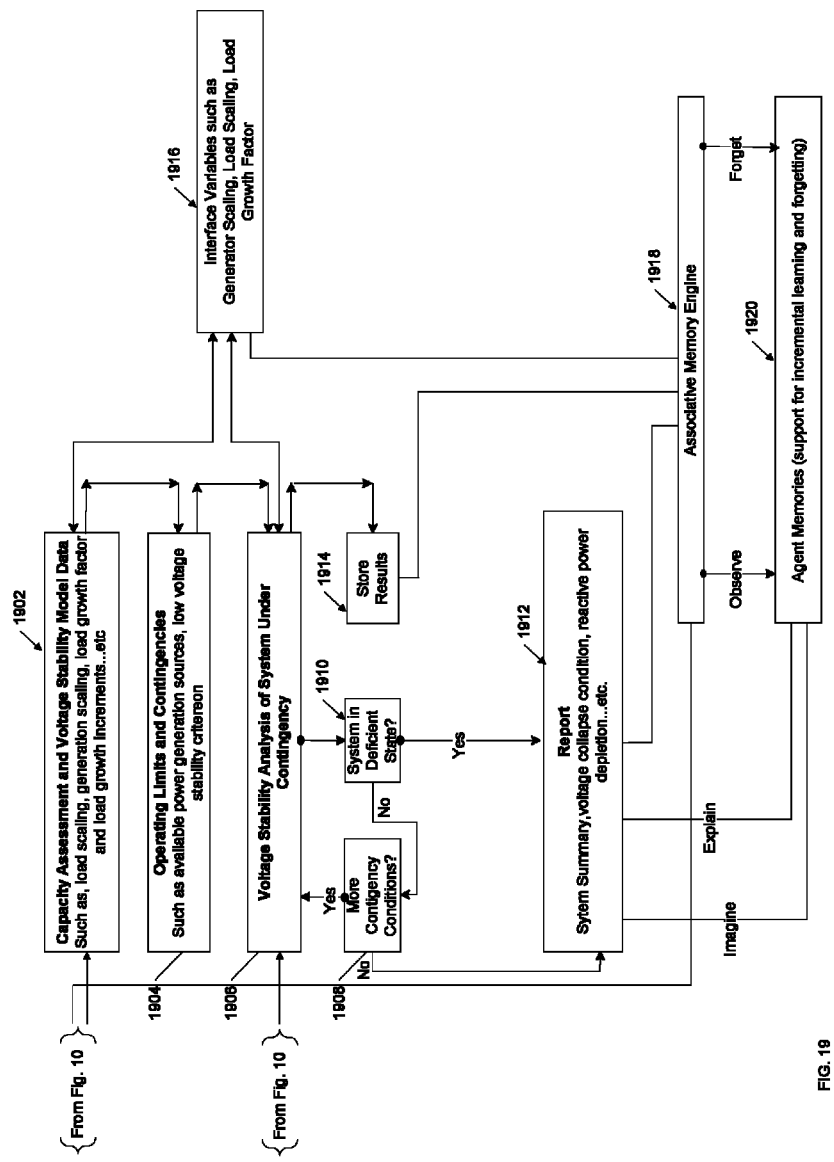
FIG. 19 is a flow chart illustrating an example process for conducting a real-time power capacity assessment of an electrical power distribution and transmission system, in accordance with one embodiment.

FIG. 19 is a flow chart illustrating an example process for conducting a real-time power capacity assessment of an electrical power distribution and transmission system, in accordance with one embodiment. The stability of an electrical power system can be classified into two broad categories: transient (angular) stability and voltage stability (i.e., power capacity). Voltage stability refers to the electrical system's ability to maintain acceptable voltage profiles under different system topologies and load changes (i.e., contingency events). That is, voltage stability analyses determine bus voltage profiles and power flows in the electrical system before, during, and immediately after a major disturbance. Generally speaking, voltage instability stems from the attempt of load dynamics to restore power consumption beyond the capability of the combined transmission and generation system. One factor that comes into play is that unlike active power, reactive power cannot be transported over long distances. As such, a power system rich in reactive power resources is less likely to experience voltage stability problems. Overall, the voltage stability of a power system is of paramount importance in the planning and daily operation of an electrical system.

Traditionally, transient stability has been the main focus of power system professionals. However, with the increased demand for electrical energy and the regulatory hurdles blocking the expansion of existing power systems, the occurrences of voltage instability has become increasingly frequent and therefore has gained increased attention from power system planners and power system facility operators.

The ability to learn, understand and make predictions about available power system capacity and system susceptibility to voltage instability, in real-time would be beneficial in generating power trends for forecasting purposes.

In step 1902, the voltage stability modeling data for the components comprising the electrical system can be updated to re-align the virtual system model in "real-time" so that it mirrors the real operating conditions of the facility. These updates to the voltage stability modeling data coupled with the ability to calibrate and age the virtual system model of the facility as it ages (i.e., real-time condition of the facility), as describe above, provides a desirable approach to predicting occurrences of voltage instability (or power capacity) in the electrical power system when operating under contingency situations. That is, these updates account for the natural aging effects of hardware that comprise the total electrical power system by continuously synchronizing and calibrating both the control logic used in the simulation and the actual operating conditions of the electrical system The voltage stability modeling data includes system data that has direct influence on the electrical system's ability to maintain acceptable voltage profiles when the system is subjected to various contingencies, such as when system topology changes or when the system encounters power load changes. Some examples of voltage stability modeling data are load scaling data, generation scaling data, load growth factor data, load growth increment data, etc.

In one embodiment, the voltage stability modeling data includes "built-in" data supplied by an OEM manufacturer of the components that comprise the electrical equipment. In another embodiment, in order to cope with recent advances power system controls, the voltage stability data includes "user-defined" data that is created by an authorized system administrator in accordance with user-defined control logic models. The user-defined models interact with the virtual system model of the electrical power system through "Interface Variables" 1916 that are created out of the user-defined control logic models. In still another embodiment, the voltage stability modeling data includes a combination of both built-in model data and user-defined model data Moving on to step 1904, a contingency event can be chosen out of a diverse list of contingency events to be evaluated. That is, the voltage stability of the electrical power system can be assessed under a number of different contingency event scenarios including but not limited to a singular event contingency or multiple event contingencies (that are simultaneous or sequenced in time). In one embodiment, the contingency events assessed are manually chosen by a system administrator in accordance with user requirements. In another embodiment, the contingency events assessed are automatically chosen in accordance with control logic that is dynamically adaptive to past observations of the electrical power system. That is the control logic "learns" which contingency events to simulate based on past observations of the electrical power system operating under various conditions. Some examples of contingency events include but are not limited to: loss of utility supply to the electrical system, loss of available power generation sources, system load changes/fluctuations, loss of distribution infrastructure associated with the electrical system, etc.

In step 1906, a voltage stability analysis of the electrical power system operating under the various chosen contingencies can be performed. This analysis can include a prediction (forecast) of the total system power capacity, available system power capacity and utilized system power capacity of the electrical system of the electrical system under various contingencies. That is, the analysis can predict (forecast) the electrical system's ability to maintain acceptable voltage profiles during load changes and when the overall system topology undergoes changes. The results of the analysis can be stored by an associative memory engine 1918 during step 1914 to support incremental learning about the power capacity characteristics of the system. That is, the results of the predictions, analysis, and real-time data may be fed, as needed, into the associative memory engine 1918 for pattern and sequence recognition in order to learn about the voltage stability of the electrical system in step 1920. Additionally, concurrent inputs of various electrical, environmental, mechanical, and other sensory data can be used to learn about and determine normality and abnormality of business and plant operations to provide a means of understanding failure modes and give recommendations.

In step 1910, it can be determined if there is voltage instability in the system when confronted with a specific contingency. If it is, then in step 1912, a report is generated providing a summary of the specifics and source of the voltage instability. The summary may include general predictions about the voltage stability of the overall system and/or detailed predictions about each component that makes up the system.

Alternatively, if it is determined that the system is not in a deficient state in step 1910, then step 1908 can determine if further contingencies needs to be evaluated. If so, then the process can revert to step 1906 and further contingencies can be evaluated.

The results of real-time simulations performed in accordance with FIG. 19 can be communicated in step 1912 via a report, such as a print out or display of the status. In addition, the information can be reported via a graphical user interface (thick or thin client) that illustrated the various components of the system in graphical format. In such embodiments, the report can simply comprise a graphical indication of the capacity of a subsystem or system, including the whole facility. The results can also be forwarded to associative memory engine 1918, where they can be stored and made available for predictions, pattern/sequence recognition and ability to imagine, e.g., via memory agents or other techniques, some of which are describe below, in step 1920

The systems and methods described above can also be used to provide reports (step 1912) on, e.g., total system electrical capacity, total system capacity remaining, total capacity at all busbars and/or processes, total capacity remaining at all busbars and/or processes, total system loading, loading at each busbar and/or process, etc.

Thus, the process of FIG. 19 can receive input data related to power flow, e.g., network connectivity, loads, generations, cables/transformers, impedances, etc., power security, contingencies, and capacity assessment model data and can produce as outputs data related to the predicted and designed total system capacity, available capacity, and present capacity. This information can be used to make more informed decisions with respect to management of the facility.

Figure 20:
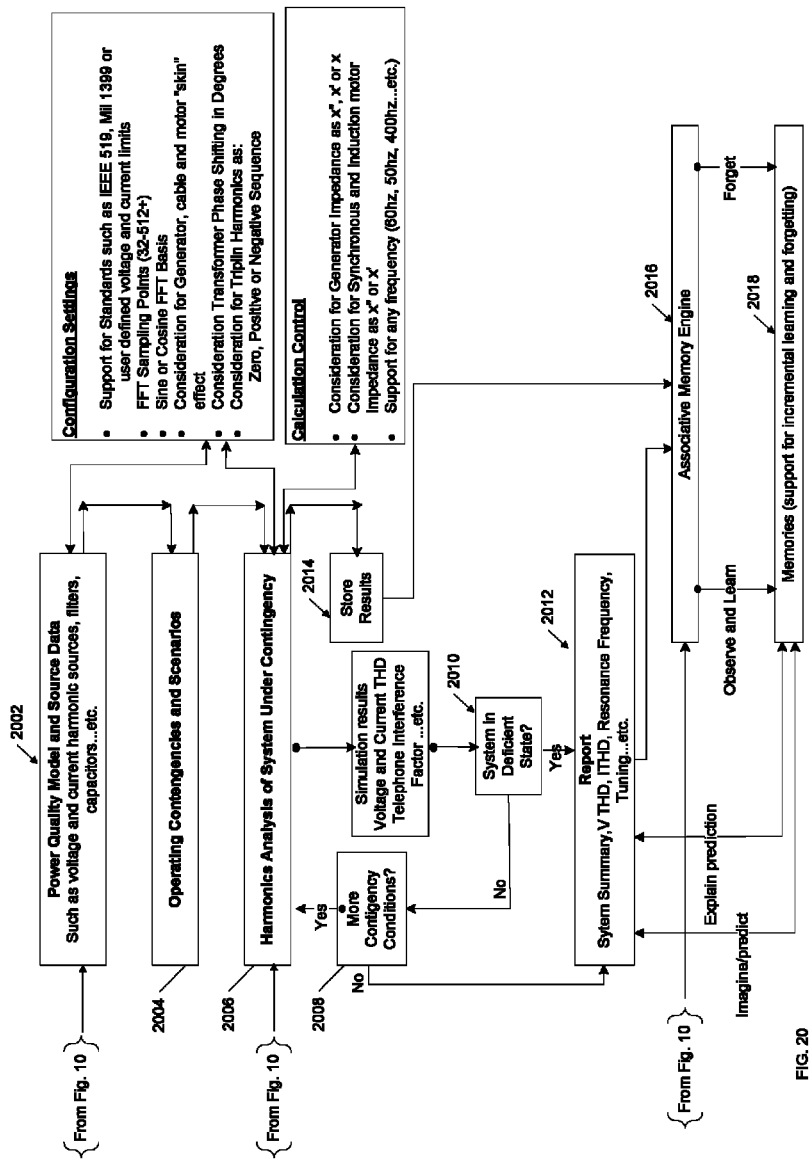
FIG. 20 is a flow chart illustrating an example process for performing real-time harmonics analysis of an electrical power distribution and transmission system, in accordance with one embodiment.

FIG. 20 is a flow chart illustrating an example process for performing real-time harmonics analysis of an electrical power distribution and transmission system, in accordance with one embodiment. As technological advances continue to be made in the field of electronic devices, there has been particular emphasis on the development of energy saving features. Electricity is now used quite differently from the way it used be used with new generations of computers and peripherals using very large-scale integrated circuitry operating at low voltages and currents. Typically, in these devices, the incoming alternating current (AC) voltage is diode rectified and then used to charge a large capacitor. The electronic device then draws direct current (DC) from the capacitor in short non-linear pulses to power its internal circuitry. This sometimes causes harmonic distortions to arise in the load current, which may result in overheated transformers and neutrals, as well as tripped circuit breakers in the electrical system.

The inherent risks (to safety and the operational life of components comprising the electrical system) that harmonic distortions poses to electrical systems have led to the inclusion of harmonic distortion analysis as part of traditional power analysis. Metering and sensor packages are currently available to monitor harmonic distortions within an electrical system. However, it is not feasible to fully sensor out an electrical system at all possible locations due to cost and the physical accessibility limitations in certain parts of the system. Therefore, there is a need for techniques that predict, through real-time simulation, the sources of harmonic distortions within an electrical system, the impacts that harmonic distortions have or may have, and what steps (i.e., harmonics filtering) may be taken to minimize or eliminate harmonics from the system.

Currently, there are no reliable techniques for predicting, in real-time, the potential for periodic non-sinusoidal waveforms (i.e. harmonic distortions) to occur at any location within an electrical system powered with sinusoidal voltage. In addition, existing techniques do not take into consideration the operating conditions and topology of the electrical system or utilizes a virtual system model of the system that "ages" with the actual facility or its current condition. Moreover, no existing technique combines real-time power quality meter readings and predicted power quality readings for use with a pattern recognition system such as an associative memory machine learning system to predict harmonic distortions in a system due to changes in topology or poor operational conditions within an electrical system.

The process, described herein, provides a harmonics analysis solution that uses a real-time snap shot captured by a data acquisition system to perform a real-time system power quality evaluation at all locations regardless of power quality metering density. This process integrates, in real-time, a logical simulation model (i.e., virtual system model) of the electrical system, a data acquisition system, and power system simulation engines with a logic based approach to synchronize the logical simulation model with conditions at the real electrical system to effectively "age" the simulation model along with the actual electrical system. Through this approach, predictions about harmonic distortions in an electrical system may be accurately calculated in real-time. Condensed, this process works by simulating harmonic distortions in an electrical system through subjecting a real-time updated virtual system model of the system to one or more simulated contingency situations.

In step 2002, the harmonic frequency modeling data for the components comprising the electrical system can be updated to re-align the virtual system model in "real-time" so that it mirrors the real operating conditions of the facility. These updates to the harmonic frequency modeling data coupled with the ability to calibrate and age the virtual system model of the facility as it ages (i.e., real-time condition of the facility), as describe above, provides a desirable approach to predicting occurrences of harmonic distortions within the electrical power system when operating under contingency situations. That is, these updates account for the natural aging effects of hardware that comprise the total electrical power system by continuously synchronizing and calibrating both the control logic used in the simulation and the actual operating conditions of the electrical system.

Harmonic frequency modeling data has direct influence over how harmonic distortions are simulated during a harmonics analysis. Examples of data that is included with the harmonic frequency modeling data include: IEEE 519 and/or Mil 1399 compliant system simulation data, generator/cable/motor skin effect data, transformer phase shifting data, generator impedance data, induction motor impedance data, etc.

Moving on to step 2004, a contingency event can be chosen out of a diverse list of contingency events to be evaluated. That is, the electrical system can be assessed for harmonic distortions under a number of different contingency event scenarios including but not limited to a singular event contingency or multiple event contingencies (that are simultaneous or sequenced in time). In one embodiment, the contingency events assessed are manually chosen by a system administrator in accordance with user requirements. In another embodiment, the contingency events assessed are automatically chosen in accordance with control logic that is dynamically adaptive to past observations of the electrical power system. That is the control logic "learns" which contingency events to simulate based on past observations of the electrical power system operating under various conditions. Some examples of contingency events include but are not limited to additions (bringing online) and changes of equipment that effectuate a non-linear load on an electrical power system (e.g., as rectifiers, arc furnaces, AC/DC drives, variable frequency drives, diode-capacitor input power supplies, uninterruptible power supplies, etc.) or other equipment that draws power in short intermittent pulses from the electrical power system.

Continuing with FIG. 20, in step 2006, a harmonic distortion analysis of the electrical power system operating under the various chosen contingencies can be performed. This analysis can include predictions (forecasts) of different types of harmonic distortion data at various points within the system. Harmonic distortion data may include but are not limited to:

Wave-shape Distortions/Oscillations data
Parallel and Series Resonant Condition data
Total Harmonic Distortion Level data (both Voltage and Current type)
Data on the true RMS system loading of lines, transformers, capacitors, etc.
Data on the Negative Sequence Harmonics being absorbed by the AC motors
Transformer K-Factor Level data
Frequency scan at positive, negative, and zero angle response throughout the entire scanned spectrum in the electrical system.

That is, the harmonics analysis can predict (forecast) various indicators (harmonics data) of harmonic distortions occurring within the electrical system as it is being subjected to various contingency situations. The results of the analysis can be stored by an associative memory engine 2016 during step 2014 to support incremental learning about the harmonic distortion characteristics of the system. That is, the results of the predictions, analysis, and real-time data may be fed, as needed, into the associative memory engine 2016 for pattern and sequence recognition in order to learn about the harmonic distortion profile of the electrical system in step 2018. Additionally, concurrent inputs of various electrical, environmental, mechanical, and other sensory data can be used to learn about and determine normality and abnormality of business and plant operations to provide a means of understanding failure modes and give recommendations.

In step 2010, it can be determined if there are harmonic distortions within the system when confronted with a specific contingency. If it is, then in step 2012, a report is generated providing a summary of specifics regarding the characteristics and sources of the harmonic distortions. The summary may include forecasts about the different types of harmonic distortion data (e.g., Wave-shape Distortions/Oscillations data, Parallel and Series Resonant Condition data, etc.) generated at various points throughout the system. Additionally, through these forecasts, the associative memory engine 2016 can make predictions about the natural oscillation response(s) of the facility and compare those predictions with the harmonic components of the non-linear loads that are fed or will be fed from the system as indicated form the data acquisition system and power quality meters. This will give an indication of what harmonic frequencies that the potential resonant conditions lie at and provide facility operators with the ability to effectively employ a variety of harmonic mitigation techniques (e.g., addition of harmonic filter banks, etc.)

Alternatively, if it is determined that the system is not in a deficient state in step 2010, then step 2008 can determine if further contingencies needs to be evaluated. If so, then the process can revert to step 2006 and further contingencies can be evaluated.

The results of real-time simulations performed in accordance with FIG. 20 can be communicated in step 2012 via a report, such as a print out or display of the status. In addition, the information can be reported via a graphical user interface (thick or thin client) that illustrated the various components of the system in graphical format. In such embodiments, the report can simply comprise a graphical indication of the harmonic status of subsystem or system, including the whole facility. The results can also be forwarded to associative memory engine 2016, where they can be stored and made available for predictions, pattern/sequence recognition and ability to imagine, e.g., via memory agents or other techniques, some of which are describe below, in step 2018

Thus, the process of FIG. 20 can receive input data related to power flow, e.g., network connectivity, loads, generations, cables/transformers, impedances, etc., power security, contingencies, and can produce as outputs data related to Point Specific Power Quality Indices, Branch Total Current Harmonic Distortion Indices, Bus and Node Total Voltage Harmonic Distortion Indices, Frequency Scan Indices for Positive Negative and Zero Sequences, Filter(s) Frequency Angle Response, Filter(s) Frequency Impedance Response, and Voltage and Current values over each filter elements (r, xl, xc).

Figure 21:
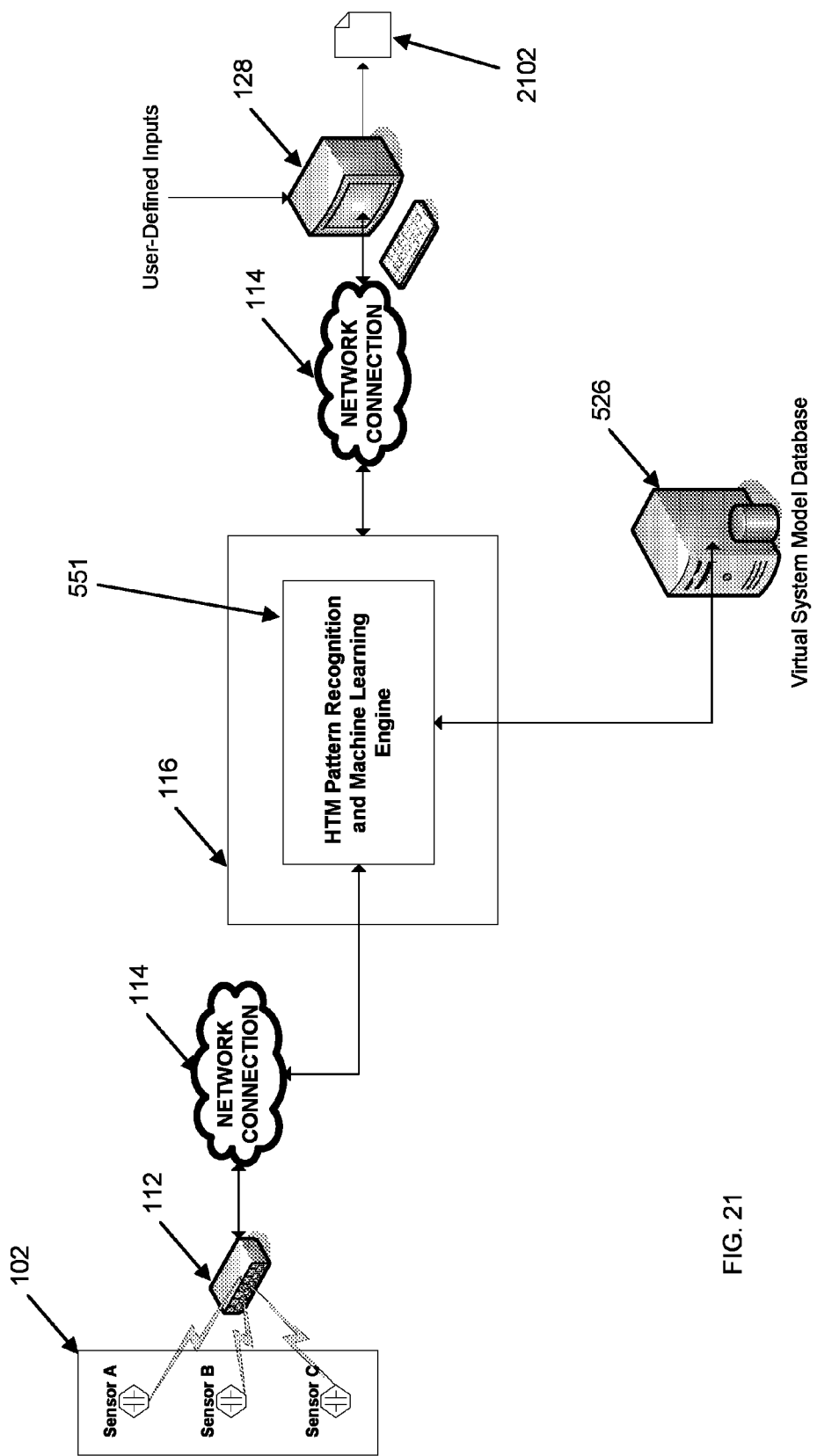
FIG. 21 is a diagram illustrating how the HTM Pattern Recognition and Machine Learning Engine works in conjunction with the other elements of the analytics system to make predictions about the operational aspects of a monitored system, in accordance with one embodiment.

FIG. 21 is a diagram illustrating how the HTM Pattern Recognition and Machine Learning Engine works in conjunction with the other elements of the analytics system to make predictions about the operational aspects of a monitored system, in accordance with one embodiment. As depicted herein, the HTM Pattern Recognition and Machine Learning Engine 551 is housed within an analytics server 116 and communicatively connected via a network connection 114 with a data acquisition hub 112, a client terminal 128 and a virtual system model database 526. The virtual system model database 526 is configured to store the virtual system model of the monitored system. The virtual system model is constantly updated with real-time data from the data acquisition hub 112 to effectively account for the natural aging effects of the hardware that comprise the total monitored system, thus, mirroring the real operating conditions of the system. This provides a desirable approach to predicting the operational aspects of the monitored power system operating under contingency situations.

The HTM Machine Learning Engine 551 is configured to store and process patterns observed from real-time data fed from the hub 112 and predicted data output from a real-time virtual system model of the monitored system. These patterns can later be used by the HTM Engine 551 to make real-time predictions (forecasts) about the various operational aspects of the system.

The data acquisition hub 112 is communicatively connected via data connections 110 to a plurality of sensors that are embedded throughout a monitored system 102. The data acquisition hub 112 may be a standalone unit or integrated within the analytics server 116 and can be embodied as a piece of hardware, software, or some combination thereof. In one embodiment, the data connections 110 are "hard wired" physical data connections (e.g., serial, network, etc.). For example, a serial or parallel cable connection between the sensors and the hub 112. In another embodiment, the data connections 110 are wireless data connections. For example, a radio frequency (RF), BLUETOOTH™, infrared or equivalent connection between the sensor and the hub 112.

Examples of a monitored system includes machinery, factories, electrical systems, processing plants, devices, chemical processes, biological systems, data centers, aircraft carriers, and the like. It should be understood that the monitored system can be any combination of components whose operations can be monitored with conventional sensors and where each component interacts with or is related to at least one other component within the combination.

Continuing with FIG. 21, the client 128 is typically a conventional "thin-client" or "thick client" computing device that may utilize a variety of network interfaces (e.g., web browser, CITRIX™, WINDOWS TERMINAL SERVICES™, telnet, or other equivalent thin-client terminal applications, etc.) to access, configure, and modify the sensors (e.g., configuration files, etc.), power analytics engine (e.g., configuration files, analytics logic, etc.), calibration parameters (e.g., configuration files, calibration parameters, etc.), virtual system modeling engine (e.g., configuration files, simulation parameters, etc.) and virtual system model of the system under management (e.g., virtual system model operating parameters and configuration files). Correspondingly, in one embodiment, the data from the various components of the monitored system and the real-time predictions (forecasts) about the various operational aspects of the system can be displayed on a client 128 display panel for viewing by a system administrator or equivalent. In another embodiment, the data may be summarized in a hard copy report 2102.

As discussed above, the HTM Machine Learning Engine 551 is configured to work in conjunction with a real-time updated virtual system model of the monitored system to make predictions (forecasts) about certain operational aspects of the monitored system when it is subjected to a contingency event. For example, where the monitored system is an electrical power system, in one embodiment, the HTM Machine Learning Engine 551 can be used to make predictions about the operational reliability of an electrical power system in response to contingency events such as a loss of power to the system, loss of distribution lines, damage to system infrastructure, changes in weather conditions, etc. Examples of indicators of operational reliability include but are not limited to failure rates, repair rates, and required availability of the power system and of the various components that make up the system.

In another embodiment, the operational aspects relate to an arc flash discharge contingency event that occurs during the operation of the power system. Examples of arc flash related operational aspects include but are not limited to quantity of energy released by the arc flash event, required personal protective equipment (PPE) for personnel operating within the confines of the system during the arc flash event, and measurements of the arc flash safety boundary area around components comprising the power system. In still another embodiment, the operational aspect relates to the operational stability of the system during a contingency event. That is, the system's ability to sustain power demand, maintain sufficient active and reactive power reserve, operate safely with minimum operating cost while maintaining an adequate level of reliability, and provide an acceptably high level of power quality while being subjected to a contingency event.

In still another embodiment, the operational aspect relates to the voltage stability of the electrical system immediately after being subjected to a major disturbance (i.e., contingency event). Generally speaking, voltage instability stems from the attempt of load dynamics to restore power consumption, after the disturbance, in a manner that is beyond the capability of the combined transmission and generation system. Examples of predicted operational aspects that are indicative of the voltage stability of an electrical system subjected to a disturbance include the total system power capacity, available system power capacity and utilized system power capacity of the electrical system under being subjected to various contingencies. Simply, voltage stability is the ability of the system to maintain acceptable voltage profiles while under the influence of the disturbances.

In still yet another embodiment, the operational aspect relates to harmonic distortions in the electrical system subjected to a major disturbance. Harmonic distortions are characterized by non-sinusoidal (non-linear) voltage and current waveforms. Most harmonic distortions result from the generation of harmonic currents caused by nonlinear load signatures. A nonlinear load is characteristic in products such as computers, printers, lighting and motor controllers, and much of today's solid-state equipment. With the advent of power semiconductors and the use of switching power supplies, the harmonics distortion problem has become more severe.

Examples of operational aspects that are indicative of harmonic distortions include but are not limited to: wave-shape distortions/oscillations, parallel and series resonance, total harmonic distortion level, transformer K-Factor levels, true RMS loading of lines/transformers/capacitors, indicators of negative sequence harmonics being absorbed by alternating current (AC) motors, positive/negative/zero angle frequency response, etc.

Figure 22:
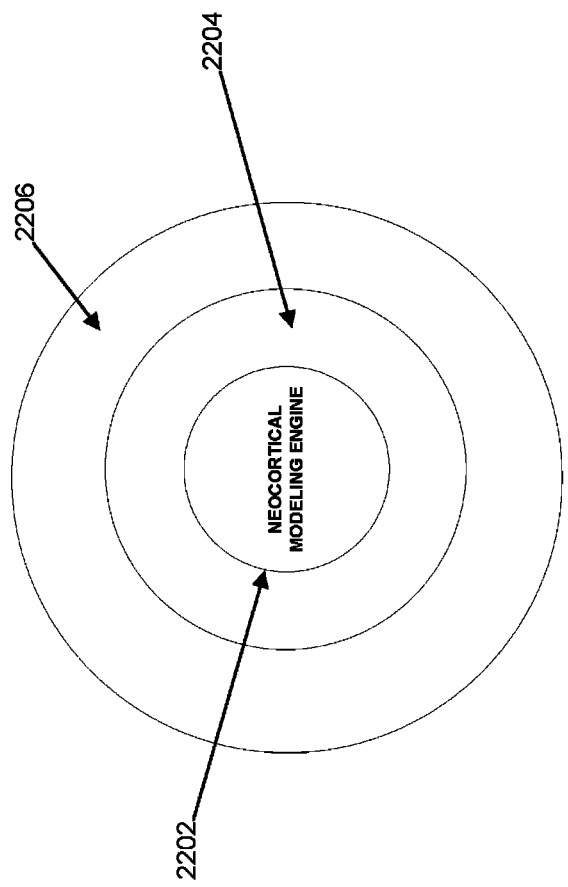
FIG. 22 is an illustration of the various cognitive layers that comprise the neocortical catalyst process used by the HTM Pattern Recognition and Machine Learning Engine to analyze and make predictions about the operational aspects of a monitored system, in accordance with one embodiment.

FIG. 22 is an illustration of the various cognitive layers that comprise the neocortical catalyst process used by the HTM Pattern Recognition and Machine Learning Engine to analyze and make predictions about the operational aspects of a monitored system, in accordance with one embodiment. As depicted herein, the neocortical catalyst process is executed by a neocortical model 2202 that is encapsulated by a real-time sensory system layer 2204, which is itself encapsulated by an associative memory model layer 2206. Each layer is essential to the operation of the neocortical catalyst process but the key component is still the neocortical model 2202. The neocortical model 2202 represents the "ideal" state and performance of the monitored system and it is continually updated in real-time by the sensor layer 2204. The sensory layer 2204 is essentially a data acquisition system comprised of a plurality of sensors imbedded within the electrical system and configured to provide real-time data feedback to the neocortical model 2202. The associative memory layer observes the interactions between the neocortical model 2202 and the real-time sensory inputs from the sensory layer 2204 to learn and understand complex relationships inherent within the monitored system. As the neocortical model 2202 matures over time, the neocortical catalyst process becomes increasingly accurate in making predictions about the operational aspects of the monitored system. This combination of the neocortical model 2202, sensory layer 2204 and associative memory model layer 2206 works together to learn, refine, suggest and predict similarly to how the human neocortex operates.

Figure 23:
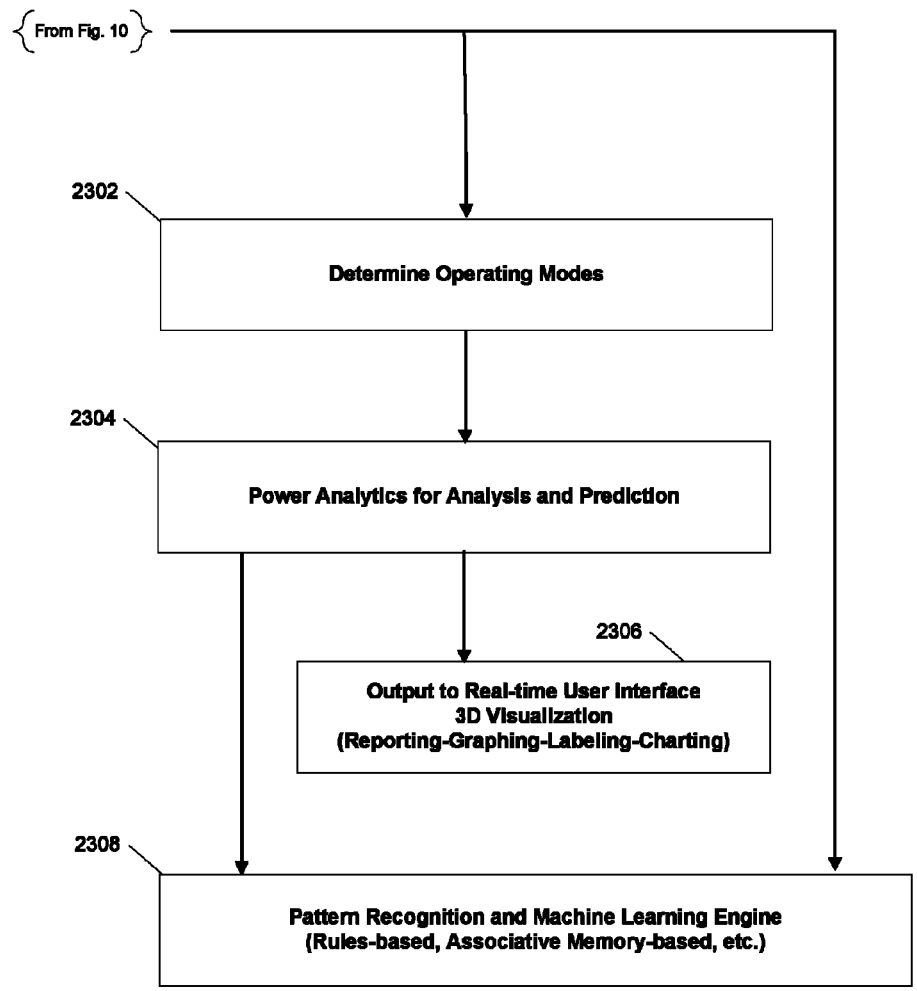
FIG. 23 is an example process for real-time three-dimensional (3D) visualization of the health, reliability, and performance of an electrical system, in accordance with one embodiment.

FIG. 23 is an example process for real-time three-dimensional (3D) visualization of the health, reliability, and performance of an electrical system, in accordance with one embodiment. The complexity of electrical power systems coupled with the many operational conditions the systems can be asked to operate under pose significant challenges to owners, operators and managers of critical electrical networks. It is vital for owners and operators alike to have a precise and well understood perspective of the overall health and performance of the electrical network. Communication of such status through three-dimensional (3D) visualization views (such as 3D Plant Lifecycle Models), in addition to the traditional two-dimensional (2D) views, greatly enhances the ability of operators, owners and executives to understand the health and predicted performance of their power networks, elegantly and efficiently.

In step 2302, the power analytics server can determine which operating mode(s) that the electrical system is being simulated under. That is, the virtual system model of the electrical system can be modified by the user to simulate the system operating under multiple different operating scenarios (conditions) and system contingencies. The power analytics server is configured to utilize the operating mode settings while simulating the operation of the electrical system to make predictions about the system's health, performance, availability and reliability. In one embodiment, the operating mode(s) relate to the multiple contingency events that the electrical system may be subjected to during regular operations. The contingency events can be chosen out of a diverse list of contingency events to be evaluated. That is, the operational health, performance, availability and reliability of the electrical power system can be assessed under a number of different contingency event scenarios including but not limited to a singular event contingency or multiple event contingencies (that are simultaneous or sequenced in time). That is, in one embodiment, the contingency events assessed are manually chosen by a user in accordance with the his/her requirements. In another embodiment, the contingency events assessed are automatically chosen in accordance with control logic that is dynamically adaptive to past observations of the electrical power system. That is the control logic "learns" which contingency events to simulate based on past observations of the electrical power system operating under various conditions.

Some examples of contingency events include but are not limited to:
  Application/removal of three-phase fault
  Application/removal of phase-to-ground fault
  Application/removal of phase-phase-ground fault
  Application/removal of phase-phase fault
  Branch Addition
  Branch Tripping
  Starting Induction Motor
  Stopping Induction Motor
  Shunt Tripping
  Shunt Addition (Capacitor and/or Induction)
  Generator Tripping
  SVC Tripping
  Impact Loading (Load Changing Mechanical Torque on Induction Machine. With this option it is actually possible to turn an induction motor to an induction generator)

Loss of Utility Power Supply/Generators/UPS/Distribution Lines/System Infrastructure Load Shedding In another embodiment, the operating mode(s) can relate to the multiple load levels that the electrical system operates under. That is, the virtual system model of the electrical system can be simulated under various power system load configurations or capacity conditions. In one embodiment, the system is simulated as operating under a base load power configuration. That is, the electrical system can be simulated as operating continuously at its maximum rated power output. Under this configuration, power systems only shut down to perform maintenance or if something breaks. Accordingly, the ability to test under such conditions cannot be achieved in conventional systems. In another embodiment, the electrical system can be simulated as operating under a load following power configuration. That is, the electrical system is simulated as operating in a fluctuating manner by adjusting its power output as demand for electricity fluctuates throughout the day. In still another embodiment, the electrical system is simulated as operating at various different power load capacity levels. For example, the electrical system may be simulated as operating at 10%, 25%, 50%, 75%, or 100% of its rated power generation capacity.

Continuing with FIG. 23, the operating mode(s) can relate to different system and load point reliability indices assigned to the components that make up the electrical system. In one embodiment, for example, changes can be made to the reliability indices of individual components. In another embodiment, changes can be made to all the components that make up the system.

In still yet another embodiment, the operating mode(s) relate to the different remedial measures or actions that are implemented on the electrical system to respond to the various contingency situations that the system may be subjected to. For example, remedial measures can relate to: the various types of uninterruptible power supply (UPS) systems operating on the electrical system, various protective devices that are integrated to the system, various operating limits and conditions that are placed on the system, etc.

In step 2304, the power analytics server is configured to utilize the operating mode settings, determined in step 2302, and the updated virtual system model of the electrical system to simulate and predict aspects relating to the real-time health, performance, reliability and availability of the electrical system. For example, the power analytics server can simulate and predict aspects relating to:

Power System Health and Performance

Variations or deviations of electrical system performance from the power system design parameters. That is, the ability of the electrical system to resist system output variations or deviations from defined tolerance limits of the electrical system Incorporation of performance and behavioral specifications for all the equipment and components that comprise the electrical system into a real-time management environment System Reliability and Availability As a function of different system, process and load point reliability indices Implementation of different technological solutions to achieve reliability centered maintenance targets and goals Power System Capacity levels As-designed total power capacity of the power system.

How much of the total power capacity remains or is available (ability of the electrical system to maintain availability of its total power capacity)

Present utilized power capacity.

Power System Strength and Resilience

Dynamic stability predictions across all contingency events

Determination of protection system stress and withstand status

Additionally, the predictions may also relate to the real-time ability of the electrical system to: 1. sustain power demand and maintain sufficient active and reactive power reserve to cope with ongoing changes in demand and system disturbances due to contingencies, 2. operate safely with minimum operating cost while maintaining an adequate level of reliability, and 3. provide an acceptably high level of power quality (maintaining voltage and frequency within tolerable limits) when operating under contingency conditions.

Continuing with FIG. 23, in step 2306, the power analytics server is configured to output the predictions in the form of a print out or display of text, graphics, charts, labels, and model views that readily communicates the health and predicted performance of the electrical system in an elegant and efficient fashion. The information can be reported via a graphical user interface ("thick" or "thin" client) that illustrates the various components of the system in graphical format. In such embodiments, the report can simply comprise a graphical indication of the capacity of a subsystem or system, including the whole facility. The results can also be forwarded to associative memory engine 2308, where they can be stored and made available for predictions, pattern/sequence recognition and ability to imagine, e.g., via memory agents or other techniques, some of which are describe below, in step 2308.

Figure 25:
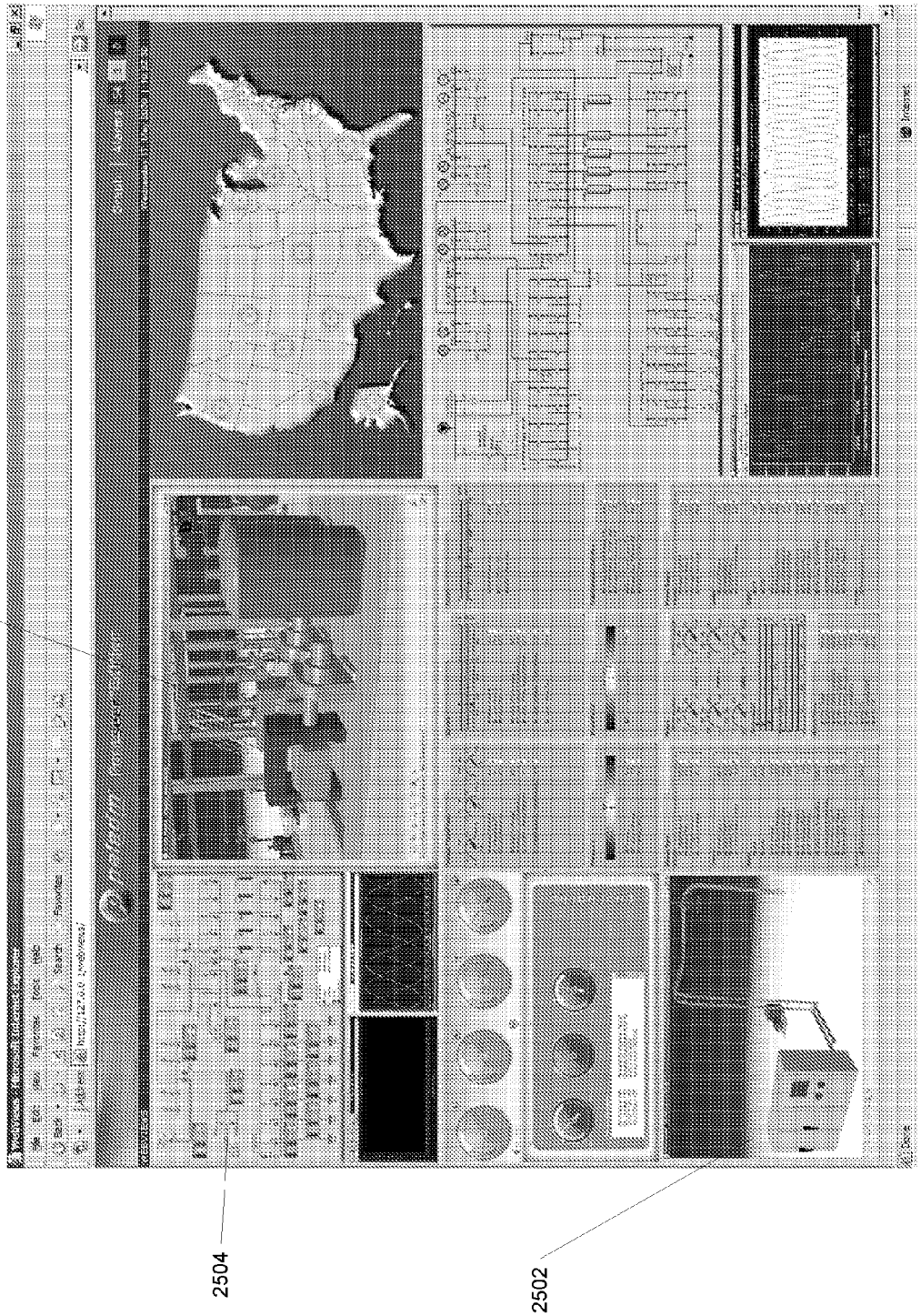
FIG. 25 provides a client terminal screenshot of some 2D and 3D model views that are generated by the power analytics server, in accordance with one embodiment.

In one embodiment, the model views are 3D (i.e., 3D Plant Lifecycle Model) model views of the various components, equipment and sub-systems that comprise the electrical system. Examples of some 3D model views 2502 are depicted in a client interface screenshot in FIG. 25. The 3D model views 2502, can be generated by an integrated 3D visualization engine that is an integrated part of the power analytics server. In another embodiment, the model views are 2D model views of the various components, equipment and sub-systems making up the electrical system. An example of a 2D model view 2504 is also depicted in FIG. 25.

As alluded to above, in step 2308, the results of the simulation and predictive analysis can be stored by an associative memory engine to support incremental learning about the power capacity characteristics of the system. That is, the results of the predictions, analysis, and real-time data may be fed, as needed, into an machine learning engine for pattern and sequence recognition in order to learn about the health, performance, reliability and availability of the electrical system. Additionally, concurrent inputs of various electrical, environmental, mechanical, and other sensory data can be used to learn about and determine normality and abnormality of business and plant operations to provide a means of understanding failure modes and generate recommendations.

Figure 24:
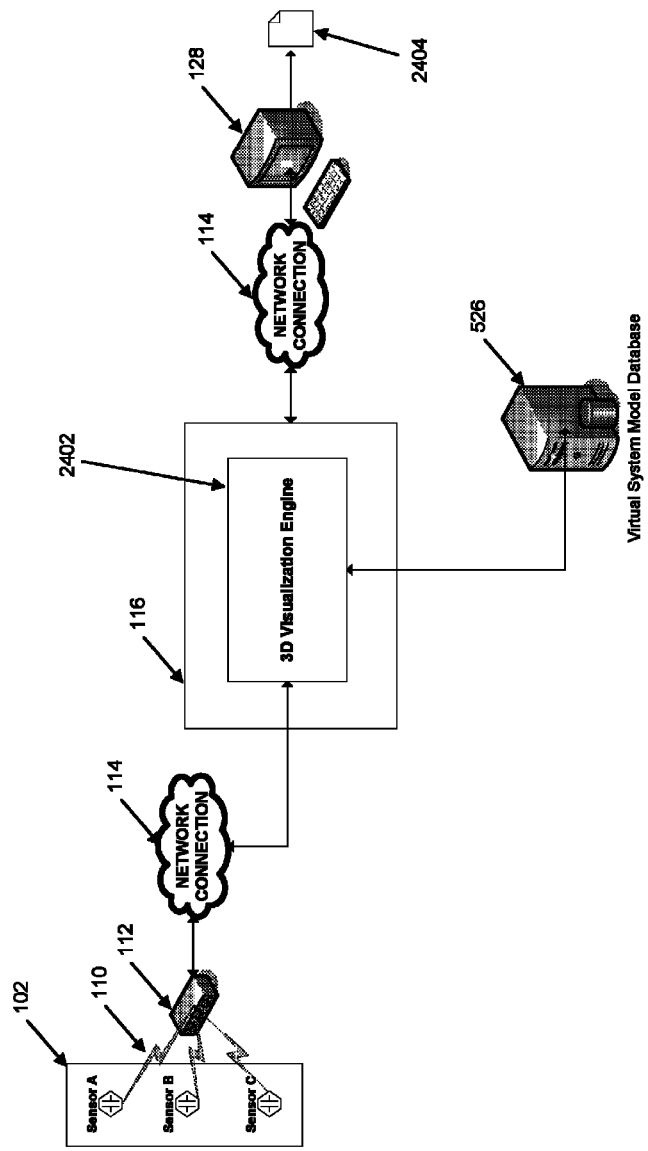
FIG. 24 is a diagram illustrating how the 3D Visualization Engine works in conjunction with the other elements of the analytics system to provide 3D visualization of the health, reliability, and performance of an electrical system, in accordance with one embodiment.

FIG. 24 is a diagram illustrating how the 3D Visualization Engine works in conjunction with the other elements of the analytics system to provide 3D visualization of the health, reliability, and performance of an electrical system, in accordance with one embodiment. As depicted herein, the 3D Visualization Engine 2402 is integrated within a power analytics server 116 that is communicatively connected via a network connection 114 with a data acquisition hub 112, a client terminal 128 and a virtual system model database 526. The virtual system model database 526 is configured to store the virtual system model of the electrical system. The virtual system model is constantly updated with real-time data from the data acquisition hub 112 to effectively account for the natural aging effects of the hardware that comprise the total electrical power system, thus, mirroring the real operating conditions of the system. This provides a desirable approach to predicting the operational aspects of the monitored power system and for communicating the predicted aspects through 3D visualization models of the facility.

The 3D visualization engine 2402 is interfaced with the predictive elements of the power analytics server and communicatively connected to the data acquisition hub 112 and the client 128. The data acquisition hub 112 is communicatively connected via data connections 110 to a plurality of sensors that are embedded throughout the electrical system 102. The data acquisition hub 112 may be a standalone unit or integrated within the analytics server 116 and can be embodied as a piece of hardware, software, or some combination thereof. In one embodiment, the data connections 110 are "hard wired" physical data connections (e.g., serial, network, etc.). For example, a serial or parallel cable connection between the sensors and the hub 112. In another embodiment, the data connections 110 are wireless data connections. For example, a radio frequency (RF), BLUETOOTH™, infrared or equivalent connection between the sensor and the hub 112. Real-time system data readings can be fed continuously to the data acquisition hub 112 from the various sensors that are embedded within the electrical system 102.

Continuing with FIG. 24, the client 128 is typically a conventional thin-client or thick-client computing device that may utilize a variety of network interfaces (e.g., web browser, CITRIX™, WINDOWS TERMINAL SERVICES™, telnet, or other equivalent thin-client terminal applications, etc.) to access, configure, and modify the sensors (e.g., configuration files, etc.), analytics engine (e.g., configuration files, analytics logic, etc.), calibration parameters (e.g., configuration files, calibration parameters, etc.), virtual system modeling engine (e.g., configuration files, simulation parameters, choice of contingency event to simulate, etc.), 3D visualization engine (e.g., configuration files, 3D visualization parameters, etc.) and virtual system model of the system under management (e.g., virtual system model operating parameters and configuration files). Correspondingly, in one embodiment, the data from the various components of the electrical system and the real-time predictions (forecasts) about the health, performance, reliability and availability of the electrical system can be displayed on a client 128 display panel for viewing by a system administrator or equivalent. In another embodiment, the data may be summarized in a hard copy report 2404.

Figure 26:
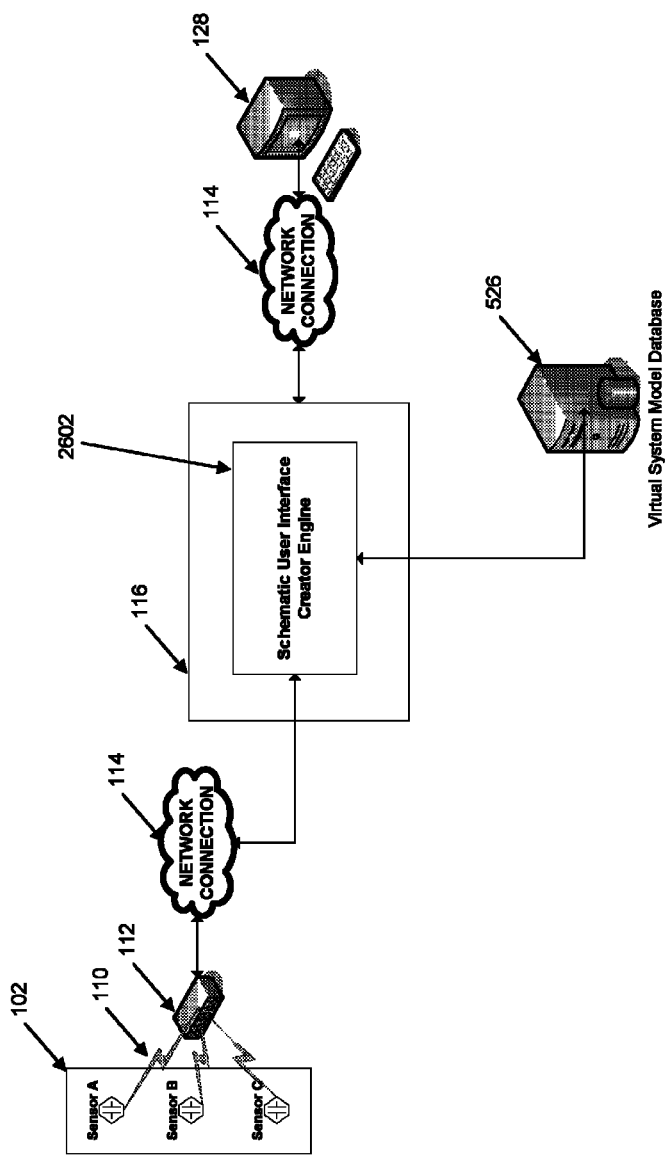
FIG. 26 is a diagram illustrating how the Schematic Interface Creator Engine works in conjunction with the other elements of the analytics system to automatically generate a schematic user interface for visualizing the health, reliability, and performance of an electrical system, in accordance with one embodiment.

FIG. 26 is a diagram illustrating how the Schematic User Interface Creator Engine works in conjunction with the other elements of the analytics system to automatically generate a schematic user interface for visualizing the health, reliability, and performance of an electrical system, in accordance with one embodiment. Conventional electrical power system monitoring technologies typically rely on custom graphical design and user-interface development efforts in order to create a system schematic user interface (displayable on a client terminal) that can be linked to real-time sensory data output by the various components that comprise an electrical power system. In general, custom development efforts tend to be cumbersome and often require an extraordinarily amount of time to implement.

Given the complexity of modern electrical power systems and the significant challenges they pose to owners, operators and managers of critical (regional, national and international) electrical networks; there is a need for automated software tools that can allow the rapid deployment of schematic based user interfaces to provide precise and well understood perspective of the overall health and performance of the various components that comprise an electrical power system. Ideally, the tools can be configured to automatically read electrical system configuration data from a database containing a virtual system representation (i.e., virtual system model) of the electrical system, generate a schematic user interface view of the electrical system, and intelligently link the various components included in the user interface to the predicted, monitored and/or derived output/values of those various components.

As depicted herein, the Schematic User Interface Creator Engine 2602 can be integrated within a power analytics server 116 that can be communicatively connected via a network connection 114 with a data acquisition hub 112, a client terminal 128 and a virtual system model database 526. The virtual system model database 526 can be configured to store the virtual system model of the electrical system. The virtual system model can be constantly updated with real-time data from the data acquisition hub 112 to effectively account for the natural aging effects of the hardware that comprise the total electrical power system, thus, mirroring the real operating conditions of the system. The Schematic User Interface Creator Engine 2602 can be configured to automatically create a schematic user interface that is representative of the electrical system and link that interface to the sensors monitoring the components (i.e., electrical equipment) that comprise the electrical system to enable real-time monitoring of the derived output/values from those components. The user interface can include a visual representation of each piece of electrical equipment (associated/tagged with a unique identifier) that comprises the electrical system. In one embodiment, the schematic user interface is based on a one-line diagram construct. In another embodiment, the schematic user interface is based on a technical system schematic diagram construct. However, it should be appreciated that the user interface can be based on any engineering diagram construct as long as the resulting interface can be displayed on a client terminal 128 to allow viewing by an operator/administrator.

In addition to being communicatively connected to the data acquisition hub 112 and the client 128, the Schematic User Interface Creator Engine 2602 can also be interfaced with the predictive elements of the power analytics server. The predictive elements of the power analytics server may relate to the real-time health, performance, reliability and availability of the electrical system. For example, the predictions can be indicative of the real-time ability of the electrical system to: 1. sustain power demand and maintain sufficient active and reactive power reserve to cope with ongoing changes in demand and system disturbances due to contingencies, 2. operate safely with minimum operating cost while maintaining an adequate level of reliability, and 3. provide an acceptably high level of power quality (maintaining voltage and frequency within tolerable limits) when operating under contingency conditions.

The data acquisition hub 112 can be communicatively connected via data connections 110 to a plurality of sensors that can be embedded throughout the electrical system 102. The data acquisition hub 112 can be a standalone unit or integrated within the analytics server 116 and can be embodied as a piece of hardware, software, or some combination thereof. In one embodiment, the data connections 110 are "hard wired" physical data connections (e.g., serial, network, etc.). For example, a serial or parallel cable connection between the sensors and the hub 112. In another embodiment, the data connections 110 are wireless data connections. For example, a radio frequency (RF), BLUETOOTH™, infrared or equivalent connection between the sensor and the hub 112. Real-time system data readings can be fed continuously to the data acquisition hub 112 from the various sensors that are embedded within the electrical system 102.

Continuing with FIG. 26, the client 128 can be a conventional thin-client or thick-client computing device that can utilize a variety of network interfaces (e.g., web browser, CITRIX™, WINDOWS TERMINAL SERVICES™, telnet, or other equivalent thin-client terminal applications, etc.) to access, configure, and modify the sensors (e.g., configuration files, etc.), power analytics engine (e.g., configuration files, analytics logic, etc.), calibration parameters (e.g., configuration files, calibration parameters, etc.), virtual system modeling engine (e.g., configuration files, simulation parameters, choice of contingency event to simulate, etc.), Schematic User Interface Creator Engine 2602 (e.g., configuration files, schematic interface algorithms, etc.) and virtual system model of the electrical system under management (e.g., virtual system model operating parameters and configuration files). Correspondingly, in one embodiment, the real-time data from the various monitored components of the electrical system and the real-time predictions (forecasts) about the health, performance, reliability and availability of the electrical system can be simultaneously visualized on the schematic user interface that is displayed on a client terminal 128 for viewing by a system administrator or equivalent. This schematic user interface can provide a desirable approach to communicating the monitored and predicted operational aspects of an electrical system to an operator/administrator. In one embodiment, the schematic user interface is rendered in a 2-dimensional (2D) graphical image format. In another embodiment, the schematic user interface is rendered in a 3-dimensional (3D) graphical image format.

Figure 27:
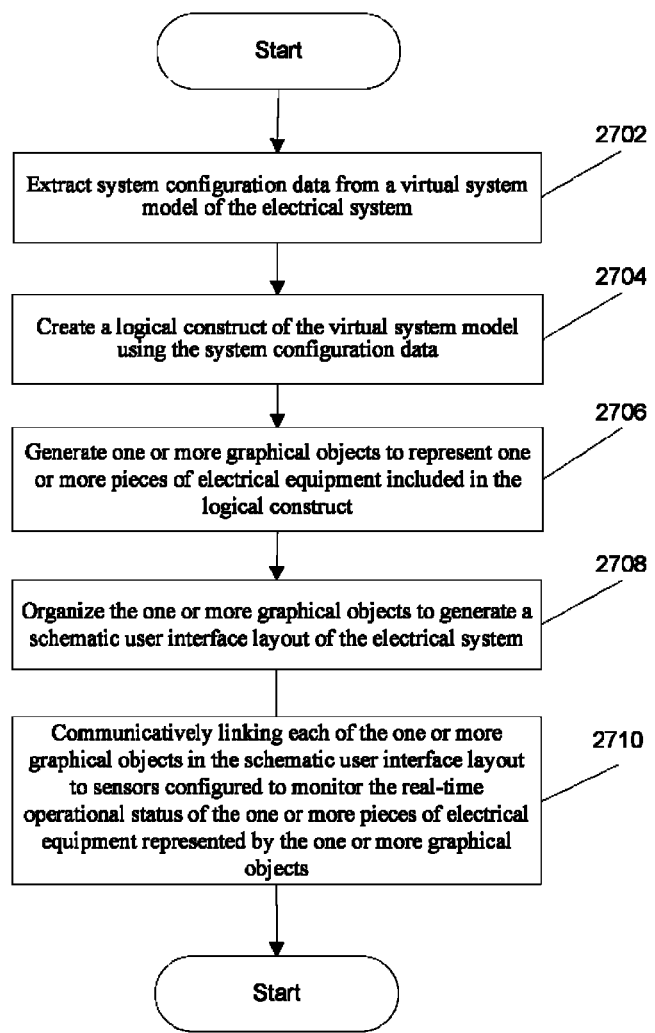
FIG. 27 is an example process for automatically generating a schematic user interface for visualizing the health, reliability, and performance of an electrical system, in accordance with one embodiment.

FIG. 27 is an example process for automatically generating a schematic user interface for visualizing the health, reliability, and performance of an electrical system, in accordance with one embodiment. In one embodiment, the operational steps that comprise the process are implemented through a schematic user interface creator engine (application/software tool) that runs on the power analytics server. In another embodiment, the operational steps that comprise the process are implemented through a schematic interface creator engine that runs on a separate (network application) server that is communicatively connected to the power analytics server. In still another embodiment, the operational steps that comprise the process are implemented through a plurality of discrete applications that are distributed amongst one or more (network application) servers that are communicatively connected with the power analytics server. It should be understood, however, that the application(s) can be distributed in any configuration as long as the application(s) can communicatively access the power analytics server to implement the process.

The process begins with step 2702, where system configuration data can be extracted from a virtual system model of the electrical system. The virtual system model can be stored in one or more virtual system model database(s) that are communicatively connected to the power analytics server. The configuration data can be stored in the memory of the power analytics server (or a network application server) and can include the unique identifiers (i.e., node IDs) of each of the components (i.e., piece of electrical equipment) that comprise the virtual system model, connectivity information (i.e., the electrical connectivity between the various virtual system model components and/or the data connectivity with the sensors monitoring those components) and/or equipment specific information such as node or branch specific equipment type (e.g., generator, circuit breaker, transformer, motor, fuse, static load, etc.).

In step 2704, a logical construct of the virtual system model can be constructed from the system configuration data. In one embodiment, the logical construct can be created in an Extensible Markup Language (XML) format. In another embodiment, the logical construct can be created in an Extensible HyperText Markup Language (XHTML) format. It should be appreciated that the logical construct can be created using any mark-up language as long as it can be utilized to convey system configuration information about the components (i.e., electrical equipment) that make up the virtual system model.

In step 2706, one or more graphical objects can be generated to represent one or more pieces of electrical equipment included in the logical construct. This can be accomplished through the schematic user interface creator engine or equivalent application(s) parsing the system configuration data stored in the logical construct and generating appropriate symbol block(s) and/or graphical object(s) for each piece of electrical equipment that comprise the electrical system. The symbol block(s) or graphical object(s) that are generated can then be individually organized as buses, nodes and/or branches.

In step 2708, the one or more graphical objects can be organized to generate a schematic user interface layout of the electrical system. This can be accomplished using a self-executing algorithm that can be either an integrated component of the schematic user interface creator engine or a separate discrete application that is configured to work in conjunction with the schematic user interface creator engine. In one embodiment, the self-executing algorithm is a .NET based application. In another embodiment, the self-executing algorithm is an ACTIVE X based application. In still another embodiment, the self-executing algorithm is a JAVA based application. It should be understood, however, that the self-executing algorithm can be created using any type of programming language as long as the resulting algorithm can function either as a component of the schematic user interface creator engine or in conjunction with the same.

In one embodiment, the self-executing algorithm is in a force directed layout format. In another embodiment, the self-executing algorithm is in a tree layout format. In still another embodiment, the self-executing algorithm is in a layered diagraph layout format. It should be appreciated that the self-executing algorithm can follow any format as long as each of the one or more graphical objects/symbol blocks in the resulting schematic user interface layout can later be linked to a corresponding piece of electrical equipment that comprise the electrical system.

After the schematic user interface layout of the electrical system is generated, it can be further optimized using the schematic interface creator engine (or equivalent application) to scan the schematic user interface layout and re-align the graphical object(s) based on one or more user selected optimization criteria. The optimization criteria can direct the visual representation(s) of the schematic user interface using various visualization algorithms that can manage the look of the graphical elements of the interface. That is, the optimization criteria can be a set of positioning and general layout rules used to draw the network or diagram in the most optimal way (which can be different each time depending on the data set and complexity of the network). Examples of the optimization criteria (or rules) that can be applied to a dataset for layout purposes include, but are not limited to:

Circular layout
Hierarchical layout
Orthogonal layout
Symmetric layout
Tree layout
Force Directed In step 2710, each of the one or more graphical objects in the schematic user interface layout can be communicatively linked to sensors configured to monitor the real-time operational status of the one or more pieces of electrical equipment represented by the one or more graphical objects. This can be accomplished by intelligently linking the unique identifiers (e.g., equipment IDs) associated with each of the graphical objects/symbol blocks to their corresponding database files and creating a tag or communication channel with the same unique identifier to allow the files to be populated with data from the electrical equipment associated with each unique identifier. For example, a Graphical Object A with a unique identifier of "001" can be linked to the database file "A" which is associated with the "001" identifier. A communication channel "001" can then be opened to allow data, acquired from a piece of electrical equipment associated with the "001" identifier, to populate database file "A."

The communication linkage between the graphical objects in the schematic user interface layout and the database(s) that store real-time data acquired from the operation of the electrical equipment allow the schematic user interface to dynamically represent fluctuations in the real-time health, performance, reliability and availability of the electrical system. For example, the nodes, buses and branches in the schematic user interface layout can be configured so that they change colors and/or become animated in response to the monitored real-time data of and/or predicted values for the electrical system during operation.

The embodiments described herein, can be practiced with other computer system configurations including hand-held devices, microprocessor systems, microprocessor-based or programmable consumer electronics, minicomputers, mainframe computers and the like. The embodiments can also be practiced in distributing computing environments where tasks are performed by remote processing devices that are linked through a network.

It should also be understood that the embodiments described herein can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations that form part of the embodiments described herein are useful machine operations. The invention also relates to a device or an apparatus for performing these operations. The systems and methods described herein can be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Certain embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

The invention claimed is:

1. A system for generating a schematic user interface of an electrical system, comprising:
   a data acquisition component communicatively connected to at least one sensor configured to acquire real-time data output from the electrical system;
   a power analytics server communicatively connected to the data acquisition component, the power analytics server comprising
   a virtual system modeling engine configured to generate predicted data output for the electrical system utilizing a virtual system model of the electrical system,
   an analytics engine configured to monitor the real-time data output and the predicted data output of the electrical system, the analytics engine further configured to initiate a calibration and synchronization operation to update the virtual system model when a difference between the real-time data output and the predicted data output exceeds a threshold, wherein updating the virtual system model comprises adjusting one or more operating parameters of the virtual system model to replicate operation of the at least one sensor,
   a machine learning engine configured to store and process patterns observed from the real-time data output and the predicted data output, the machine learning engine further configured to forecast an aspect of the electrical system, and
   a schematic interface creator engine configured to create a schematic user interface that is representative of the virtual system model and link the schematic user interface to the data acquisition component; and
   a client terminal communicatively connected to the power analytics server and configured to display the schematic user interface.

2. The system for generating a schematic user interface of an electrical system, as recited in claim 1, wherein, the machine learning engine includes,
   an associative memory layer,
   a sensory layer, and
   a neocortical model.

3. The system for generating a schematic user interface of an electrical system, as recited in claim 1, wherein the virtual system model includes current system components and operational parameters comprising the electrical system.

4. The system for generating a schematic user interface of an electrical system, as recited in claim 1, wherein the forecasted aspect is a predicted ability of the electrical system to resist system output deviations from defined tolerance limits of the electrical system.

5. The system for generating a schematic user interface of an electrical system, as recited in claim 1, wherein the forecasted aspect is a predicted reliability and availability of the electrical system.

6. The system for generating a schematic user interface of an electrical system, as recited in claim 1, wherein the forecasted aspect is a predicted total power capacity of the electrical system.

7. The system for generating a schematic user interface of an electrical system, as recited in claim 6, wherein the forecasted aspect is a predicted ability of the electrical system to maintain availability of total power capacity.

8. The system for generating a schematic user interface of an electrical system, as recited in claim 6, wherein the forecasted aspect is a predicted utilization of the total power capacity of the electrical system.

9. The system for generating a schematic user interface of an electrical system, as recited in claim 1, wherein the forecasted aspect is a predicted ability of the electrical system to withstand a contingency event that results in stress to the electrical system.

10. The system for generating a schematic user interface of an electrical system, as recited in claim 9, wherein the contingency event relates to load shedding.

11. The system for generating a schematic user interface of an electrical system, as recited in claim 9, wherein the contingency event relates to load adding.

12. The system for generating a schematic user interface of an electrical system, as recited in claim 9, wherein the contingency event relates to loss of utility power supply to the electrical system.

13. The system for generating a schematic user interface of an electrical system, as recited in claim 9, wherein the contingency event relates to a loss of distribution infrastructure associated with the electrical system.

14. The system for generating a schematic user interface of an electrical system, as recited in claim 1, wherein the client terminal is a thin client computing device.

15. The system for generating a schematic user interface of an electrical system, as recited in claim 1, wherein the client terminal is a wide area network capable computing device.

16. The system for generating a schematic user interface of an electrical system, as recited in claim 1, wherein the client terminal is a mobile computing device.

17. The system for generating a schematic user interface of an electrical system, as recited in claim 1, wherein the schematic user interface is rendered in 3-D.

18. The system for generating a schematic user interface of an electrical system, as recited in claim 1, wherein the schematic user interface is based on a one-line diagram construct.

19. The system for generating a schematic user interface of an electrical system, as recited in claim 1, wherein the schematic user interface is based on a technical system schematic diagram construct.

20. The system for generating a schematic user interface of an electrical system, as recited in claim 1, wherein the virtual system model is stored on a virtual system model database communicatively connected with the power analytics server.

21. The system for generating a schematic user interface of an electrical system, as recited in claim 1, wherein the schematic user interface includes a visual representation of each piece of electrical equipment that comprise the electrical system.

22. The system for generating a schematic user interface of an electrical system, as recited in claim 21, wherein each piece of electrical equipment is associated with a unique identifier.

23. The system for generating a schematic user interface of an electrical system, as recited in claim 1, wherein the schematic user interface is configured to allow an operator to monitor operational aspects of the electrical system.

* * * * *